United States Patent [19]
Tsukuda et al.

[11] Patent Number: 6,054,748
[45] Date of Patent: Apr. 25, 2000

[54] HIGH VOLTAGE SEMICONDUCTOR POWER DEVICE

[75] Inventors: Masanori Tsukuda, Yokohama; Takashi Shinohe, Yokosuka; Masakazu Yamaguchi, Kawasaki, all of Japan

[73] Assignee: Kabushiki Kaisha Toshiba, Kawasaki, Japan

[21] Appl. No.: 09/041,799

[22] Filed: Mar. 13, 1998

[30] Foreign Application Priority Data

Mar. 18, 1997 [JP] Japan .................................. 9-065151
Mar. 3, 1998 [JP] Japan .................................. 10-050745

[51] Int. Cl.[7] .............................. H01L 23/58; H01L 29/06
[52] U.S. Cl. ......................... 257/496; 257/618; 257/619; 257/487
[58] Field of Search ................... 257/496, 487, 257/492, 493, 618, 619

[56] References Cited

U.S. PATENT DOCUMENTS

| | | | |
|---|---|---|---|
| 3,370,209 | 2/1968 | Davis et al. | 257/169 |
| 4,374,389 | 2/1983 | Temple | 257/493 |
| 4,927,772 | 5/1990 | Arthur et al. | 438/140 |

FOREIGN PATENT DOCUMENTS

| | | |
|---|---|---|
| 5-152574 | 6/1993 | Japan . |
| 5-275688 | 10/1993 | Japan . |
| 7-302898 | 11/1995 | Japan . |
| 7-335913 | 12/1995 | Japan . |

OTHER PUBLICATIONS

M. Kitagawa, et al., "High Voltage (4KV) Emitter Short Type Diode (ESD)", Proc. ISPSD 1992, pp. 60–65.

T. Matsushita, et al., "Highly Reliable High–Voltage Transistors by Use of the SIPOS Process", IEEE Transactions on Electron Devices, vol. ED–23, No. 8, Aug. 1976.

Primary Examiner—John Guay
Attorney, Agent, or Firm—Oblon, Spivak, McClelland, Maier & Neustadt, P.C.

[57] ABSTRACT

A semiconductor power device includes a high-resistance semiconductor substrate of the first conductivity type having first and second major surfaces and a recess in either one of the first and second major surfaces, and a semiconductor power element with a field relaxation structure, at least part of which is formed in a region of the semiconductor substrate where the recess is formed.

5 Claims, 40 Drawing Sheets

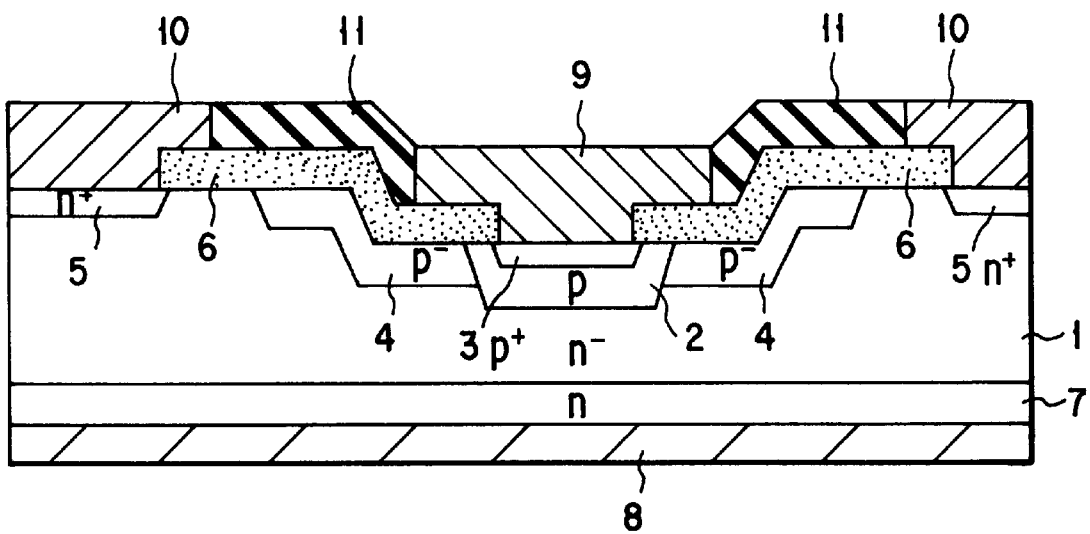
FIG. 5
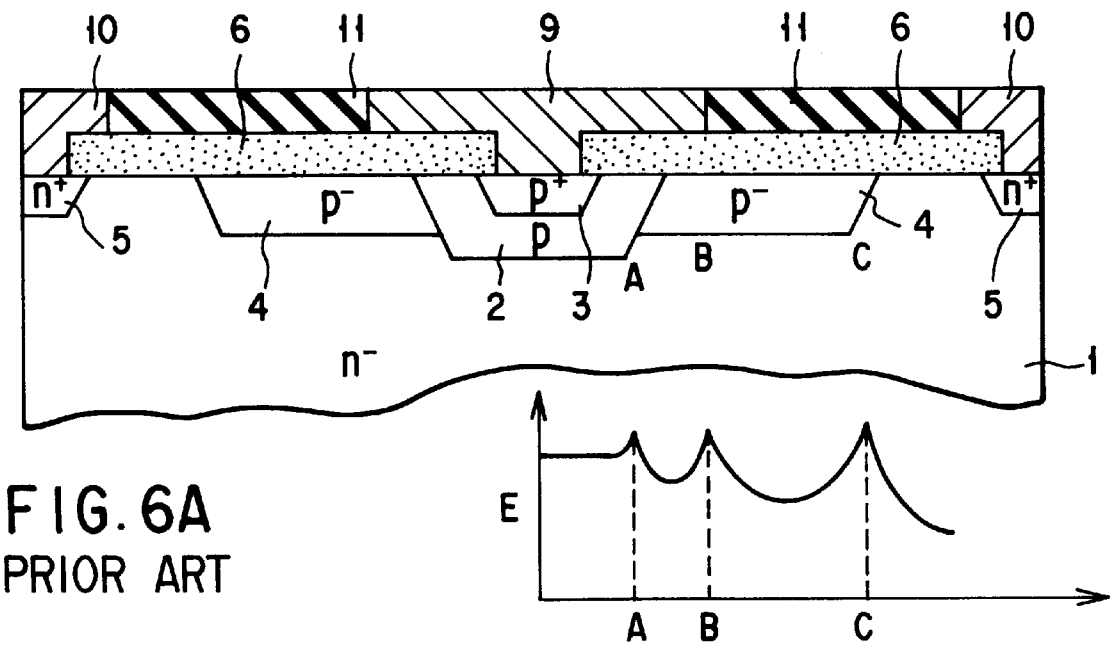
FIG. 6A
PRIOR ART
FIG. 6B
PRIOR ART

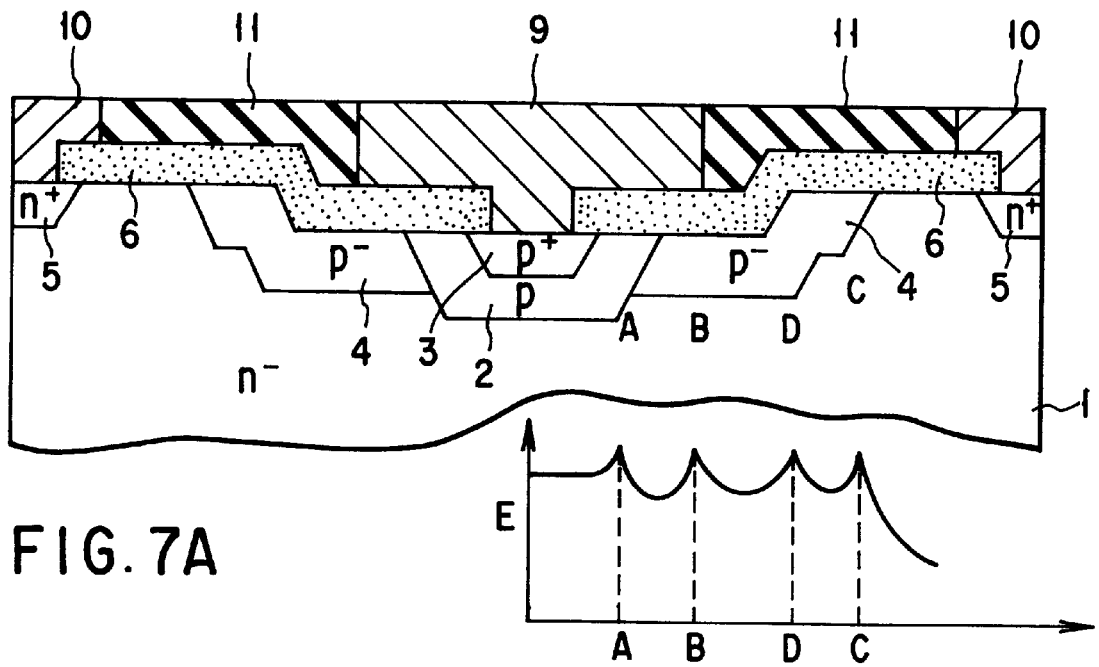
FIG. 7A
FIG. 7B
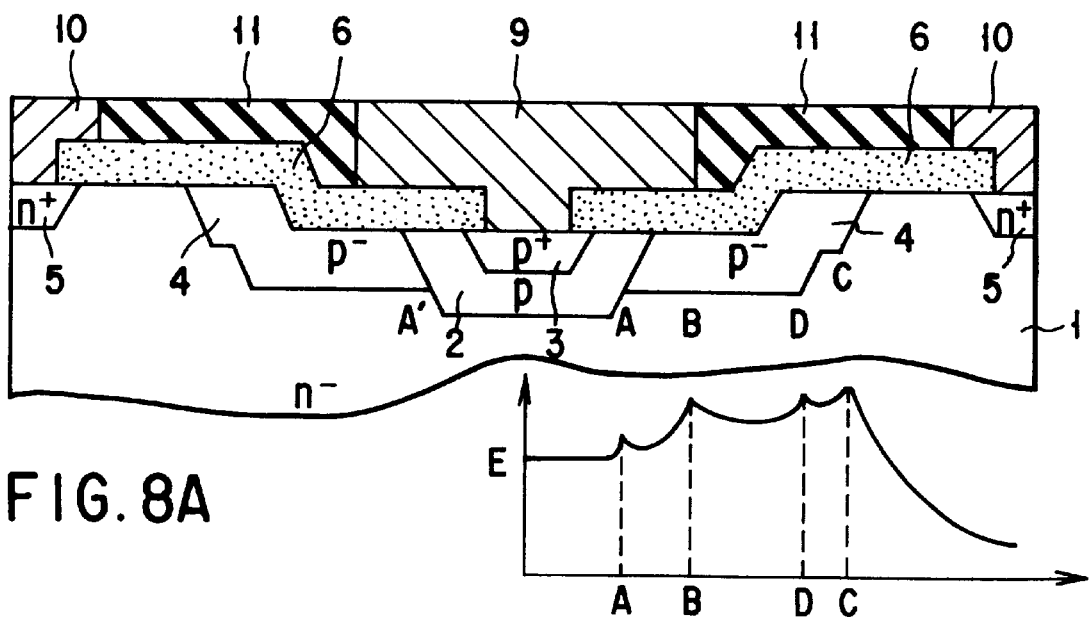
FIG. 8A
FIG. 8B

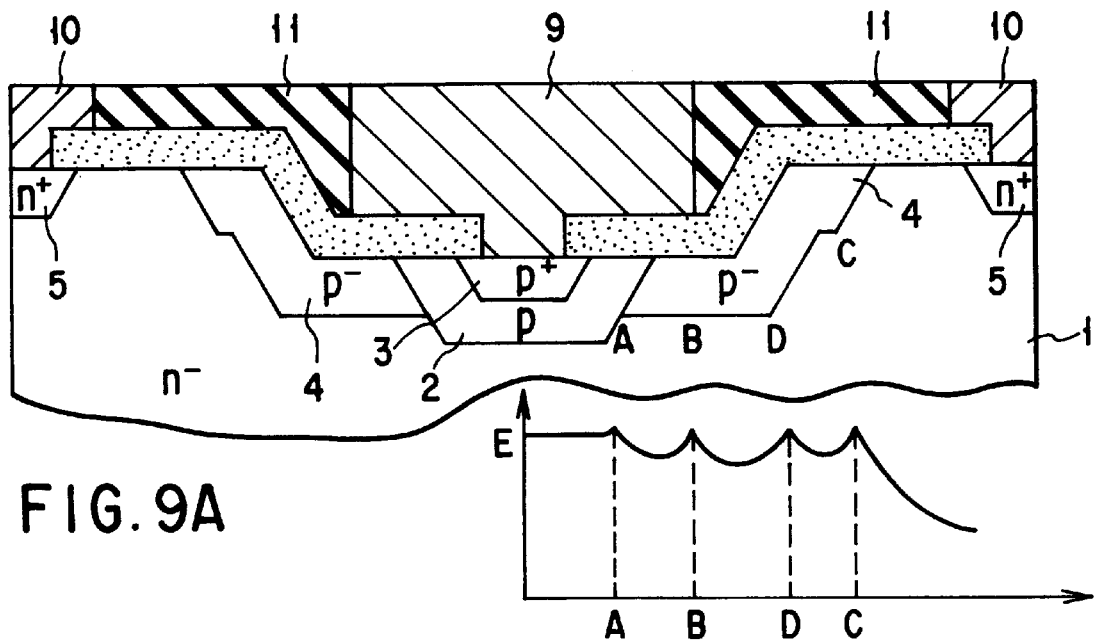
FIG. 9A
FIG. 9B
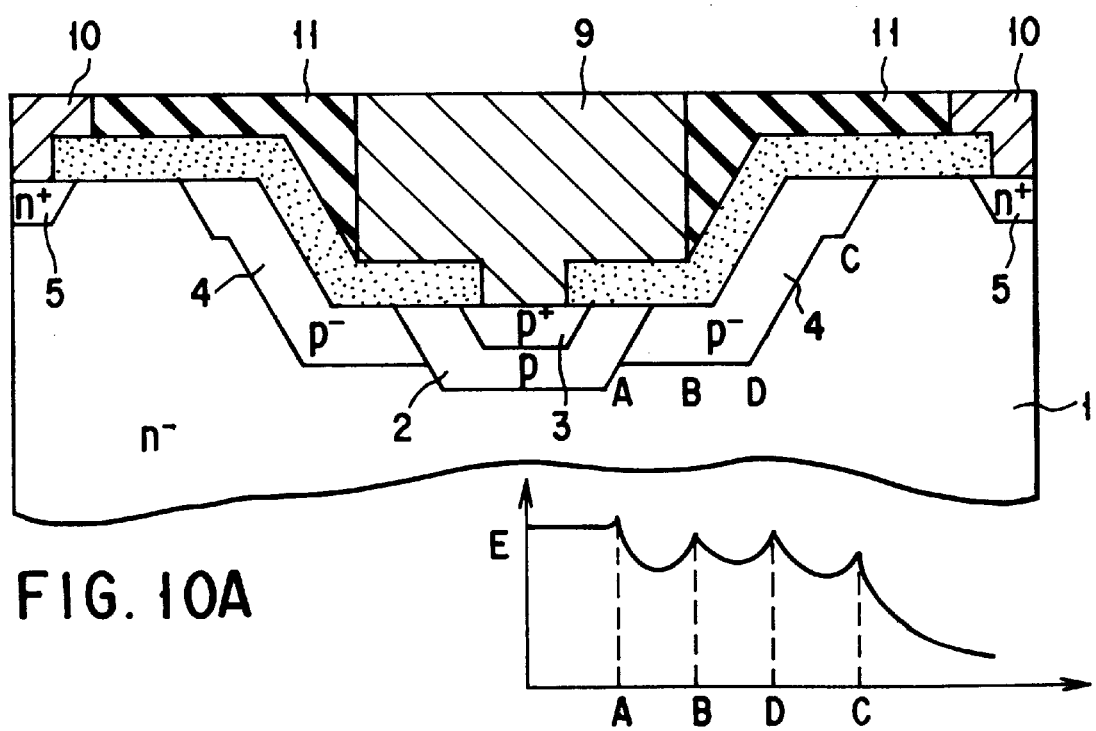
FIG. 10A
FIG. 10B

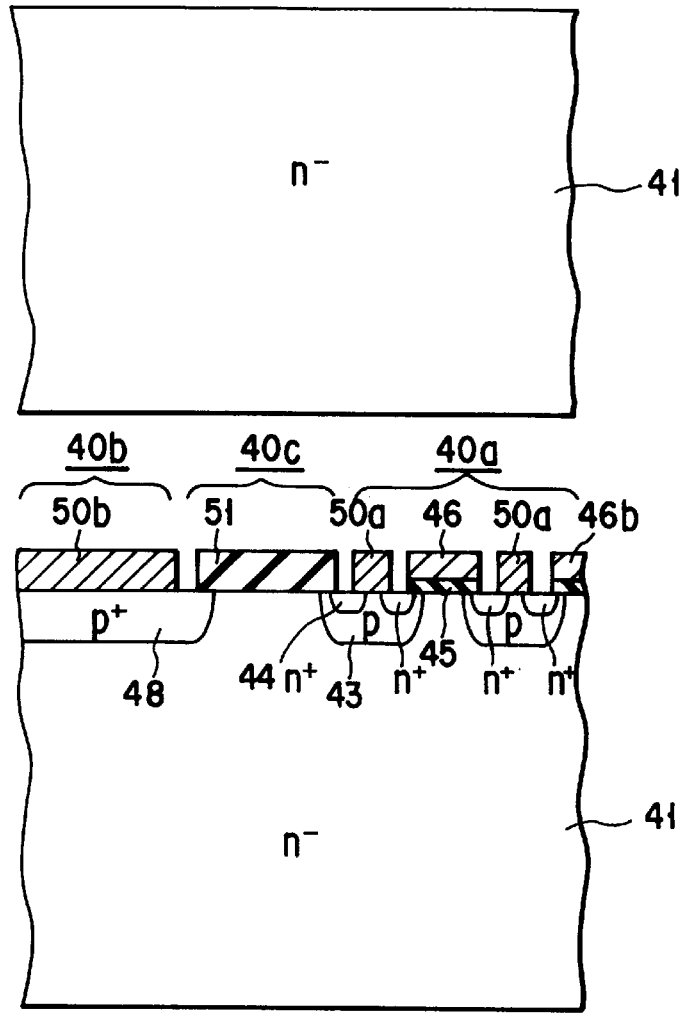
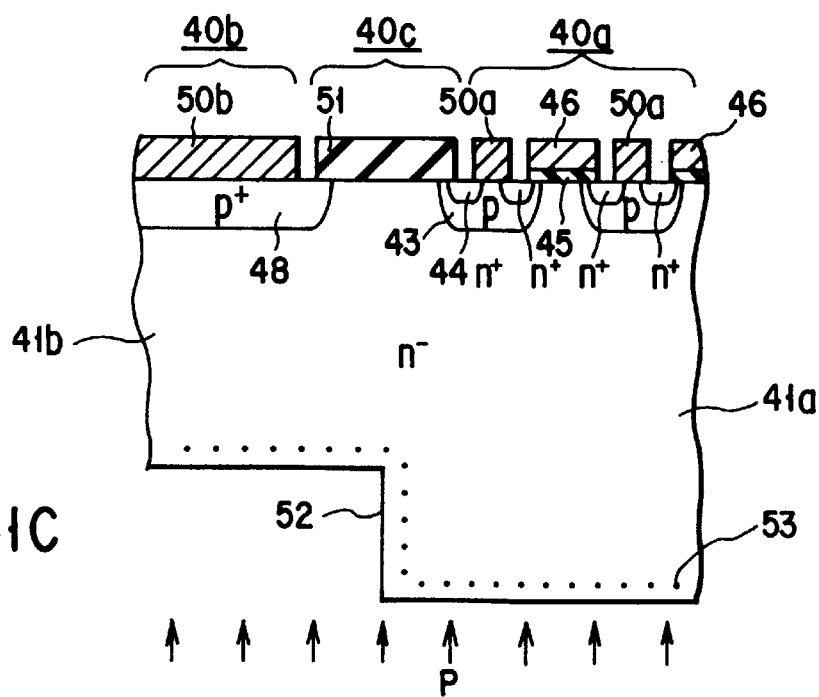
FIG. 41A
FIG. 41B
FIG. 41C

HIGH VOLTAGE SEMICONDUCTOR POWER DEVICE

BACKGROUND OF THE INVENTION

The present invention relates to a semiconductor device including a high voltage semiconductor power element such as a diode or an IGBT.

One of high voltage semiconductor elements used in high voltage semiconductor devices for performing power control is a high voltage diode. FIG. 1 is a sectional view showing a conventional high voltage diode.

In FIG. 1, reference numeral 81 denotes a first n-type cathode layer (semiconductor substrate) having a high resistance. A first p-type anode layer 82 is selectively formed in the front surface of the n-type cathode layer 81. A second heavily doped p-type anode layer 83 is selectively formed in the surface of the first p-type anode layer 82.

A lightly doped p-type resurf layer 84 with a field relaxation structure (junction termination structure) is formed around the p-type anode layer in the front surface of the n-type cathode layer 81 in contact with the p-type anode layer. A heavily doped n-type channel stopper layer 85 is formed outside the p-type resurf layer 84 in the front surface of the n-type cathode layer 81 so as to be spaced apart from the p-type resurf layer 84 by a predetermined distance.

A high-resistance film 86 is formed in the region extending from an edge of the second p-type anode layer 83 to the first p-type anode layer 82, the p-type resurf layer 84, the n-type cathode layer 81, and the n-type channel stopper layer 85. Instead of the high-resistance film 86, an insulating film may be formed.

A second n-type cathode layer 87 doped more heavily than the n-type cathode layer 81 is formed on the back surface of the first n-type cathode layer 81 having a high resistance. A cathode electrode 88 is formed on the n-type cathode layer 87. An anode electrode 89 is formed on the second p-type anode layer 83, whereas an electrode 90 is formed on the n-type channel stopper layer 85. Reference numeral 91 denotes an insulating film.

A conventional high voltage diode of this type however suffers the following problems. That is, to increase the withstanding voltage, the n-type cathode layer 81 must be made thick. As the n-type cathode layer 81 becomes thicker, the forward voltage drop and the reverse recovery loss increase, resulting in poor element characteristics. In the worst case, the device may be destroyed.

In recent years, needs for smaller-size, higher-performance devices for switching circuits such as inverter circuits and chopper circuits are becoming stronger.

FIG. 2 shows the main circuit arrangement of an inverter using a conventional IGBT (Insulated Gate Bipolar Transistor). Since the inverter circuit contains an inductance component in its load, like motor control, energy stored in the inductance of the load must be discharged upon selective turning off of switching elements (IGBTs in this case) Tr1 to Tr4. To reflux the electrical energy, freewheeling diodes D1 to D4 are connected anti-parallel to the IGBTs.

In this conventional semiconductor device, a junction termination region having a predetermined area or larger must be set within a semiconductor chip in order to obtain a withstanding voltage equal to or higher than the power supply voltage in each pair of IGBT and freewheeling diode. For this reason, the chip area is difficult to reduce, failing to increase the current density. To make a module including the semiconductor device (e.g. IGBT), a separate element as a freewheeling diode is externally connected to the IGBT. That is, an IGBT chip and a freewheeling diode chip are mounted on a single board, and electrodes on the respective chips and external electrodes are connected via wires. In this arrangement, a high-speed operation cannot be attained owing to the inductances of the connecting wires.

For the IGBT as well, demands for small loss arise. FIG. 3 is a sectional view showing the arrangement of an IGBT of this type. In this IGBT, a p-type drain layer 102 is formed on one surface of a high-resistance n-type base layer (semiconductor substrate) 101. A p-type base layer 104 is selectively formed in the other surface of the n-type base layer 101, and an n-type source layer 105 is formed in the p-type base layer 104. A gate electrode 107 is formed on the p-type base layer 104 between the n-type base layer 101 and the n-type source layer 105 via a gate insulating film 106. The gate electrode 107, the gate insulating film 106, the p-type base layer 104, the n-type base layer 101, and the n-type source layer 105 constitute an electron injection MOSFET having a channel region CH1. A drain electrode 108 is formed on the p-type drain layer 102, and a source electrode 109 is formed on the n-type source layer 105 and the p-type base layer 104.

The operation of this semiconductor device will be described below. While positive and negative voltages are respectively applied to the drain and source electrodes 108 and 109, if a positive voltage with respect to the source is applied to the gate electrode 107, the surface of the p-type base layer 104 opposite to the gate electrode 107 is inverted to be of the n type. Electrons e are injected from the n-type source layer 105 into the n-type base layer 101 via the inverted layer to reach the p-type drain layer 102. Along with this, holes h are injected from the p-type drain layer 102 into the n-type base layer 101. In this manner, both the electrons e and the holes h are injected into the n-type base layer 101 to cause conductivity modulation, which allows to reduce the ON voltage.

In a turn-off operation, a negative voltage with respect to the source is applied to the gate electrode 107. Then, the inverted layer formed immediately below the gate electrode 107 disappears to stop the injection of electrons. Some of the holes h in the n-type base layer 101 are discharged to the source electrode 109 via the p-type base layer 104, and the remaining holes h recombine with the electrons e and disappear. As a result, the semiconductor device is turned off.

In the conventional IGBT, however, the electrons e and the holes h must travel beyond a potential barrier formed by the p-n junction between the n-type base layer 101 and the p-type drain layer 102 in the conductive state. That is, as shown in the current-voltage graph of FIG. 4, the ON resistance increases by a built-in voltage of about 0.7V in proportion to a voltage drop caused by the p-n junction. In the conventional IGBT, therefore, the ON resistance in the conductive state cannot be satisfactorily reduced.

BRIEF SUMMARY OF THE INVENTION

It is the first object of the present invention to provide a high voltage semiconductor power device in which a necessary withstanding voltage can be ensured without any deterioration in element characteristics.

It is the second object of the present invention to provide a small-size, high-performance semiconductor power device having a simpler arrangement than a conventional one.

It is the third object of the present invention to provide a semiconductor power device in which the current flows even at 0V upon energization, and the ON resistance is low over a small-current region to a large-current region.

To achieve the above objects, according to the present invention, there is provided a semiconductor power device comprising a high-resistance semiconductor substrate of a first conductivity type having a first and a second major surface and a recess in either one of the first and the second major surface, and a semiconductor power element with a field relaxation structure, at least part of which is formed in a region of the semiconductor substrate where the recess is formed.

According to the first aspect of the present invention, the semiconductor power element comprises a main element with an active region and the field relaxation structure of a second conductivity type, and a thickness of a high-resistance portion of the semiconductor substrate at which the main element of the semiconductor element is formed is smaller than a thickness of a high-resistance portion of the semiconductor substrate below the field relaxation structure.

The field relaxation structure is desirably formed in a region extending from a bottom surface and a side wall surface of the recess formed in the first major surface to the first major surface surrounding the recess, and desirably has a plurality of steps at an interface between the field relaxation structure and the semiconductor substrate of the first conductivity type.

The field relaxation structure can comprise either one of a resurf layer and a guard ring.

The semiconductor element can be a diode, and a second-conductivity-type anode layer of the diode can have a plurality of steps at an interface between the anode layer and the semiconductor substrate of the first conductivity type.

The semiconductor element may be an IGBT, and a thickness of a high-resistance portion of the semiconductor substrate below a second-conductivity-type base layer of the IGBT may be smaller than the thickness of the high-resistance portion of the semiconductor substrate below the field relaxation structure formed at a termination end of the IGBT.

In the present invention, as the high-resistance semiconductor substrate of the first conductivity type, one having a recess formed in its surface is used. A high voltage semiconductor element is formed in a thin region of the recess. For this reason, even if the semiconductor substrate is thick, the high voltage semiconductor element can be made thin in correspondence with the depth of the recess.

Even if the semiconductor device is made thick in order to increase the efficiency of the field relaxation structure, no deterioration in element characteristics such as the forward voltage drop, reverse recovery loss, and the like of the high voltage semiconductor element occurs.

Even when the semiconductor substrate must be made thick in terms of the strength as the diameter of the semiconductor wafer increases, the high voltage semiconductor element can be made thin in correspondence with the depth of the recess. Accordingly, a high voltage semiconductor device in which the thickness of the semiconductor substrate can be arbitrarily set and a necessary withstanding voltage can be ensured without any deterioration in element characteristics can be realized.

According to the present invention, with the use of the field relaxation structure having a plurality of steps at the interface between the structure and the semiconductor substrate, the number of field concentration portions increases, and the withstanding voltage obtained by integrating the electric field increases, compared to a conventional field relaxation structure without any step. As a result, a high voltage semiconductor device having a higher withstanding voltage than that of the conventional field relaxation structure can be realized.

In the present invention, as the high-resistance semiconductor substrate of the first conductivity type, one having recesses formed in the first major surface (front surface) and the second major surface (back surface) may be used. In this case, the high voltage semiconductor element is formed at a portion between the recesses in the front and back surfaces. Even if the semiconductor substrate is thick, the high voltage semiconductor element can be made thin in correspondence with the depth of the recess.

In forming a step on the front surface, a large step cannot be obtained owing to limitations in fine pattern formation process. To the contrary, in forming a step on the back surface, the step is free from any limitation, and the thickness of the semiconductor substrate can be set within a wide range. Therefore, a high voltage semiconductor device in which the thickness of the semiconductor substrate can be arbitrarily set within a wide range and a necessary withstanding voltage can be ensured without any deterioration in element characteristics can be realized.

According to the second aspect of the present invention, a freewheeling diode is formed in a region where the recess is formed, and an IGBT is formed in a region other than the region where the recess is formed.

A thickness of the semiconductor substrate in the region where the freewheeling diode is formed is smaller than a thickness of the semiconductor substrate in the region where the IGBT is formed.

A thickness of a high-resistance portion of the semiconductor substrate that constitutes part of the diode may be smaller than a thickness of a high-resistance portion of the semiconductor substrate that constitutes part of the IGBT.

The semiconductor power element further comprises a first main electrode and a sub-electrode formed on the first major surface, and a second main electrode formed on the second major surface, the IGBT formed in the region other than the recess comprises a high-resistance base layer of the first conductivity type made of the semiconductor substrate, a drain layer of a second conductivity type formed in the second major surface of the semiconductor substrate, a base layer of the second conductivity type selectively formed in the first major surface of the semiconductor substrate, a source layer of the first conductivity type selectively formed in the base layer of the second conductivity type, and a gate electrode formed via a gate insulating film on the base layer of the second conductivity type between the base layer of the first conductivity type and the source layer of the first conductivity type, the freewheeling diode formed in the region where the recess is formed comprises a high-resistance base layer of the first conductivity type made of the semiconductor substrate, a cathode layer of the first conductivity type formed in the second major surface of the base layer of the first conductivity type, and an anode layer of the second conductivity type formed in the first major surface of the base layer of the first conductivity type, the first main electrode is formed to contact the second-conductivity-type base layer and the first-conductivity-type source layer of the IGBT, and the second-conductivity-type anode layer of the diode, the second main electrode is formed to contact both the drain layer of the second conductivity type and the cathode layer of the first conductivity type, and the sub-electrode is connected to the gate electrode.

The gate electrode may be buried via the gate insulating film in a trench formed to extend in the first major surface of the semi conductor substrate from a surface of the source layer of the first conductivity type to an intermediate depth of the base layer of the first conductivity type through the base layer of the second conductivity type.

The semiconductor power device desirably further comprises an isolation region formed between the freewheeling diode and the IGBT.

A side wall surface of the recess can be tapered.

The second-conductivity-type anode layer of the freewheeling diode can be surrounded except for an upper surface by a layer of the second conductivity type that has a resistance higher than a resistance of the anode layer.

With the above arrangement, the semiconductor power device of the present invention incorporates the function of an anti-parallel freewheeling diode and has a switching function in the forward direction and conductive characteristics in the backward direction. That is, upon generation of a counterelectromotive force by an inductive load, the semiconductor device is turned on in the backward direction. Then, the diode is rendered conductive at a low ON voltage because the diode is made up of the high-resistance base layer thinner than the IGBT. No external anti-parallel freewheeling diode is required, so that the current density and the speed increase to realize a small-size, high-performance semiconductor device.

According to the third aspect of the present invention, a vertical MOSFET is formed in a region where the recess is formed, and an IGBT is formed in a region other than the region where the recess is formed.

A thickness of the semiconductor substrate in the region where the vertical MOSFET is formed is smaller than a thickness of the semiconductor substrate in the region where the IGBT is formed.

The semiconductor power element further comprises a first main electrode and a sub-electrode formed on the first major surface, and a second main electrode formed on the second major surface, the IGBT formed in the region other than the recess comprises a high-resistance base layer of the first conductivity type made of the semiconductor substrate, a drain layer of a second conductivity type formed in the second major surface of the semiconductor substrate, a first base layer of the second conductivity type selectively formed in the first major surface of the semiconductor substrate, a first source layer of the first conductivity type selectively formed in the first base layer, and a first gate electrode formed via a gate insulating film on the first base layer of the second conductivity type between the high-resistance base layer of the first conductivity type and the first source layer, the vertical MOSFET formed in the region where the recess is formed comprises a high-resistance base layer of the first conductivity type made of the semiconductor substrate, a drain layer of the first conductivity type formed in the second major surface of the semiconductor substrate, a second base layer of the second conductivity type selectively formed in the first major surface of the semiconductor substrate, a second source layer of the first conductivity type selectively formed in the second base layer, and a second gate electrode formed via a gate insulating film on the second base layer of the second conductivity type between the high-resistance base layer and the second source layer, the first main electrode is formed to contact both the first and the second base layer of the second conductivity type and the first and the second source layer of the first conductivity type, the second main electrode is formed to contact both the drain layer of the second conductivity type and the drain layer of the first conductivity type, and the sub-electrode is connected to the first and the second gate electrode.

The first and the second gate electrode may be buried via the gate insulating film in trenches formed to extend in the first major surface of the semiconductor substrate from a surface of the first and the second source layer of the first conductivity type to intermediate depth of the first and the second base layer of the first conductivity type through the first and the second base layer of the second conductivity type, respectively.

The semiconductor power device desirably further comprises an isolation region formed between the MOSFET and the IGBT.

A side wall surface of the recess is tapered.

With the above arrangement, in the semiconductor power device of the present invention, in the small-current region, since the path connecting the second main electrode, the source layer of the first conductivity type, the inverted layer (channel) below the gate electrode, the base layer of the first conductivity type, the drain layer of the first conductivity type, and the first main electrode mainly constitutes the flow path of majority carriers, no voltage drop is caused by the p-n junction, and the current starts from 0V. In the large-current region, since minority carriers are injected from the drain layer of the second conductivity type to the base layer of the first conductivity type, conductivity modulation occurs. Therefore, the ON resistance can be reduced over the small-current region to the large-current region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a sectional view showing the main part of a high voltage semiconductor device according to the first embodiment of the present invention;

FIG. 6A is a sectional view of a high voltage semiconductor device using a conventional p-type resurf layer;

FIG. 6B is a graph showing the profile of the field strength in FIG. 6A;

FIG. 7A is a sectional view for explaining the field distribution in the first embodiment;

FIG. 7B is a graph showing the profile of the field strength in FIG. 7A;

FIG. 8A is a sectional view of the high voltage semiconductor device when the depth of a recess is small in the first embodiment;

FIG. 8B is a graph showing the profile of the field strength in FIG. 8A;

FIG. 9A is a sectional view of the high voltage semiconductor device when the depth of the recess is medium in the first embodiment;

FIG. 9B is a graph showing the profile of the field strength in FIG. 9A;

FIG. 10A is a sectional view of the high voltage semiconductor device when the depth of the recess is large in the first embodiment;

FIG. 10B is a graph showing the profile of the field strength in FIG. 10A;

FIGS. 41A to 41E are sectional views sequentially showing a method of manufacturing the basic structure of the semiconductor power device in FIG. 38;

DETAILED DESCRIPTION OF THE INVENTION

Figure 1:
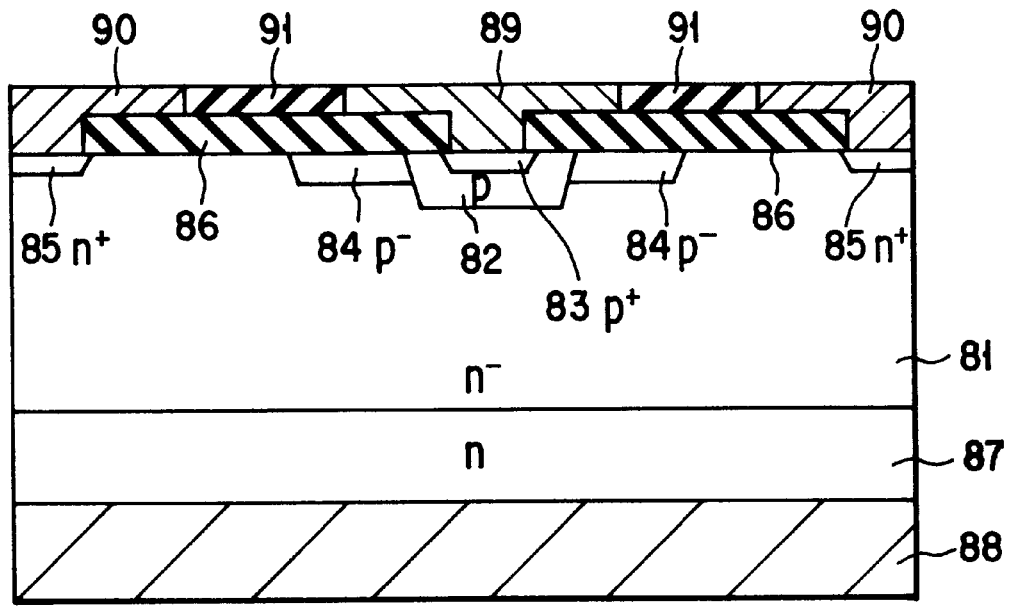
FIG. 1 is a partial sectional view showing the element structure of the main part of a conventional high voltage diode.

Embodiments of the present invention will be described below with reference to the several views of the accompanying drawing. First of all, embodiments (first to 15th embodiments) according to the first aspect will be explained. In these embodiments, the first conductivity type is the n type, but may be the p type instead of the n type. The same reference numerals denote the same parts throughout the embodiments, and a repetitive description thereof will be omitted.

(First Embodiment)

FIG. 5 is a sectional view showing the main part of a high voltage semiconductor device according to the first embodiment of the present invention. In the first embodiment, a high voltage diode is used as a high voltage semiconductor element.

In FIG. 5, reference numeral 1 denotes a first n-type cathode layer (semiconductor substrate) having a high resistance. A recess is formed in the front surface of the n-type cathode layer 1. A first p-type anode layer 2 is selectively formed in the bottom surface of the recess. A second heavily doped p-type anode layer 3 is selectively formed in the surface of the first p-type anode layer 2.

A lightly doped p-type resurf layer 4 with a field relaxation structure (junction termination structure) is formed around the first p-type anode layer 2 in the front surface of the n-type cathode layer 1 in contact with the first p-type anode layer 2. In this case, the p-type resurf layer 4 is formed from the bottom and side surface of the recess of the n-type cathode layer 1 to the substrate surface outside the recess.

A heavily doped n-type channel stopper layer 5 with a junction termination structure is formed outside the p-type resurf layer 4 in the front surface of the n-type cathode layer 1 so as to be spaced apart from the p-type resurf layer 4 by a predetermined distance.

A high-resistance film 6 such as an SIPOS (Semi-Insulating POlycrystalline Silicon) film is formed in the region extending from an edge of the second p-type anode layer 3 to the first p-type anode layer 2, the p-type resurf layer 4, the n-type cathode layer 1, and the n-type channel stopper layer 5. Instead of the high-resistance film 6, an insulating film may be formed.

A second n-type cathode layer 7 doped more heavily than the n-type cathode layer 1 is formed on the back surface of the first n-type cathode layer 1. A cathode electrode 8 is formed on the n-type cathode layer 7. An anode electrode 9 is formed on the second p-type anode layer 3, whereas an electrode 10 is formed on the n-type channel stopper layer 5. The electrode 10 is an auxiliary electrode necessary for stabilizing the withstanding voltage, and may serve as a cathode electrode to have a lateral diode structure between the electrode 10 and the anode electrode 9. Reference numeral 11 denotes an insulating film.

In the first embodiment, the recess is formed in the front surface of the n-type cathode layer 1, and a diode is formed in a thin region of the recess. According to the first embodiment, even if the n-type cathode layer 1 (semiconductor substrate) is thick, the portion operating as a diode is thin in correspondence with the depth of the recess. Therefore, an increase in thickness of the n-type cathode layer 1 does not lead to any deterioration in element characteristics such as the forward voltage drop and the reverse recovery loss.

According to the first embodiment, the above features can also be obtained by the following reason.

The element of the first embodiment will be compared with one having the conventional structure. In the conventional element, no step is formed in the region where the p-type resurf layer 4 is formed, as shown in FIG. 6A, and the electric field concentrates at three portions A, B, and C in FIG. 6A. FIG. 6B shows the field strengths at these portions. In the conventional element, the substrate must be made thick in order to increase the withstanding voltage, resulting in large steady-state ON loss and large turn-on loss.

To the contrary, in the first embodiment, the step is formed in the region where the p-type resurf layer 4 is formed, and the electric field concentrates at four portions A, B, C, and D, as shown in FIGS. 7A and 7B. That is, in the first embodiment, the number of field concentration portions is increased by one because of the presence of the step.

According to the first embodiment, therefore, the withstanding voltage obtained by integrating the electric field becomes higher than the conventional one, so that a higher voltage semiconductor element can be realized even with the same thickness of the semiconductor substrate as that of the conventional substrate.

A deterioration in element characteristics such as the forward voltage drop and the reverse recovery loss can be prevented only by forming the element in the thin region of the recess without any p-type resurf layer 4. When two or three steps are formed in the region where the p-type resurf layer 4 is formed, a much higher voltage semiconductor element can be realized.

The relationship between the depth of the recess and the field distribution will be explained.

FIGS. 8A and 8B show the field distribution for a small depth of the recess. At this depth, breakdown occurs in the p-type resurf layer 4 because the electric field at the main element portion (region between A and A') of the semiconductor element is smaller than that in the p-type resurf layer 4, and the main element portion has a margin. Accordingly, the withstanding voltage does not decrease even if the recess is formed to a deeper region to decrease the energization loss and the turn-off loss.

FIGS. 9A and 9B show the field distribution for a medium depth of the recess. At this depth, breakdown simultaneously occurs in the element and the p-type resurf layer 4 because the electric field in the main element is equal in size to that in the p-type resurf layer 4.

FIGS. 10A and 10B show the field distribution for a large depth of the recess. At this depth, breakdown occurs in the main element because the electric field in the main element is larger than that in the p-type resurf layer 4. That is, the total withstanding voltage is determined by only the withstanding voltage of the main element (main element design), independently of the field relaxation structure of the p-type resurf layer 4 or the like. In this case, the absolute value of the withstanding voltage is smaller than that in FIG. 9A. However, at the same time, a forward voltage drop and a reverse recovery loss are reduced to realize an excellent semiconductor device having low power loss. Moreover, since breakdown occurs at point A apart from the semiconductor surface, a semiconductor element which is resistant to the influence of the surface and has a stable withstanding voltage can be realized.

The high voltage element is desirably designed as shown in FIGS. 9A and 10A. According to the present invention, if the substrate at the current passing portion is made thin, and the substrate in the field relaxation structure (resurf layer or the like) is made thick, the steady-state ON loss and the turn-on loss can be decreased, and a withstanding voltage equal to that of flat junction can be attained.

FIGS. 11A to 11E show a method of forming an element structure at the recess.

Figure 11A:
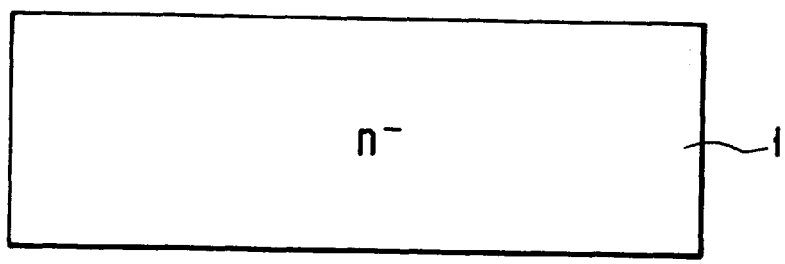
FIGS. 11A to 11E are sectional views sequentially showing a method of forming the element structure of the recess in the first embodiment.
Figure 11B:
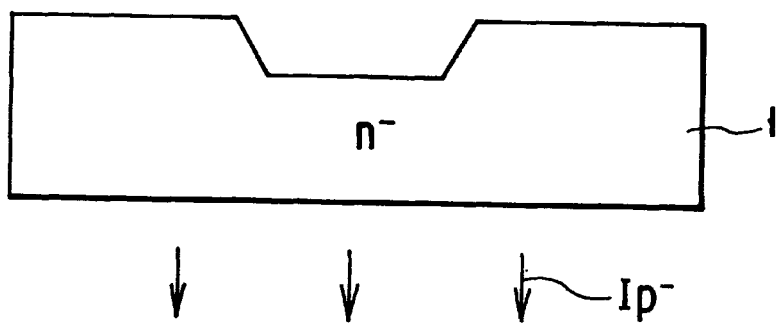

First of all, the n-type base layer 1 (semiconductor substrate) is prepared, as shown in FIG. 11A, and a recess is formed in the front surface of the n-type base layer 1, as shown in FIG. 11B.

Figure 11C:
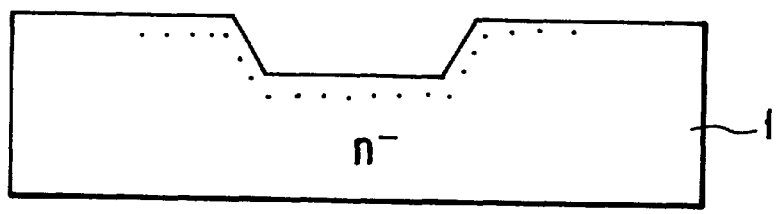

As shown in FIG. 11C, p-type impurity ions $Ip^-$ are selectively implanted in the recess and the front surface of the n-type base layer 1 around the recess using a mask (not shown).

Figure 11D:
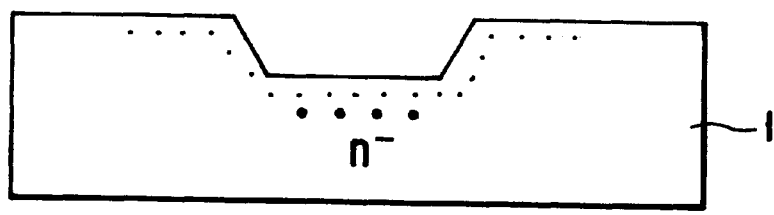

As shown in FIG. 11D, p-type impurity ions Ip are selectively implanted in the front surface of the n-type base layer 1 at the bottom of the recess using a mask (not shown). In this case, the dose of the p-type impurity ions Ip is higher than that of the p-type impurity ions $Ip^-$.

Figure 11E:
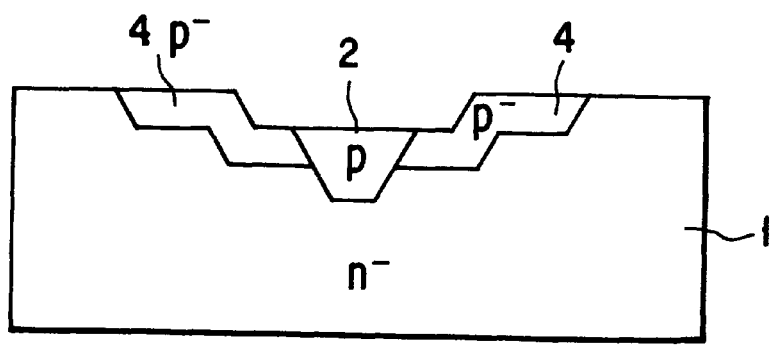

Finally, as shown in FIG. 11E, annealing is performed to complete the p-type anode layer 2 and the p-type resurf layer 4.

FIGS. 11A to 11E do not show p-type anode layer 3. In forming the p-type anode layer 3, p-type impurity ions having a higher impurity concentration are selectively implanted in the front surface of the implantation region of the p-type impurity ions Ip, after, e.g., the step in FIG. 11D.

Figure 12:
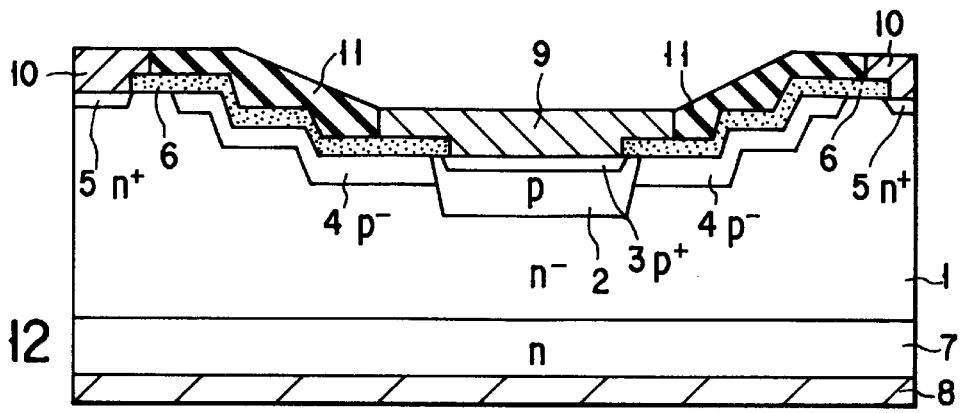
FIG. 12 is a sectional view showing a modification of the high voltage semiconductor device according to the first embodiment.
Figure 13:
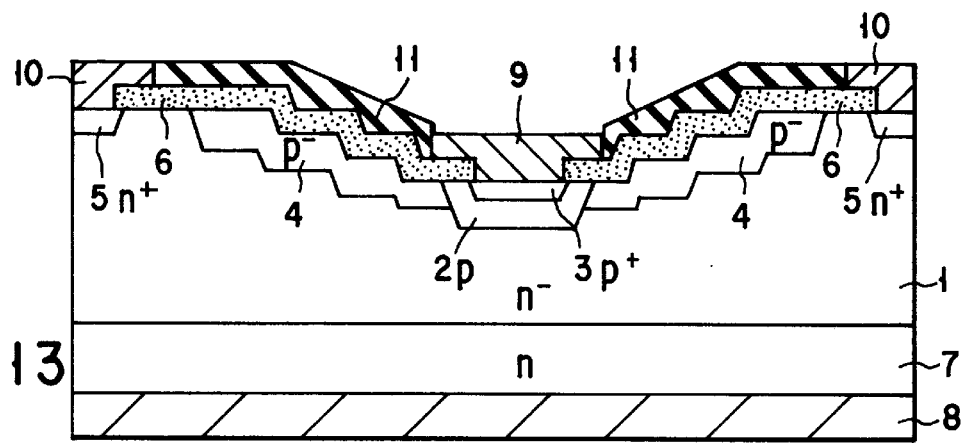
FIG. 13 is a sectional view showing another modification of the high voltage semiconductor device according to the first embodiment.

FIGS. 12 and 13 show modifications of the first embodiment. In the element of FIG. 12, the recess has two steps. In the element of FIG. 13, the recess has three steps. An increase in the number of steps can increase the radius of curvature of the bent portion in the field relaxation structure to increase the withstanding voltage. With this structure, an element having a small substrate thickness can be easily fabricated. The number of steps of the recess may be four or more.

(Second Embodiment)

Figure 14:
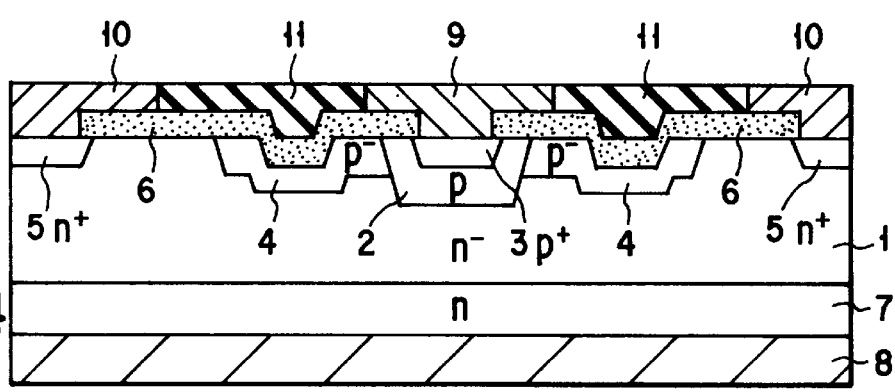
FIG. 14 is a sectional view showing the main part of a high voltage semiconductor device according to the second embodiment of the present invention.

FIG. 14 is a sectional view showing the main part of a high voltage semiconductor device according to the second embodiment of the present invention.

The second embodiment is different from the first embodiment in that a recess is formed in only a region, within a semiconductor element, where a p-type resurf layer 4 is to be formed. The p-type resurf layer 4 is formed from the bottom and side surface of the recess in an n-type cathode layer 1 to the front surface of the n-type cathode layer 1 outside the recess. As a result, two steps are formed at the interface between the p-type resurf layer 4 and the n-type cathode layer 1. According to the second embodiment, therefore, the radius of curvature of the bent portion in the field relaxation structure increases to increase the withstanding voltage obtained by integrating the electric field.

(Third Embodiment)

Figure 15:
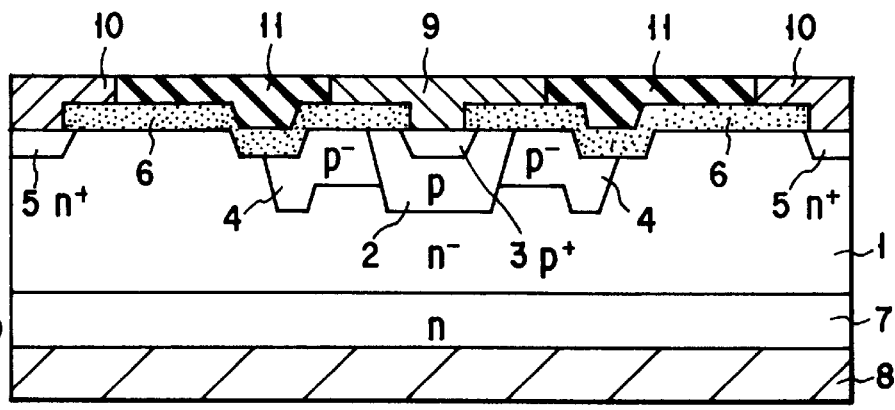
FIG. 15 is a sectional view showing the main part of a high voltage semiconductor device according to the third embodiment of the present invention.

FIG. 15 is a sectional view showing the main part of a high voltage semiconductor device according to the third embodiment of the present invention.

The third embodiment is different from the second embodiment in that the outer portion of a p-type resurf layer 4 is formed not to protrude laterally from the bottom of a recess. Also in this case, the withstanding voltage obtained by integrating the electric field increases to attain the same effects as those in the second embodiment.

(Fourth Embodiment)

Figure 16:
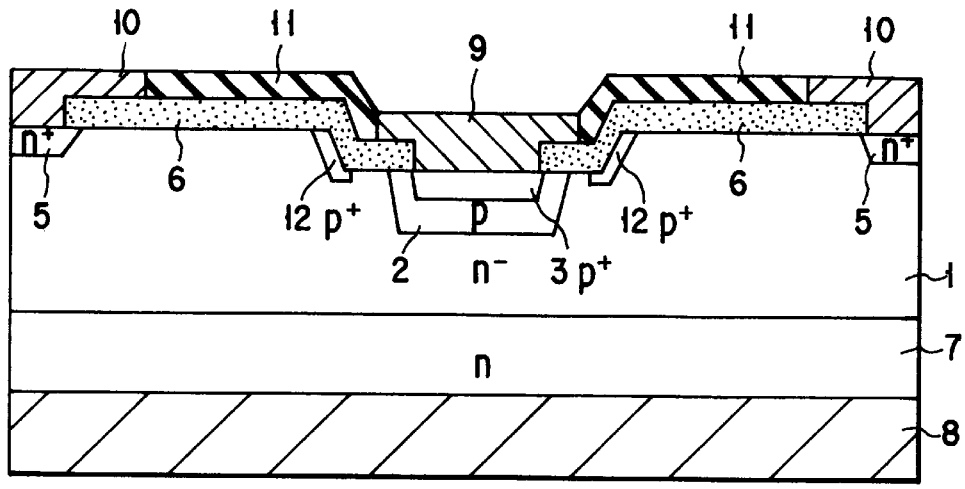
FIG. 16 is a sectional view showing the main part of a high voltage semiconductor device according to the fourth embodiment of the present invention.

FIG. 16 is a sectional view showing the main part of a high voltage semiconductor device according to the fourth embodiment of the present invention.

The fourth embodiment is different from the first embodiment in that a heavily doped p-type guard ring layer 12 replaces the p-type resurf layer 4 as a field relaxation structure (junction termination structure). The p-type guard ring layer 12 may be formed in a region except for a recess.

In the fourth embodiment as well, an element can be made thin in correspondence with the depth of the recess even for a thick n-type cathode layer 1 (semiconductor substrate). Even if the p-type guard ring layer 12 is formed, and the n-type cathode layer 1 is made thick in order to ensure a necessary withstanding voltage, no deterioration in element characteristics such as the forward voltage drop and the reverse recovery loss occurs.

(Fifth Embodiment)

Figure 17:
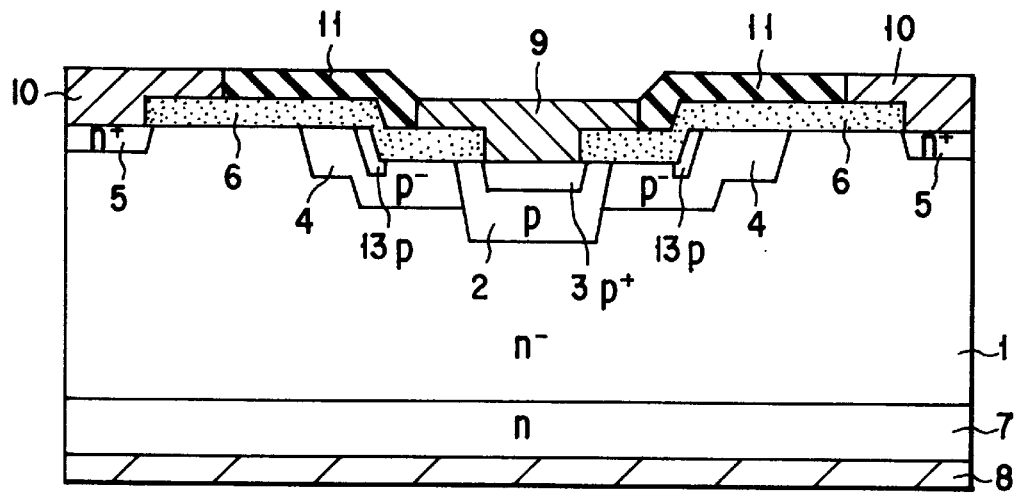
FIG. 17 is a sectional view showing the main part of a high voltage semiconductor device according to the fifth embodiment of the present invention.

FIG. 17 is a sectional view showing the main part of a high voltage semiconductor device according to the fifth embodiment of the present invention.

The fifth embodiment is different from the first embodiment in that a second heavily doped p-type resurf layer 13 is selectively formed in the surface of a p-type resurf layer 4 so as to contact the step of a recess. The p-type resurf layer 13 covers an unstable portion of the surface of the substrate step to stabilize it.

The fifth embodiment can also have the same effects as those in the first embodiment, and the effects of the fifth embodiment are more stable because of the presence of the p-type resurf layer 13.

(Sixth Embodiment)

Figure 18:
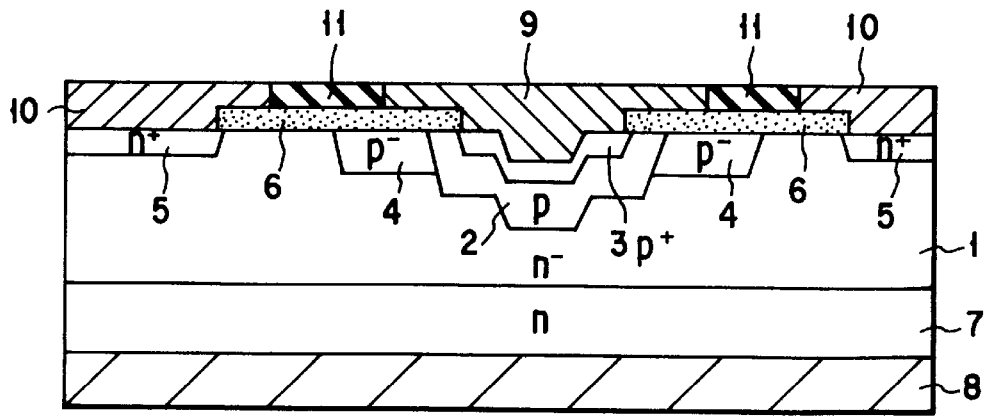
FIG. 18 is a sectional view showing the main part of a high voltage semiconductor device according to the sixth embodiment of the present invention.

FIG. 18 is a sectional view showing the main part of a high voltage semiconductor device according to the sixth embodiment of the present invention.

The sixth embodiment is different from the first embodiment in that the step of a recess exists in not the formation region of a p-type resurf layer 4 but only a main element region. Consequently, steps are formed in p-type anode layers 2 and 3.

Also in the sixth embodiment, the main element can be made thin in correspondence with the depth of the recess even for a thick n-type cathode layer 1 (semiconductor substrate). Even if the p-type resurf layer 4 is formed, and the n-type cathode layer 1 is made thick in order to ensure a necessary withstanding voltage, no deterioration in element characteristics such as the forward voltage drop and the reverse recovery loss occurs.

FIGS. 19A to 19E show a method of forming an element structure at the recess.

Figure 19A:
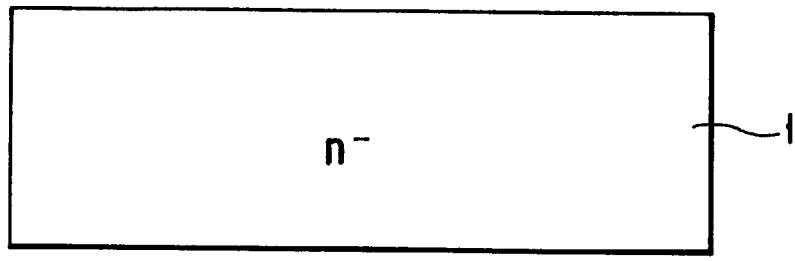
FIGS. 19A to 19E are sectional views of the semiconductor device sequentially showing a method of forming the element structure of the recess in the present invention.
Figure 19B:
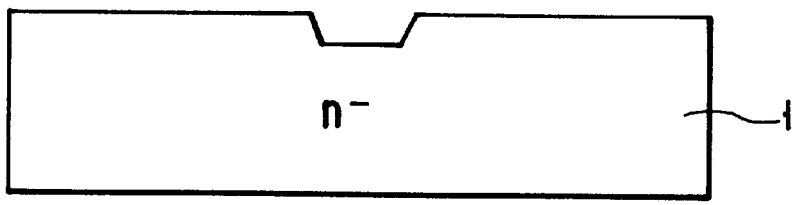

First of all, the n-type base layer 1 (semiconductor substrate) is prepared, as shown in FIG. 19A, and a recess is formed in the front surface of the n-type base layer 1, as shown in FIG. 19B.

Figure 19C:
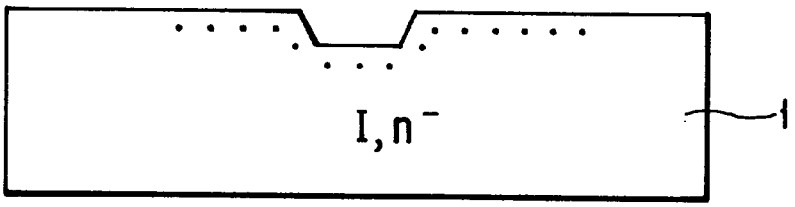

As shown in FIG. 19C, p-type impurity ions Ip$^-$ are selectively implanted in the recess and the front surface of the n-type base layer 1 around the recess using a mask (not shown).

Figure 19D:
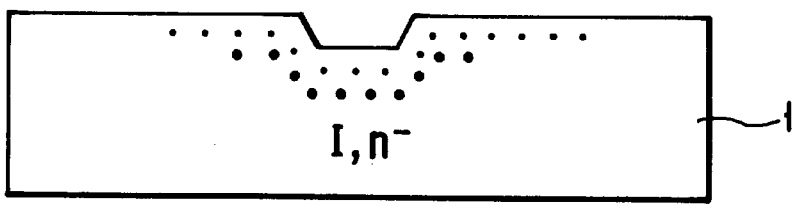

As shown in FIG. 19D, p-type impurity ions Ip are selectively implanted in the recess and the front surface of the n-type base layer 1 around the recess (that is inside the implantation region of the p-type impurity ions Ip$^-$) using a mask (not shown). In this case, the dose of the p-type impurity ions Ip is higher than that of the p-type impurity ions Ip$^-$.

Figure 19E:
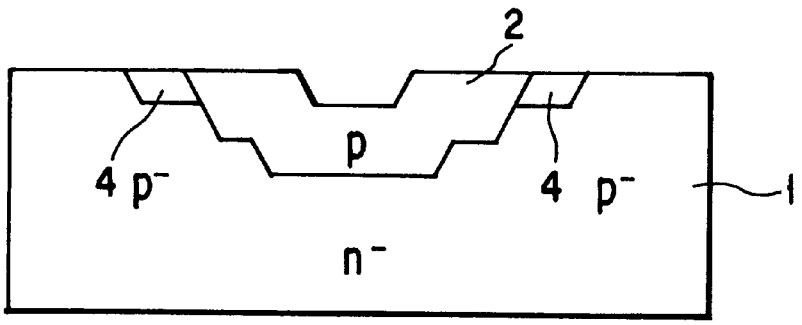

Finally, as shown in FIG. 19E, annealing is performed to complete the p-type anode layer 2 and the p-type resurf layer 4.

In the sixth embodiment, no p-type anode layer 3 is described. In forming the p-type anode layer 3, p-type impurity ions having a higher impurity concentration are selectively implanted in the recess and the front surface of the portion around the recess (that is inside the implantation region of the p-type impurity ions Ip), after, e.g., the step in FIG. 19D.

Figure 20:
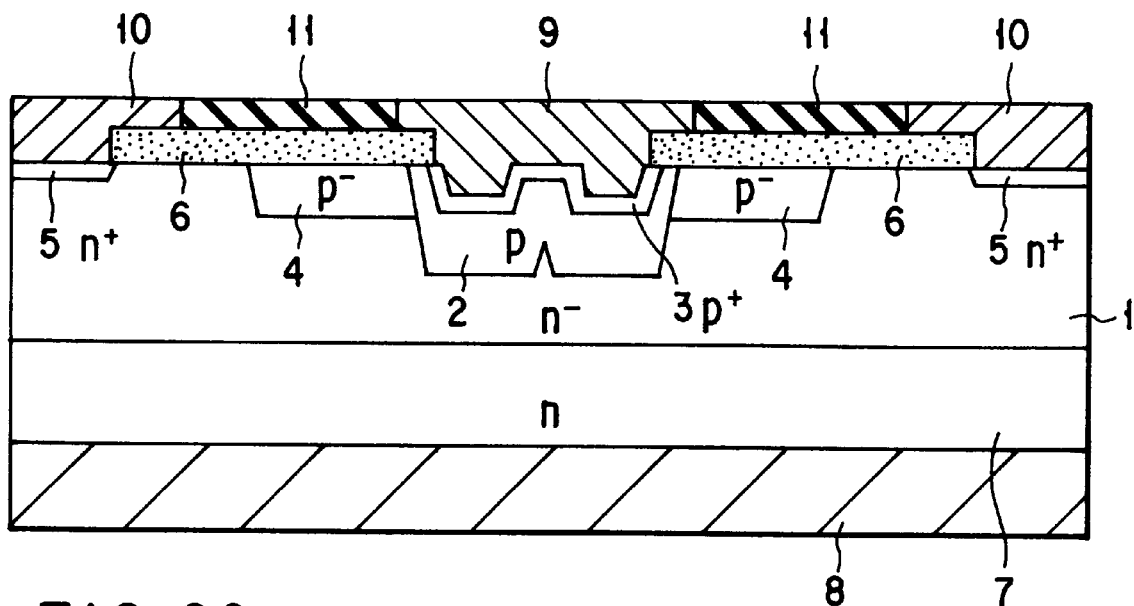
FIG. 20 is a sectional view showing a modification of the high voltage semiconductor device in FIG. 18.

FIG. 20 shows a modification of the sixth embodiment. In the element of FIG. 20, two recesses each having one step are formed in an element region. This structure is effective when the size of the recess formation region is limited due to limitations in processes such as the wafer strength and formation control in an etching process. The number of recesses may be three or more.

(Seventh Embodiment)

Figure 21:
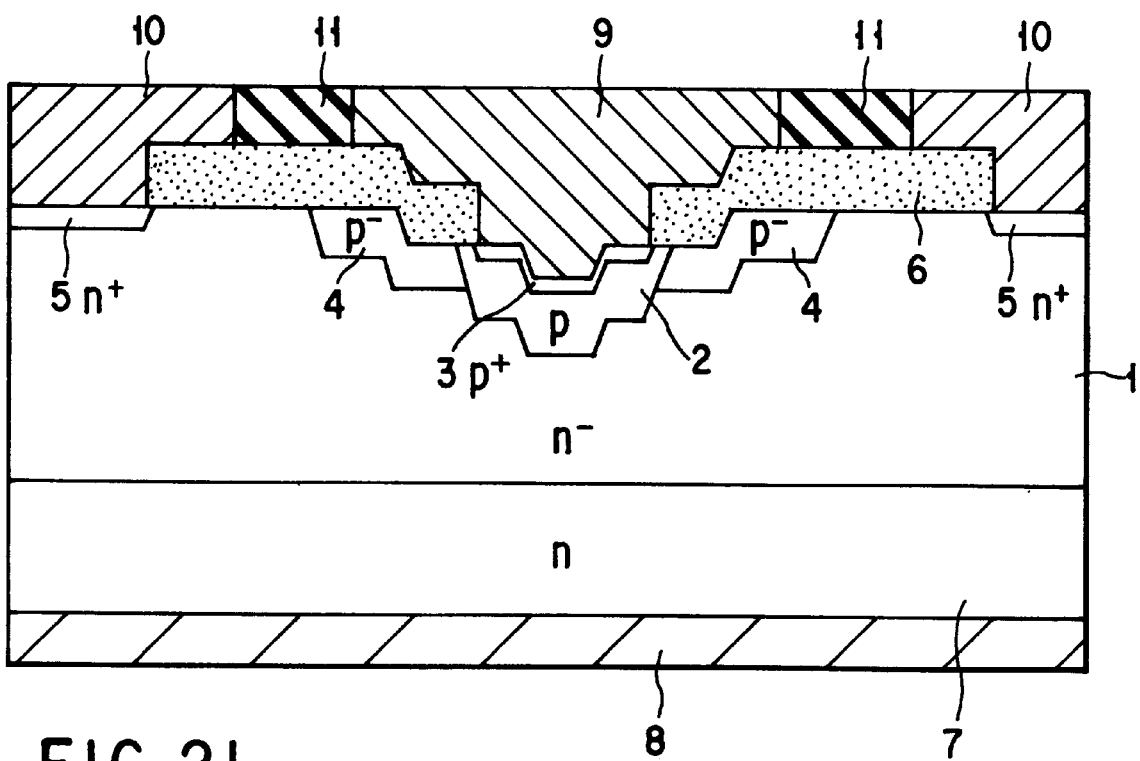
FIG. 21 is a sectional view showing a high voltage semiconductor device according to the seventh embodiment of the present invention.

FIG. 21 is a sectional view showing a high voltage semiconductor device according to the seventh embodiment of the present invention. The seventh embodiment is different from the first embodiment in that a second recess is formed in the bottom of a recess (first recess), and p-type anode layers 2 and 3 are formed on the bottom of the first recess including the second recess. The seventh embodiment can also have the same effects as those in the first embodiment.

(Eighth Embodiment)

Figure 22:
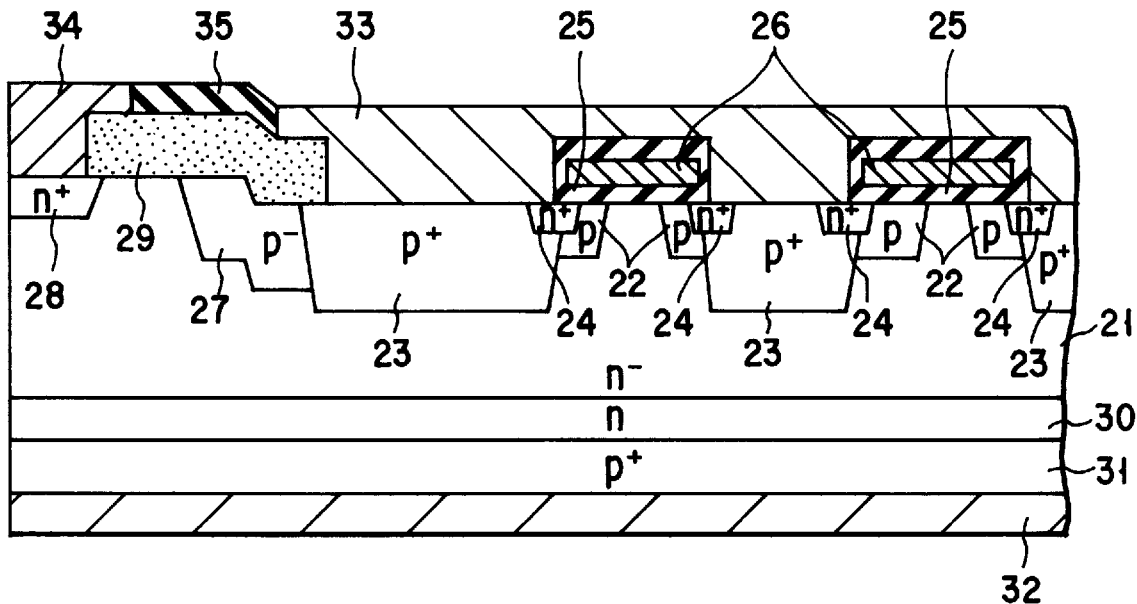
FIG. 22 is a sectional view showing the main part of a high voltage semiconductor device according to the eighth embodiment of the present invention.

FIG. 22 is a sectional view showing the main part of a high voltage semiconductor device according to the eighth embodiment of the present invention. In the eighth embodiment, an IGBT is used as a high voltage semiconductor element.

In FIG. 22, reference numeral 21 denotes a high-resistance n-type base layer. Recesses are formed in the front surface of the n-type base layer 21, and a first p-type base layer 22 is selectively formed on the bottom surface of each recess. A second heavily doped p-type base layer 23 is selectively formed in the formation region of the first p-type base layer 22 to a depth large enough to extend through the first p-type base layer 22.

A heavily doped n-type source layer 24 is formed in the surfaces of the p-type base layers 22 and 23. A gate electrode 26 is arranged via a gate insulating film 25 on the p-type base layer 22 in the region sandwiched between the n-type source layers 24 and the n-type base layers 21.

A lightly doped p-type resurf layer 27 with a field relaxation structure (junction termination structure) is formed around the p-type base layer 23 in the front surface of the n-type base layer 21 in contact with the p-type base layer 23. In this case, the p-type resurf layer 27 is formed from the bottom and side surface of the recess in the n-type base layer 21 to the front surface of the n-type base layer 21 outside the recess. Of semiconductor devices formed in the recesses, the p-type base layer 23 in contact with the p-type resurf layer 27 is located at the outermost portion.

A heavily doped n-type channel stopper layer 28 with a junction termination structure is formed in the front surface of the n-type base layer 21 to be spaced apart from the p-type resurf layer 27 by a predetermined distance. A high-resistance film 29 such as an SIPOS film is formed in the region extending from an edge of the second p-type base layer 23 to the p-type resurf layer 27, the n-type base layer 21, and the n-type channel stopper layer 28. Instead of the high-resistance film 29, an insulating film may be formed.

A second n-type base film 30 doped more heavily than the first n-type base layer 21 is formed on the back surface of the first n-type base layer 21 having a high resistance. A heavily doped p-type drain layer 31 is formed on the surface of the n-type base film 30. A drain electrode 32 is formed on the p-type drain layer 31, while a source electrode 33 is formed on the n-type source layer 24. The source electrode 33 also contacts the p-type base layer 23. An electrode 34 is formed on the n-type channel stopper layer 28. Reference numeral 35 denotes an insulating film.

In the eighth embodiment, the recess is formed in the front surface of the n-type base layer 21, and an IGBT is formed in a thin region of the recess. That is, the IGBT is thin in correspondence with the depth of the recess even for a thick n-type base layer 21 (semiconductor substrate).

Therefore, even if the p-type resurf layer 27 is formed, and the n-type base layer 21 is made thick in order to ensure a necessary withstanding voltage, no deterioration in element characteristics such as the forward voltage drop and the turn-off characteristics occurs.

According to the eighth embodiment, the above features can also be obtained by the following reason. More specifically, in the eighth embodiment, since the step is formed in the region where the p-type resurf layer 27 is formed, the number of field concentration portions is larger than that in the conventional element. Therefore, the withstanding voltage obtained by integrating the electric field increases.

The above effects can also be attained only by forming an element in the thin region of the recess or only by forming the p-type resurf layer 27 having a plurality of steps at the interface between the p-type resurf layer 27 and the n-type base layer 21.

(Ninth Embodiment)

Figure 23:
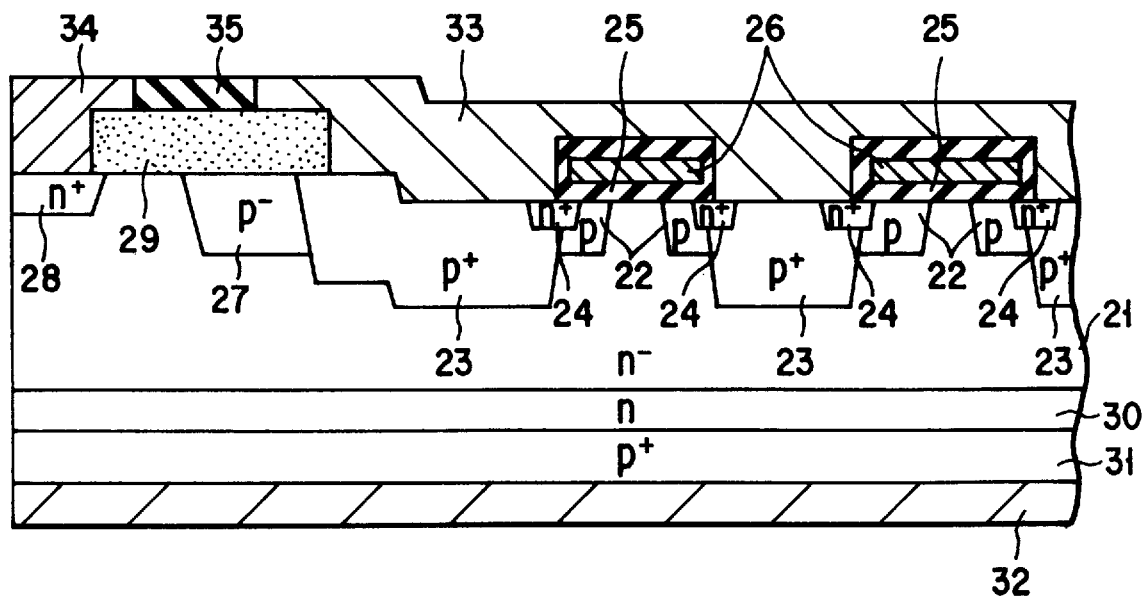
FIG. 23 is a sectional view showing the main part of a high voltage semiconductor device according to the ninth embodiment of the present invention.

FIG. 23 is a sectional view showing the main part of a high voltage semiconductor device according to the ninth embodiment of the present invention. The ninth embodiment is different from the eighth embodiment in that the step of a recess exists in not the formation region of a p-type resurf layer 27 but only a main element region.

In the ninth embodiment as well, a main element can be made thin in correspondence with the depth of the recess even for a thick n-type base layer 21 (semiconductor substrate). Even if the p-type resurf layer 24 is formed, and the n-type base layer 21 is made thick in order to ensure a necessary withstanding voltage, no deterioration in element characteristics such as the forward voltage drop and the turn-off characteristics occurs.

(10th Embodiment)

Figure 24:
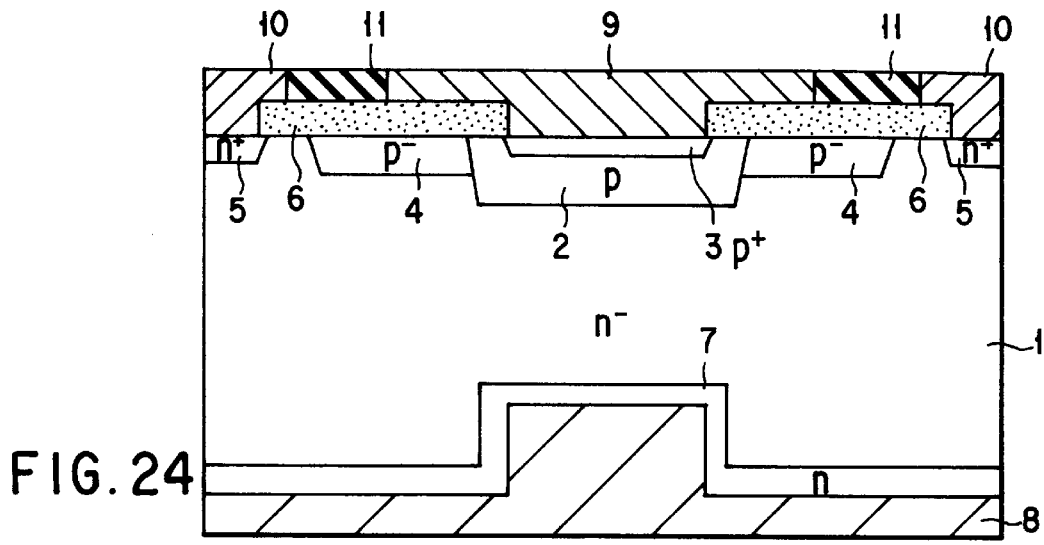
FIG. 24 is a sectional view showing the main part of a high voltage semiconductor device according to the 10th embodiment of the present invention.

FIG. 24 is a sectional view showing the main part of a high voltage semiconductor device according to the 10th embodiment of the present invention. The 10th embodiment is different from the first embodiment in that a recess is formed in the back surface of an n-type cathode layer 1 (surface opposite to the major surface on the anode side), and the recess faces p-type anode layers 2 and 3.

According to the 10th embodiment, a main element can be made thin in correspondence with the depth of the recess in the back surface even for a thick n-type cathode layer 1 (semiconductor substrate). Even if a p-type resurf layer 4 is formed, and the n-type cathode layer 1 is made thick in order to ensure a necessary withstanding voltage, no deterioration in element characteristics such as the forward voltage drop and the reverse recovery loss occurs.

Figure 25:
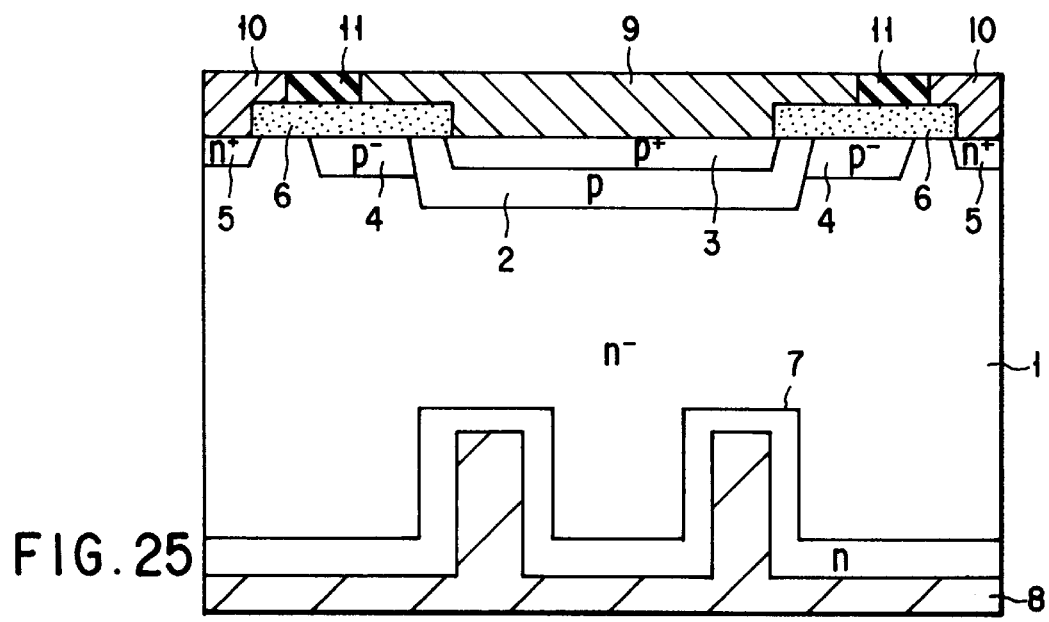
FIG. 25 is a sectional view showing a modification of the high voltage semiconductor device in FIG. 24.

FIG. 25 shows a modification of the 10th embodiment. In this element, two recesses each having one step are formed in the back surface of the n-type cathode layer 1 in the region facing the p-type anode layers 2 and 3. This structure is effective when the size of a recess to be formed is limited due to limitations in processes such as the wafer strength and formation control in an etching process.

(11th Embodiment)

Figure 26:
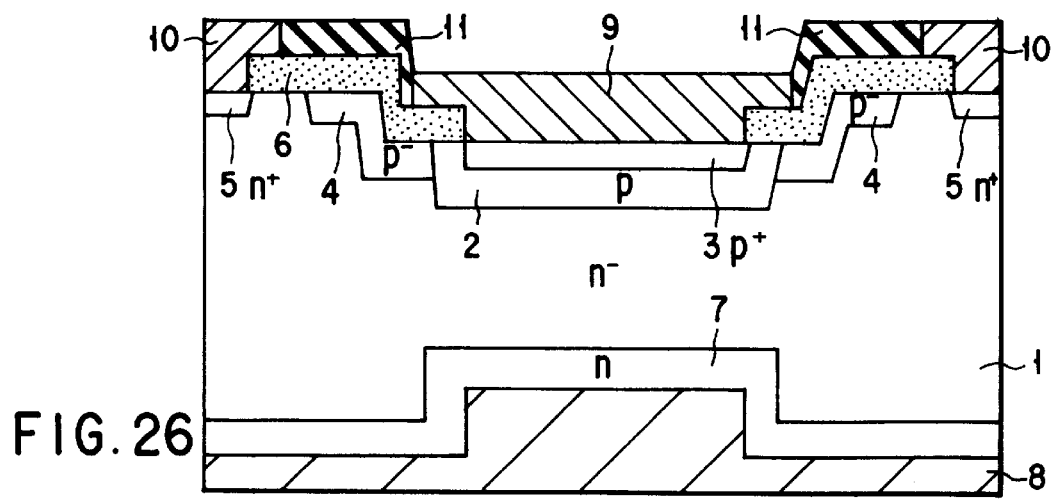
FIG. 26 is a sectional view showing the main part of a high voltage semiconductor device according to the 11th embodiment of the present invention.

FIG. 26 is a sectional view showing the main part of a high voltage semiconductor device according to the 11th embodiment of the present invention. The 11th embodiment is a combination of the 10th and first embodiments. More specifically, in the element of FIG. 5, a recess is formed in the back surface of an n-type base layer 1 so as to face p-type anode layers 2 and 3. The 11th embodiment can also have the same effects as those in the first and 10th embodiments.

FIGS. 27A to 27D show a method of forming the basic structure of an element.

Figure 27A:
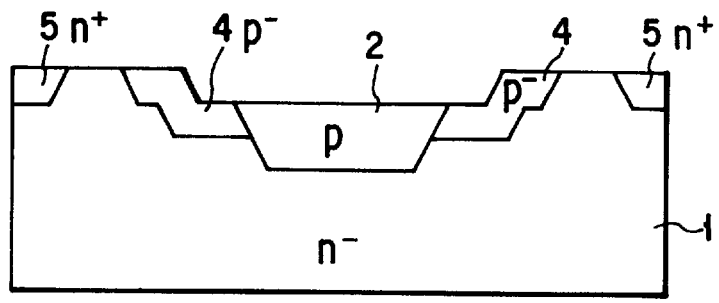
FIGS. 27A to 27D are sectional views sequentially showing a method of forming the basic structure of the high voltage semiconductor device in FIG. 26.

As shown in FIG. 27A, an element structure is formed on the front surface (on the main junction side) of the n-type base layer 1 in accordance with the method described in the first embodiment.

Figure 27B:
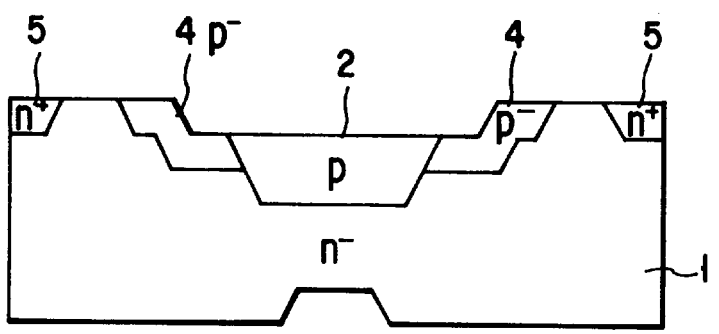
Figure 27C:
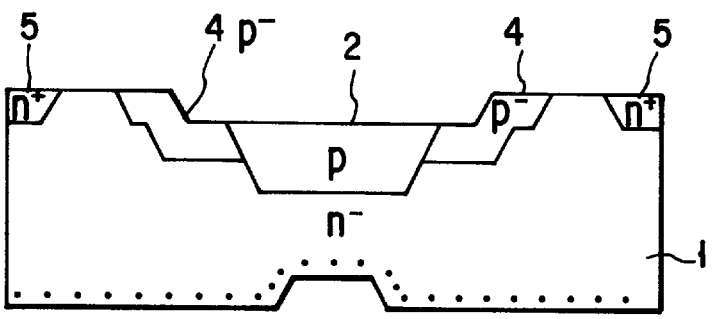
Figure 27C:

After a recess is formed in the back surface of the n-type base layer 1, as shown in FIG. 27B, n-type impurity ions In are implanted in the entire back surface of the n-type base layer 1, as shown in FIG. 27C.

Figure 27D:
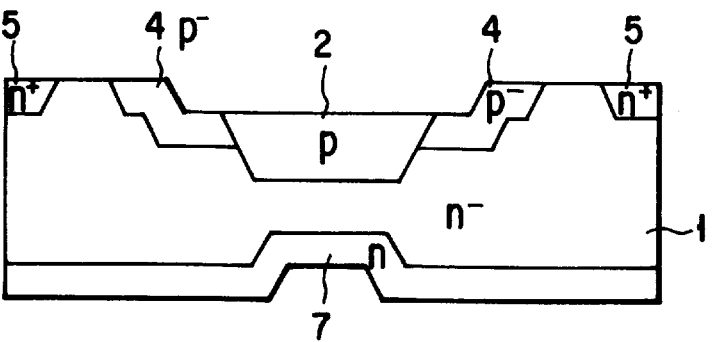

Finally, as shown in FIG. 27D, annealing is performed to form an n-type cathode layer 7, completing the basic structure of the element.

FIGS. 28A to 28E show another formation method. In the method shown in FIGS. 27A to 27D, after the element structure is formed on the front surface of the n-type base layer, the element structure (n-type cathode layer 7) is formed on its back surface. In the method shown in FIGS. 28A to 28E, the formation order is reversed.

Figure 28A:
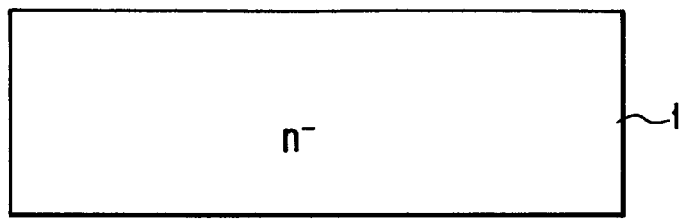
FIGS. 28A to 28E are sectional views sequentially showing another method of forming the basic structure of the high voltage semiconductor device in FIG. 26.
Figure 28B:
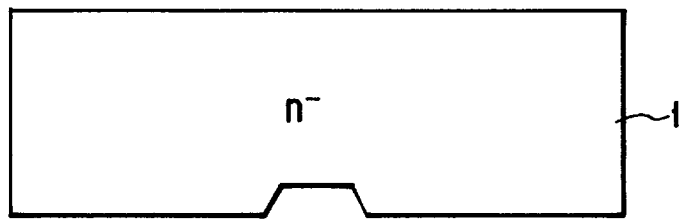

More specifically, the n-type base layer 1 (semiconductor substrate) is prepared, and a recess is formed in the back surface of the n-type base layer 1, as shown in FIGS. 28A and 28B.

Figure 28C:
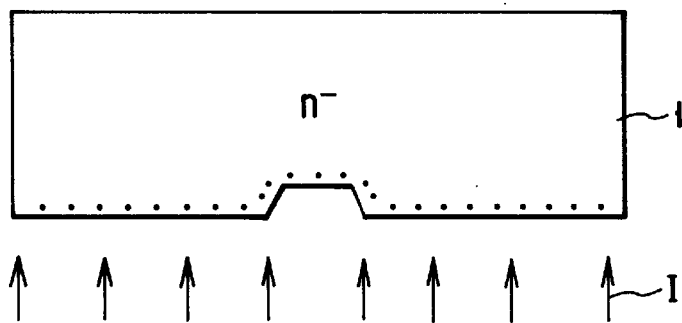
Figure 28D:
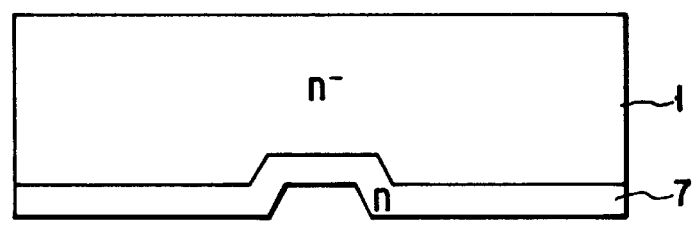

As shown in FIGS. 28C and 28D, after the n-type impurity ions In are implanted in the entire back surface of the n-type base layer 1, annealing is performed to form the n-type cathode layer 7.

Figure 28E:
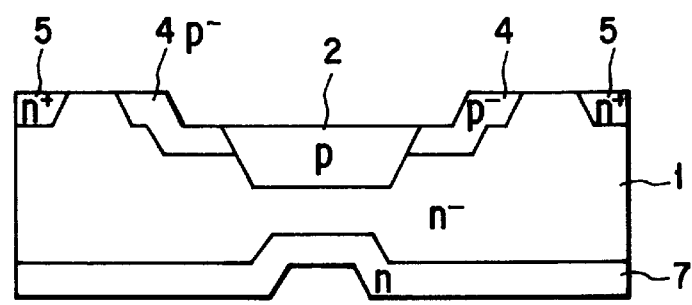
Figure 29A:
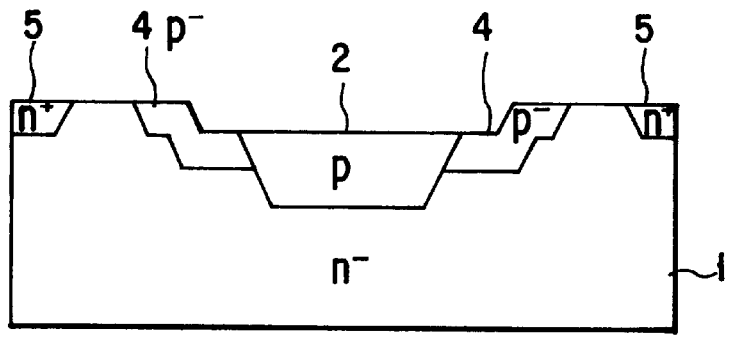
FIGS. 29A to 29D are sectional views sequentially showing still another method of forming the basic structure of the high voltage semiconductor device in FIG. 26.
Figure 29B:
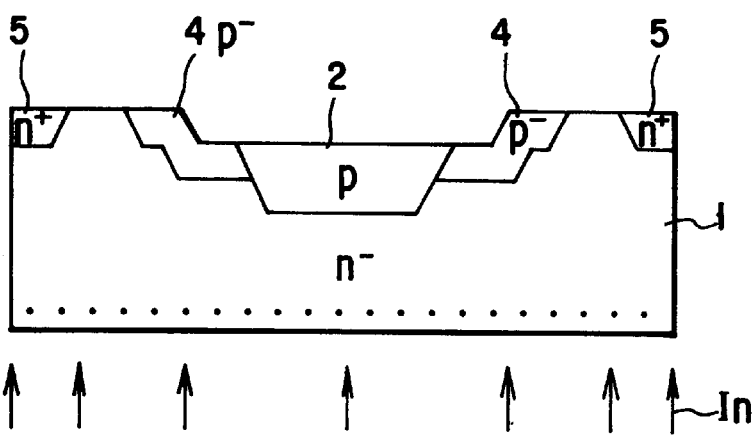
Figure 29C:
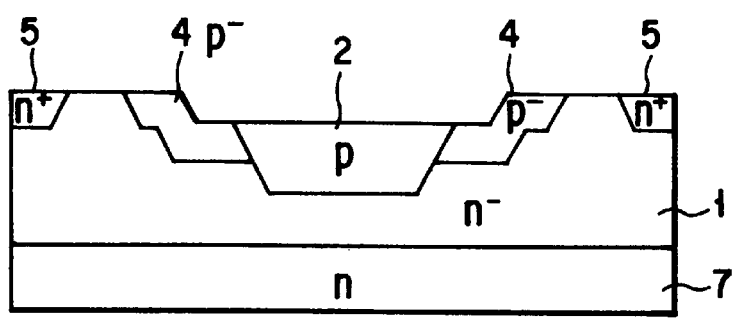
Figure 29D:
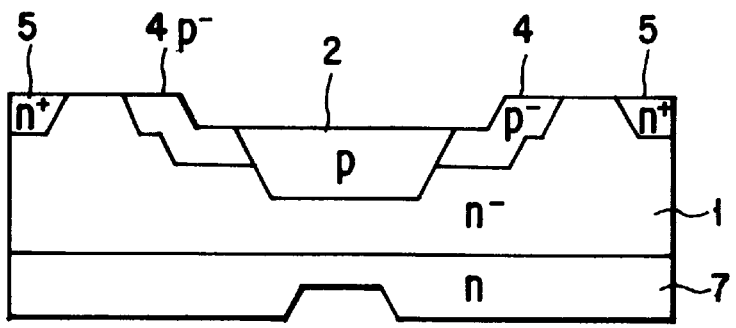
Figure 30A:
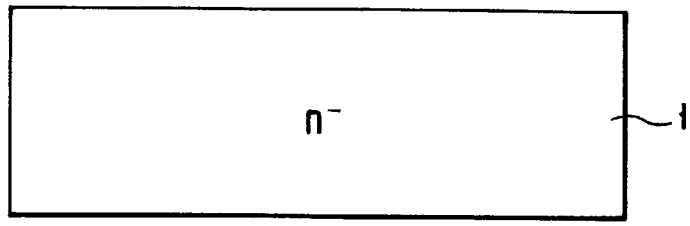
FIGS. 30A to 30E are sectional views sequentially showing still another method of forming the basic structure of the high voltage semiconductor device in FIG. 26.
Figure 30B:
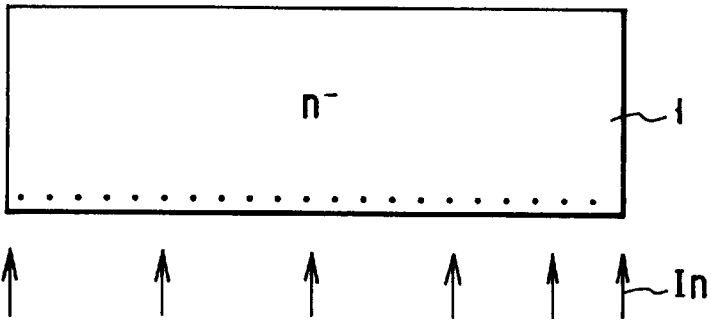
Figure 30C:
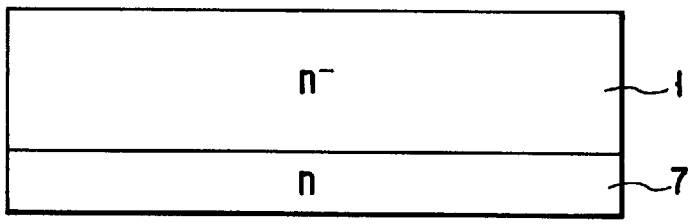
Figure 30D:
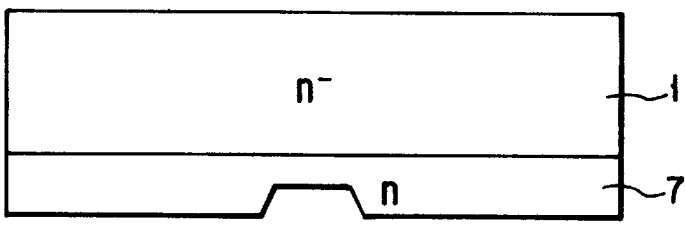
Figure 30E:
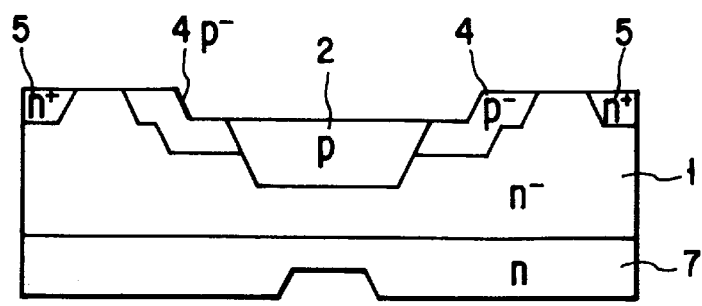

Finally, as shown in FIG. 28E, an element structure is formed on the front surface (on the main junction side) of the n-type base layer 1 in accordance with the method described in the first embodiment.

FIGS. 29A to 29D and 30A to 30E respectively show still another formation methods. In the formation method of FIGS. 29A to 29D reverse to the formation method of FIG. 27A to 27D, a recess is formed after the n-type impurity ions In are implanted in the entire back surface of the n-type base layer 1 to form the n-type cathode layer 7. Similarly, in the formation method of FIGS. 30A to 30E reverse to the formation method of FIGS. 28A to 28E, a recess is formed after the n-type impurity ions In are implanted in the entire back surface of the n-type base layer 1 to form the n-type cathode layer 7.

According to the formation methods of FIGS. 29A to 29D and 30A to 30E, since the surface concentration of the n-type cathode layer 7 in the element region can be decreased, the tail current can be reduced to realize a diode with a small reverse recovery loss.

(12th Embodiment)

Figure 31:
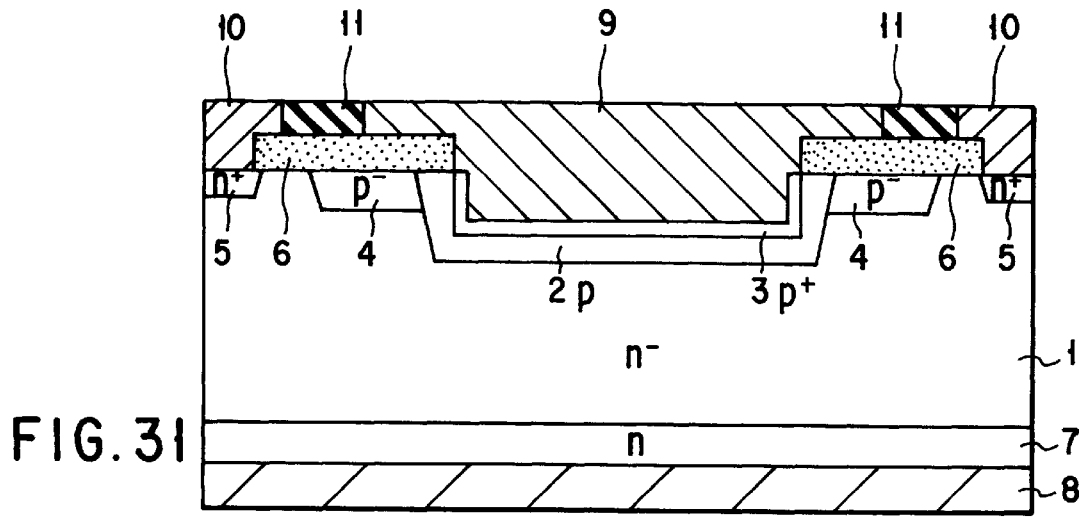
FIG. 31 is a sectional view showing the main part of a high voltage semiconductor device according to the 12th embodiment of the present invention.

FIG. 31 is a sectional view showing the main part of a high voltage semiconductor device according to the 12th embodiment of the present invention. The 12th embodiment is different from the sixth embodiment in a method of forming an element structure in a recess. That is, in the 12th embodiment, after a p-type anode layer 2 is formed, a recess is formed by the method of forming an element structure in a recess.

Figure 32A:
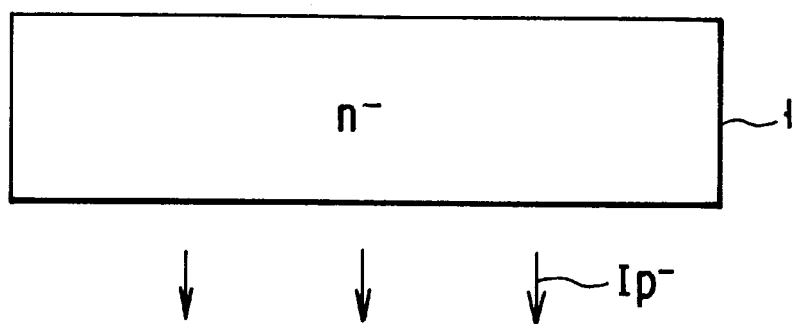
FIGS. 32A to 32E are sectional views sequentially showing a method of forming the element structure of a recess in FIG. 31.
Figure 32B:
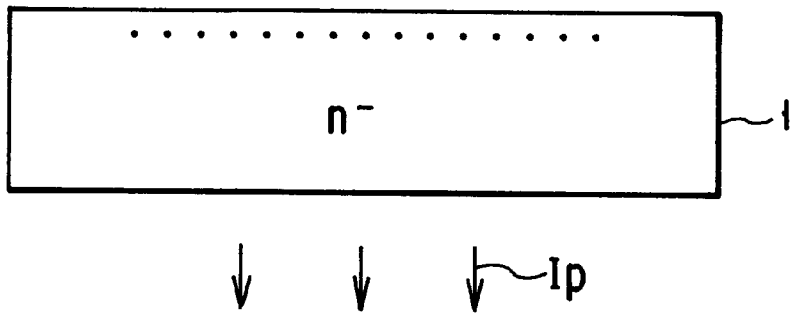

FIGS. 32A to 32E show the method of forming an element structure in a recess. As shown in FIGS. 32A and 32B, an n-type base layer 1 (semiconductor substrate) is prepared, and p-type impurity ions Ip⁻ are implanted in part of its front surface.

Figure 32C:
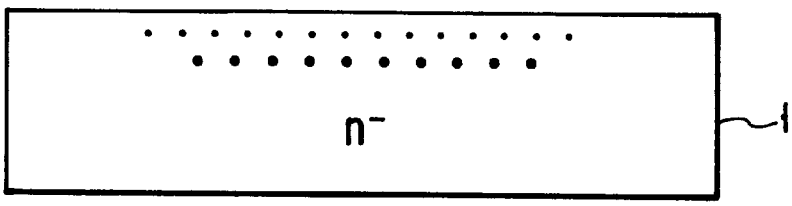

As shown in FIG. 32C, p-type impurity ions Ip are implanted in part of the region where the p-type impurity ions Ip⁻ are implanted. In this case, the dose of the p-type impurity ions Ip is higher than that of the p-type impurity ions Ip⁻.

Figure 32D:
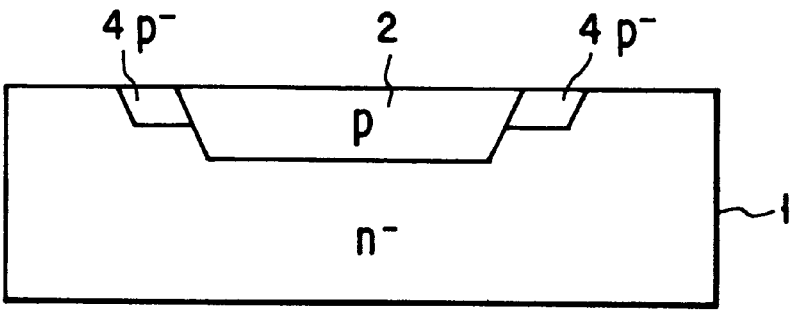

As shown in FIG. 32D, annealing is performed to form the p-type anode layer 2 and a p-type resurf layer 4.

Figure 32E:
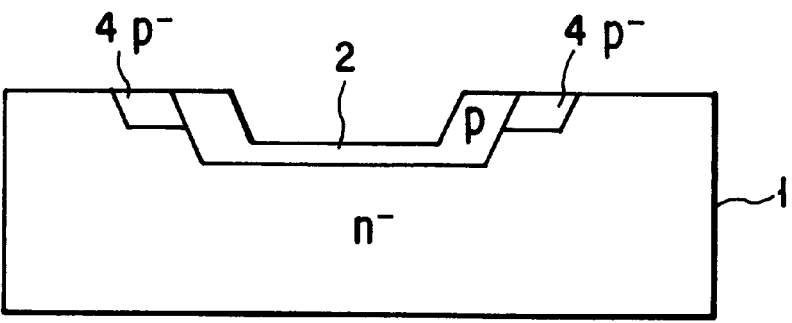

Finally, as shown in FIG. 32E, the front surface of the p-type anode layer 2 is etched to form a recess, completing the basic structure of the recess region.

In the 12th embodiment, no p-type anode layer 3 is described. In forming the p-type anode layer 3, p-type impurity ions having a higher impurity concentration are selectively implanted in the surface of the implantation region of the p-type impurity ions Ip, after, e.g., the step in FIG. 32E.

Figure 33:
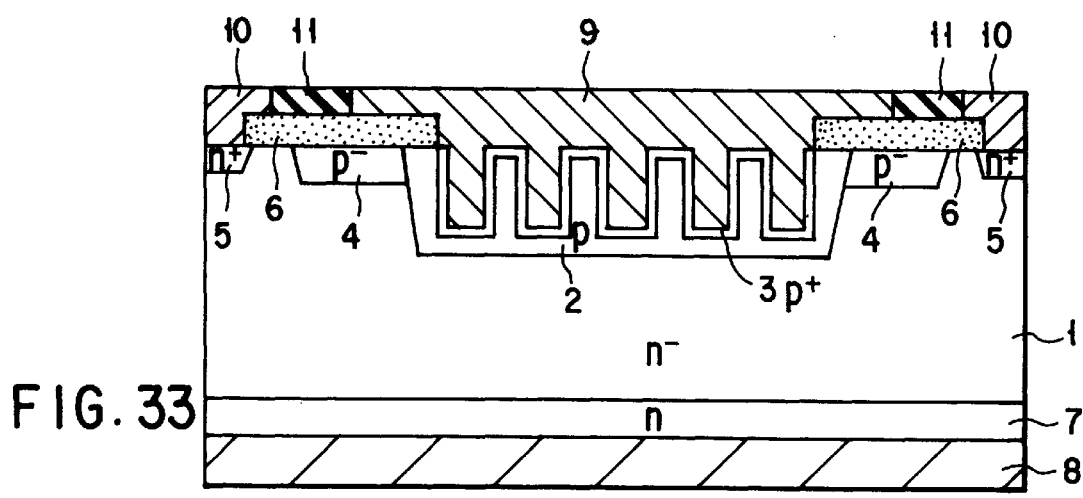
FIG. 33 is a sectional view showing a modification of the high voltage semiconductor device in FIG. 31.

FIG. 33 shows a modification of the 12th embodiment. In this element, five recesses each having one step are formed, but the number of steps is not limited to this. Since this structure can substantially make the base of the main element region thin, the same effects as described above can be obtained.

(13th Embodiment)

Figure 34:
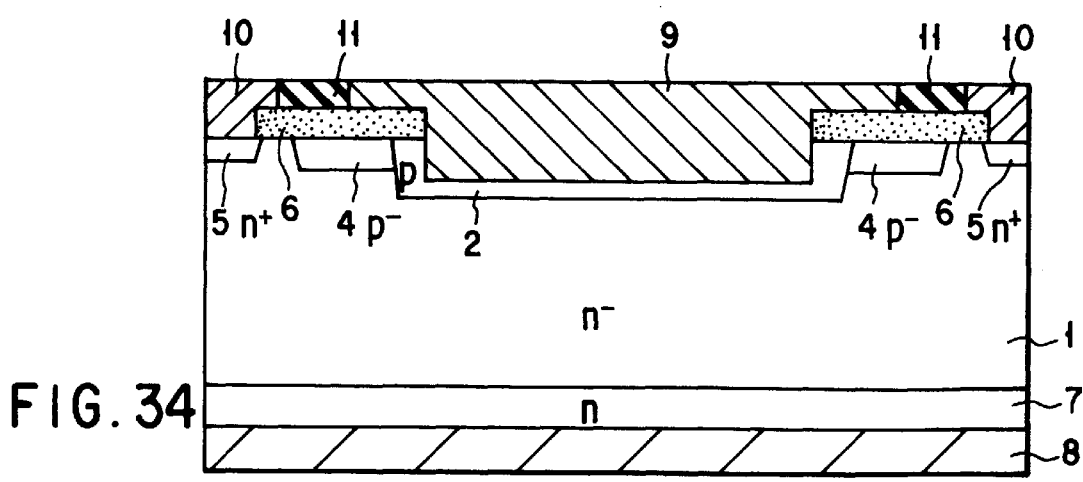
FIG. 34 is a sectional view showing the main part of a high voltage semiconductor device according to the 13th embodiment of the present invention.

FIG. 34 is a sectional view showing the main part of a high voltage semiconductor device according to the 13th embodiment of the present invention.

The 13th embodiment is different from the 12th embodiment in the absence of any heavily doped p-type anode layer 3. Since this structure can decrease the surface concentration of a p-type anode layer 2, a diode in which the maximum reverse current in reverse recovery of the diode is reduced to decrease the reverse recovery loss can be realized. In the 13th embodiment, the area of the p-type anode layer 2 is set larger than that in the sixth embodiment, so that the forward voltage VF can be kept low.

(14th Embodiment)

Figure 35:
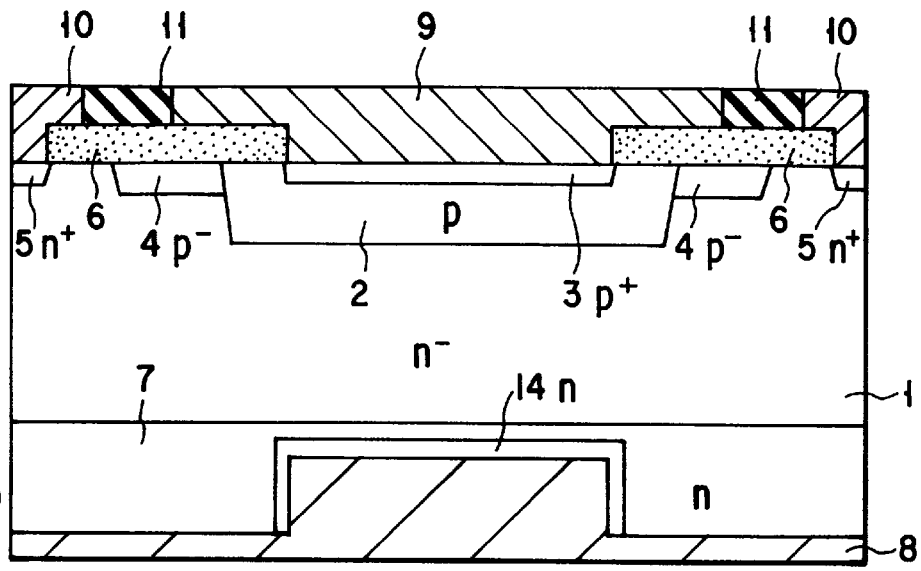
FIG. 35 is a sectional view showing the main part of a high voltage semiconductor device according to the 14th embodiment of the present invention.

FIG. 35 is a sectional view showing the main part of a high voltage semiconductor device according to the 14th embodiment of the present invention.

The 14th embodiment is characterized in addition to the features of the element in FIG. 24 by forming a heavily doped n-type cathode layer 14 on the surface of an n-type cathode layer 7 in contact with the bottom and side walls of a recess in a back surface. This structure increases the injection efficiency of electrons, and is effective particularly when the forward voltage drop is reduced.

Figure 36:
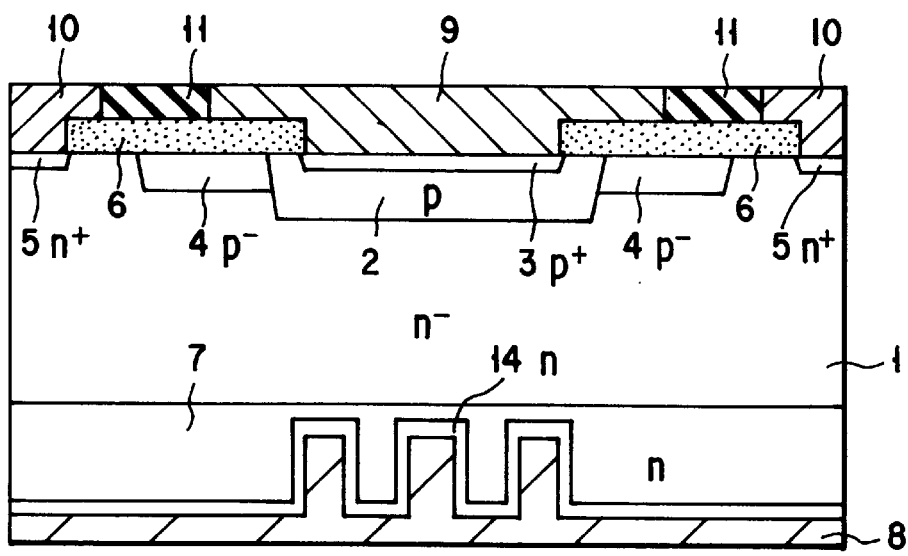
FIG. 36 is a sectional view showing a modification of the high voltage semiconductor device in FIG. 33.

FIG. 36 shows a modification of the 14th embodiment. In this element, three recesses each having one step are formed in the back surface. The number of recesses may be two, or four or more.

(15th Embodiment)

Figure 37:
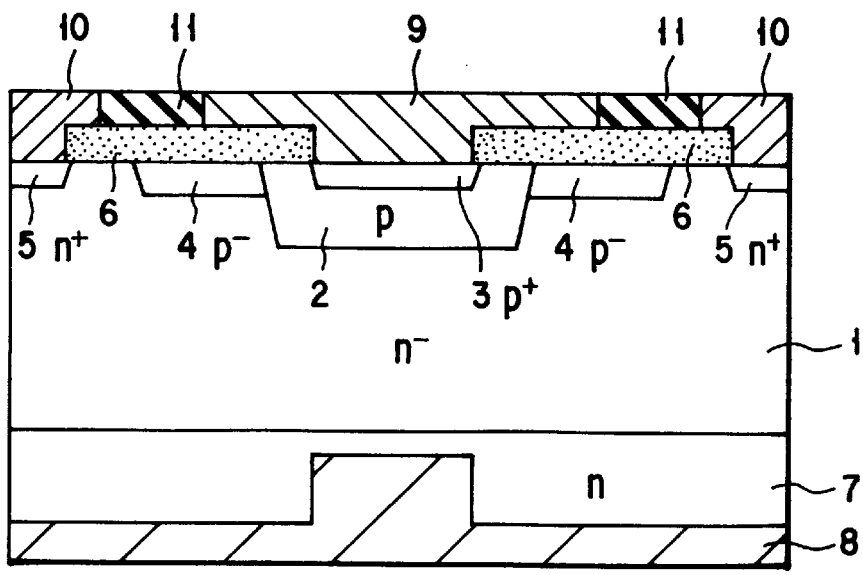
FIG. 37 is a sectional view showing the main part of a high voltage semiconductor device according to the 15th embodiment of the present invention.

FIG. 37 is a sectional view showing the main part of a high voltage semiconductor device according to the 15th embodiment of the present invention. The 15th embodiment is characterized by eliminating the heavily doped n-type cathode layer 14 from the high voltage semiconductor device of the 14th embodiment, thereby simplifying the element structure.

As described above, according to the first aspect of the present invention, by forming a recess in a semiconductor substrate, the region where a high voltage semiconductor element is to be formed is made thin, and a field relaxation structure with a plurality of steps at the interface between the recess and the semiconductor substrate is used. Therefore, there can be realized a high voltage semiconductor device capable of preventing any deterioration in element characteristics such as the forward voltage drop, reverse recovery loss, or the like of the high voltage semiconductor element even if the field relaxation structure is used, and the semiconductor substrate is made thick in order to ensure a necessary withstanding voltage.

Embodiments (16th to 21st embodiments) according to the second aspect of the present invention will be described below. Although the first conductivity type is the n type, and the second conductivity type is the p type in these embodiments, they may be reversed. The same reference numerals denote the same parts, and a repetitive description thereof will be omitted.

(16th Embodiment)

Figure 38:
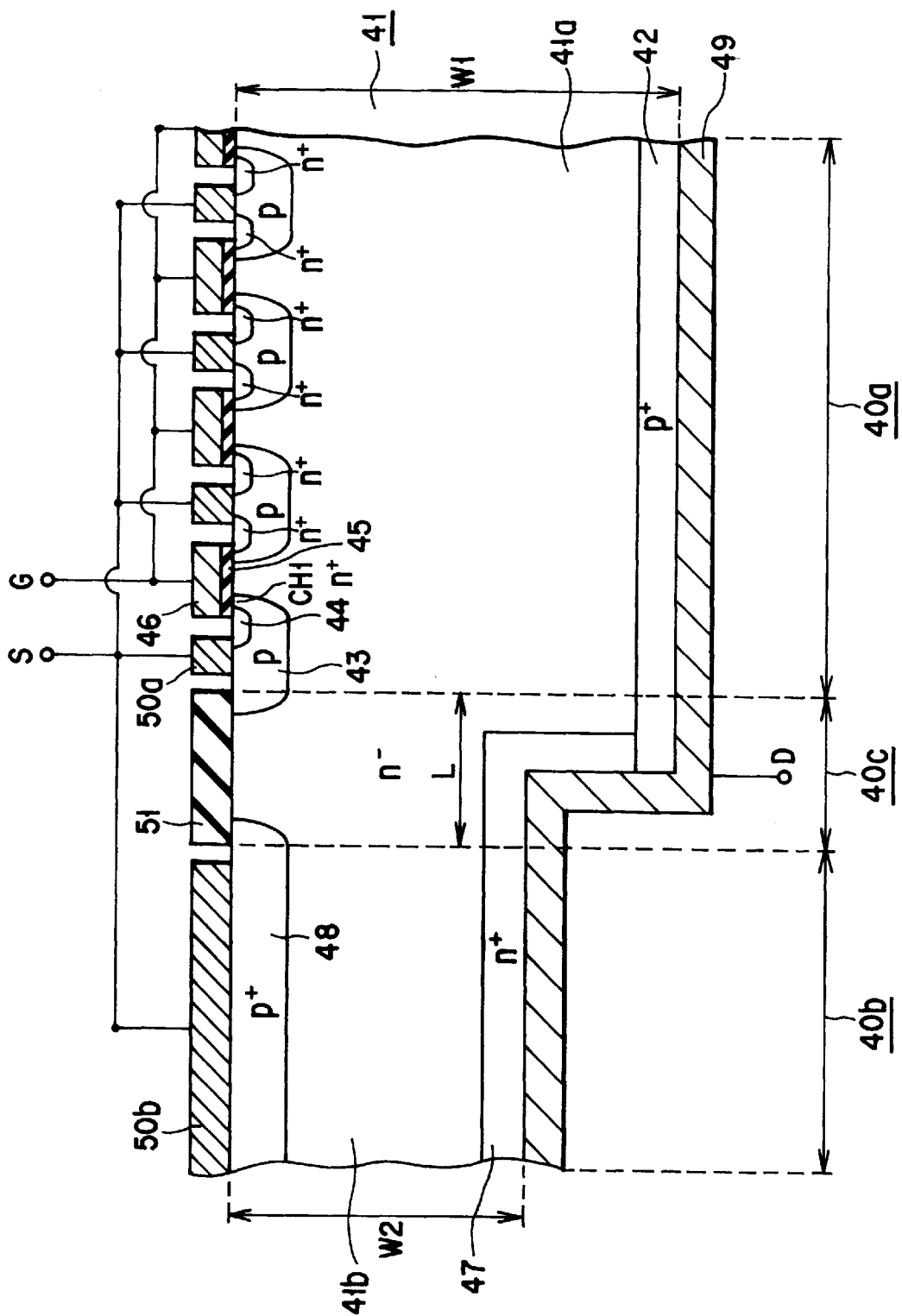
FIG. 38 is a sectional view showing the main part of a semiconductor power device according to the 16th embodiment of the present invention.

FIG. 38 is a sectional view showing a semiconductor power device according to the 16th embodiment of the present invention. In FIG. 38, reference numeral 41 denotes a high-resistance n-type base layer (semiconductor substrate). A recess is selectively formed in one surface (back surface) of the n-type base layer 41.

A p-type drain layer 42 is formed on the back surface of the n-type base layer 41 in the region where no recess is formed, whereas p-type base layers 43 are formed on the other surface (front surface) of the n-type base layer 41. An n-type source layer 44 is formed in each p-type base layer 43. A gate electrode 46 is formed via a gate insulating film 45 on the p-type base layer 43 between the n-type base layer 41 and the n-type source layer 44. The gate electrode 46, the gate insulating film 45, the p-type base layer 43, the n-type base layer 41, and the n-type source layer 44 constitute an electron injection MOSFET having a channel region CH1.

An n-type cathode layer 47 is formed on the bottom surface (back surface) and side wall of the recess in the n-type base layer 41. A p-type anode layer 48 is formed in the region of the other surface (front surface) of the n-type base layer 41 that faces the recess.

A drain electrode (second main electrode) 49 is formed on the p-type drain layer 42 and the n-type cathode layer 47 in contact with both the layers 42 and 47. A source electrode 50a is formed on each n-type source layer 44 and a corresponding p-type base layer 43 in contact with these layers. A source electrode (anode electrode) 50b is formed on the p-type anode layer 48. The electrodes 50a and 50b constitute the first main electrode, and the gate electrode 46 serves as a sub-electrode. A plurality of source electrodes and a plurality of gate electrodes are connected to each other, and this connection is schematically shown in FIG. 38.

In the above arrangement, a diode is formed in a region 40b where the recess is formed, and an IGBT is formed in a region 40a where no recess is formed.

An isolation region 40c below an insulating film 51 that is sandwiched between the IGBT region 40a and the diode region 40b serves as an isolation region for the IGBT and the diode. The width L of the region 40c is desirably a carrier diffusion length Ld or larger. That is, letting T be the lifetime of a carrier, and D be the diffusion coefficient, the following relation is satisfied:

$$L > Ld = (D\tau)^{1/2}$$

Alternatively, the isolation region 40c may contain lifetime killers (to be described later).

The operation of this semiconductor device will be explained. While positive and negative voltages are respectively applied to the drain electrode 49 and the source electrode 50a, if a positive voltage with respect to the source is applied to the gate electrode 46, the surface of the p-type base layer 43 that contacts the gate electrode 46 is inverted, and electrons e are injected from the n-type source layer 44 into an n-type base layer 41a via the inverted layer to reach the p-type drain layer 42. Along with this, holes h are injected from the p-type drain layer 42 into the n-type base layer 41. In this manner, both the electrons e and the holes h are injected into the n-type base layer 41 to cause conductivity modulation and reduce the ON voltage.

In a turn-off operation, a negative voltage with respect to the source is applied to the gate electrode 46. Then, the inverted layer formed immediately below the gate electrode 46 disappears to stop the injection of electrons. Some of the holes h in the n-type base layer 41a are discharged to the source electrode 50a via the p-type base layer 43, and the remaining holes h recombine with the electrons e and disappear. Accordingly, the semiconductor device is turned off.

Figure 2:
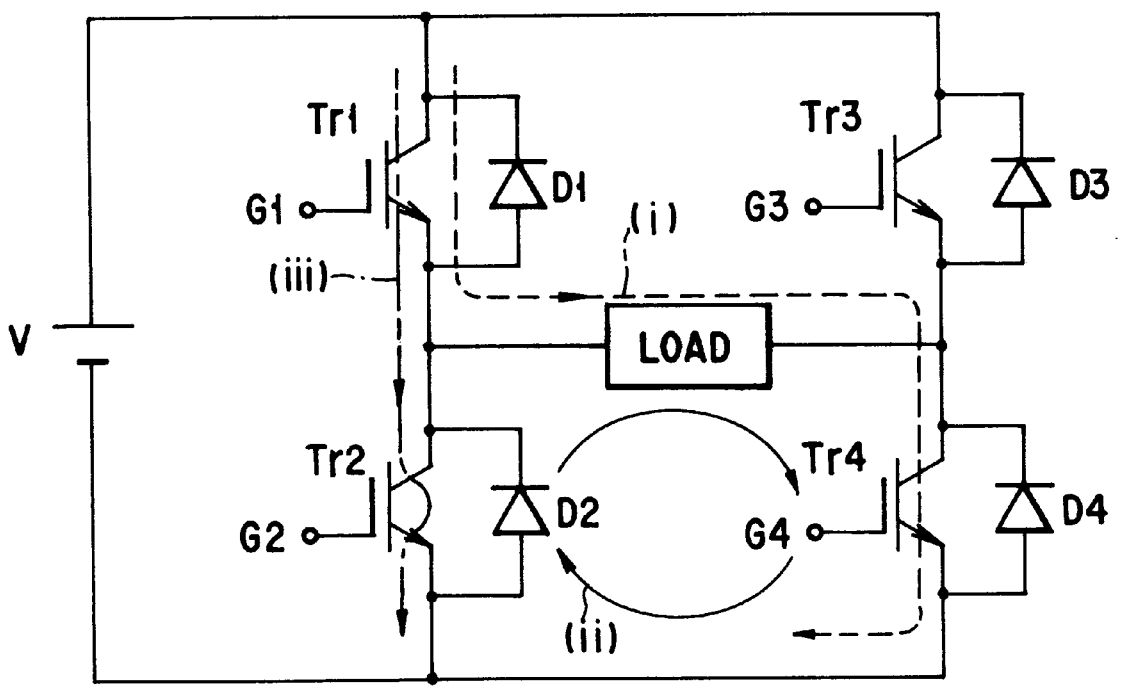
FIG. 2 is a circuit diagram of the main part of an inverter using a conventional IGBT.
Figure 3:
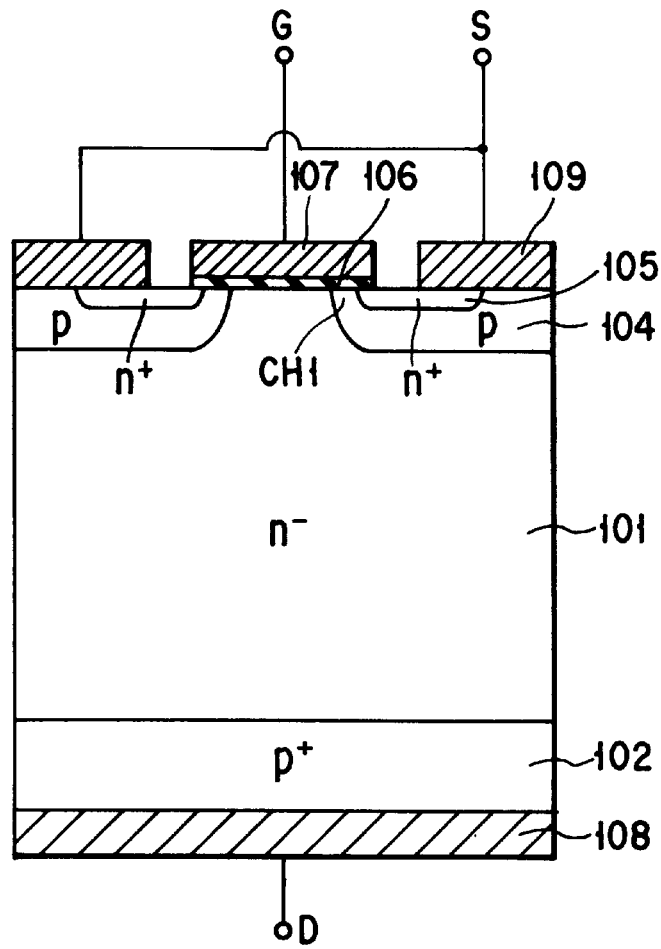
FIG. 3 is a sectional view of the main part of a conventional IGBT.
Figure 4:
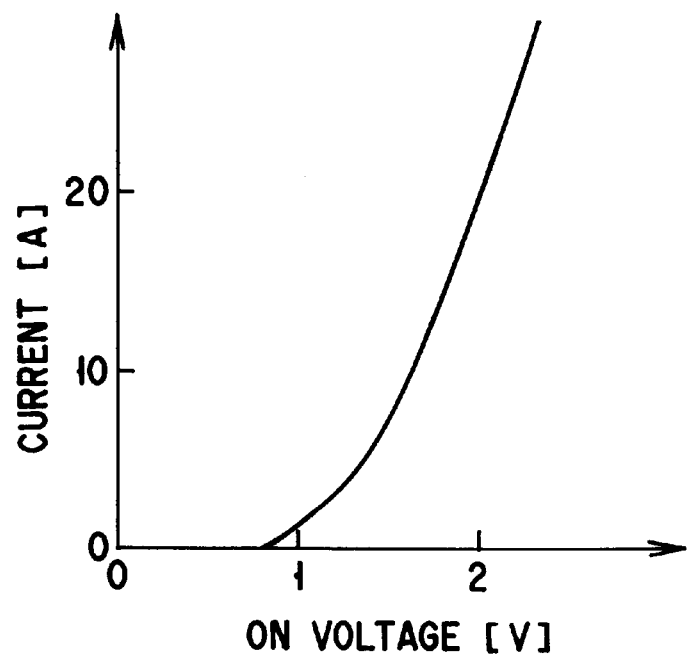
FIG. 4 is a graph showing the current-voltage characteristics of the IGBT.

With the above mechanism, in a state in which Tr1 and Tr2 of an inverter in FIG. 2 are turned on (i.e. in a (i) state of FIG. 2), and when the upper arm element (e.g., Tr1 in FIG. 2) of an inverter is turned off, a counterelectromotive force is generated by an inductive load to bias the drain electrode 49 (FIG. 38) of the lower arm element (Tr2 in FIG. 2) negatively and the source electrode 50a (FIG. 38) positively. During this, the voltage of the source electrode 50a of the lower arm element rises to forward-bias the p-n junction made by the p-type anode layer 48 and an n-type base layer 41b. Then, the holes h are injected from the p-type anode layer 48 into the n-type base layer 41b. At the same time, the electrons e are injected from the n-type cathode layer 47 to turn on the element in the backward direction. As a result, conductivity modulation occurs in the n-type base layer 41b to energize the diode region 40b at a low ON voltage (i.e. in a (ii) state of FIG. 2).

In this case, since the thickness W2 of the high-resistance base layer (substrate) 41b constituting the diode is smaller than the thickness W1 of the high-resistance base layer (substrate) 41a constituting the IGBT, the diode can be energized at a low ON voltage upon rendering the element conductive in the backward direction.

When Tr1 is turned on again, the polarity of the applied voltage to Tr2 is inverted, with a result that a reverse recovery current (iii) flows and is superimposed on the load current (i), as shown in FIG. 2. This phenomenon increases a turn-on loss of the switching element (IGBT), in general. The diode portion of the present invention, however, has a low ON resistance, so that a higher speed operation can be realized. As a result, a reduction of the turn-on loss of the IGBT portion can be realized, in addition to the low ON resistance of the diode portion.

The isolation region 40c suppresses an inverse injection of holes from the p-type emitter 42 of the IGBT caused by the carriers diffused in the IGBT region upon reverse recovery of the diode, or suppresses a local latch up of the n-type source of the IGBT.

As described above, the semiconductor power device of the present invention incorporates the function of an anti-parallel freewheeling diode, and has a switching function in the forward direction and conductive characteristics in the backward direction. That is, upon generation of a counter-electromotive force by an inductive load, the semiconductor device is turned on in the backward direction and energized at a low ON voltage.

Figure 39A:
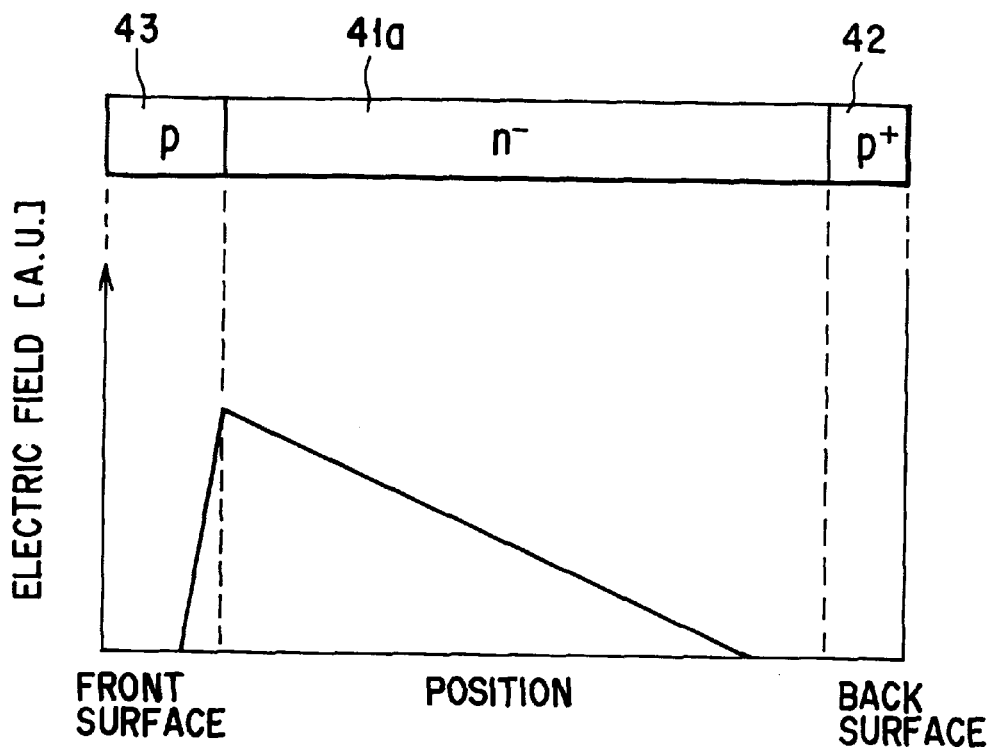
FIG. 39A is a graph showing the profile of the field strength at an IGBT portion in FIG. 38.
Figure 39B:
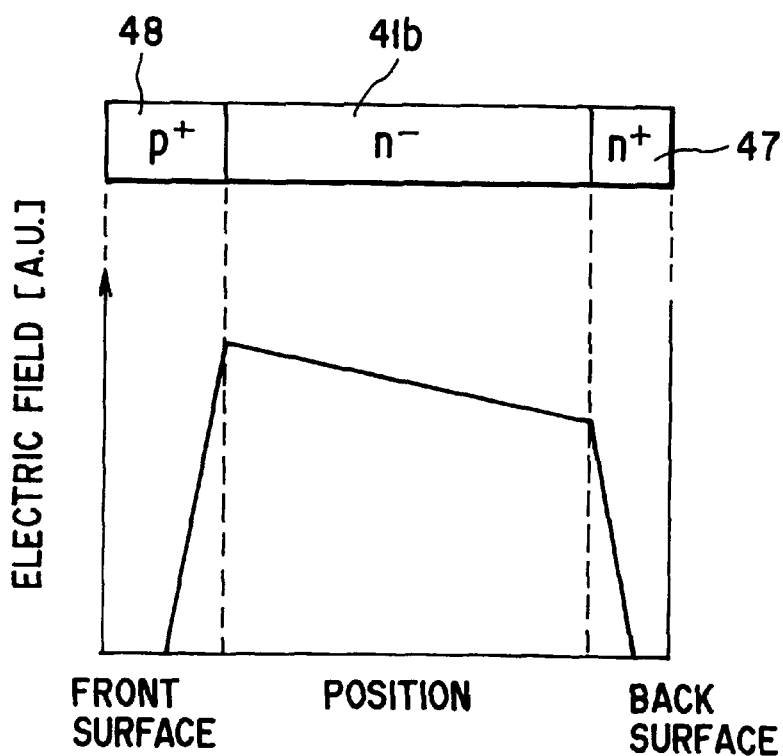
FIG. 39B is a graph showing the profile of the field strength at a diode portion in FIG. 38.

FIGS. 39A and 39B are graphs for explaining the principle of the semiconductor power device according to the present invention. FIG. 39A shows the field strength from the front surface to back surface of the IGBT region 40a in the direction of depth. Since the IGBT is a nonpunch-through device, the field strength reaches 0 within the n-type base layer 41a. To the contrary, since the diode is a punch-through structure, the field strength of the diode in FIG. 39B decreases from the anode side to the cathode side in the n-type base layer 41b with the same inclination as that in the n-type base layer 41a of FIG. 39A, and abruptly decreases to 0 in the n-type cathode layer 47. The integrated values of the field strengths in FIGS. 39A and 39B are equal to each other.

Figure 40:
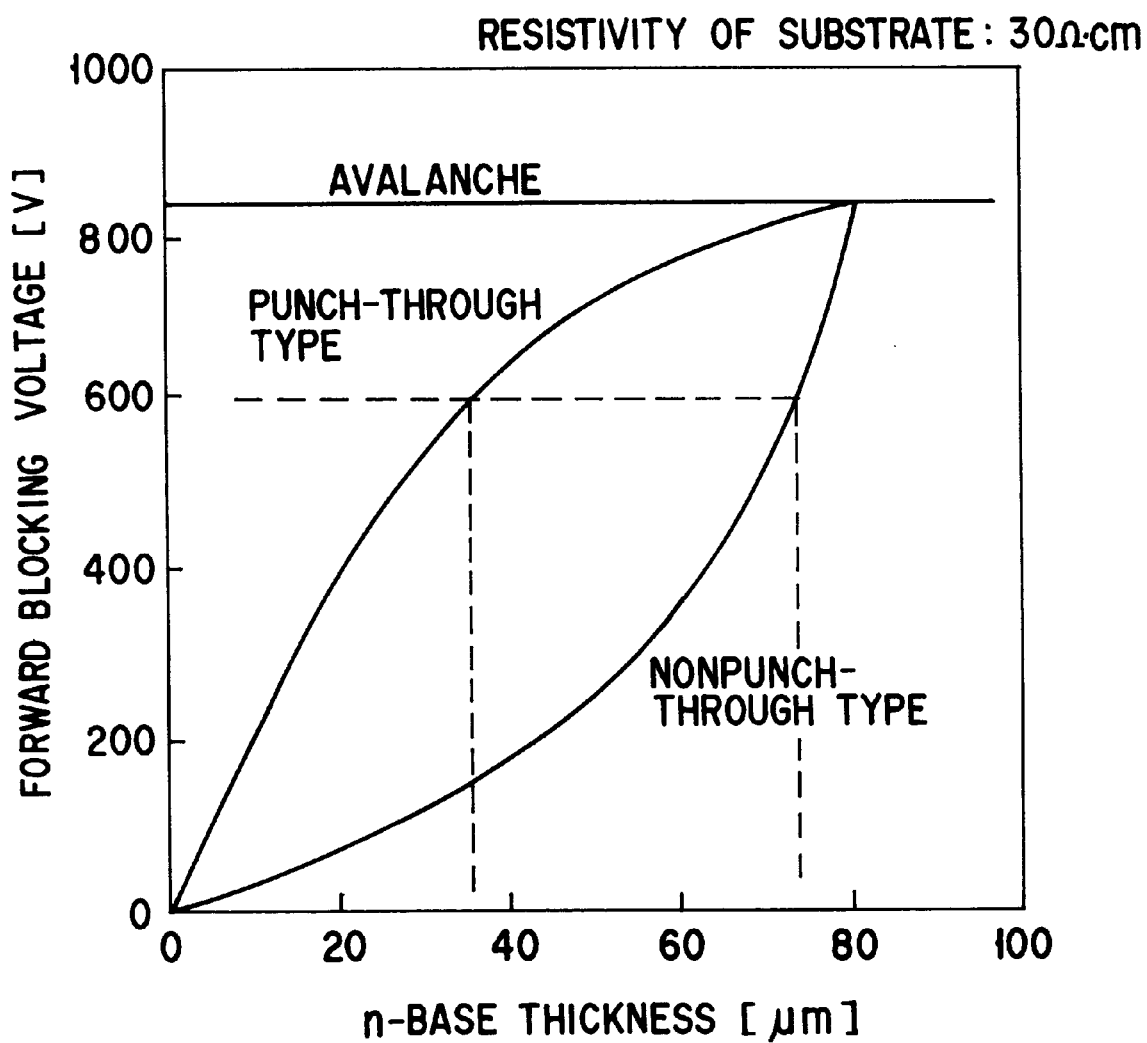
FIG. 40 is a graph showing the comparison results of the relationship between the thickness of an n-type base layer and the forward blocking voltage for a punch-through type element (diode or the like) and a nonpunch-through type element (IGBT or the like)

FIG. 40 is a graph showing the relationship between the thicknesses of the n-type base layers of the diode (punch-through type) and the IGBT (nonpunch-through type) and the withstanding voltage (the resistivity of the substrate is 30Ω·cm). To allow the diode and the IGBT to have the same withstanding voltage (e.g., 600V), the diode is about 35 μm in thickness and the IGBT is about 75 μm in thickness. If the diode is made thick (75 μm) in correspondence with the IGBT, the diode can have a withstanding voltage of 600V or higher, but its ON voltage becomes excessively high. In this way, the present invention provides a structure wherein the IGBT and the diode have optimal n-base thicknesses.

A method of manufacturing the semiconductor power device of the present invention will be explained with reference to FIGS. 41A to 41E.

As shown in FIG. 41A, the semiconductor substrate 41 serving as an n-type base layer is prepared. As shown in FIG. 41B, a plurality of p-wells 43 each serving as the p-type base layer of the IGBT, and the p-type layer 48 serving as the p-type anode of the diode are formed in the front surface of the n-type base substrate. The n-type source layer 44 is formed in each p-well 43. The gate electrode 46 is formed via the gate insulating film 45 on the surface of the n-type base substrate exposed between adjacent p-wells so as to stand on the p-well 43 and the n-type source layer 44. At the same time, the source electrode 50a is formed to contact the n-type source layer 44 and the p-well 43, and the anode electrode 50b is formed on the p-type anode layer 48. The insulating film 51 for the isolation region 40c is formed between the IGBT region 40a and the diode region 40b.

As shown in FIG. 41C, a portion of the back surface of the n-type base substrate 41 that corresponds to the diode region 40b is dry-etched using RIE to form a recess 52. An n-type impurity 53, e.g., phosphorus (P) is ion-implanted in the entire back surface of the n-type base substrate 41 including this recess.

Figure 41D:
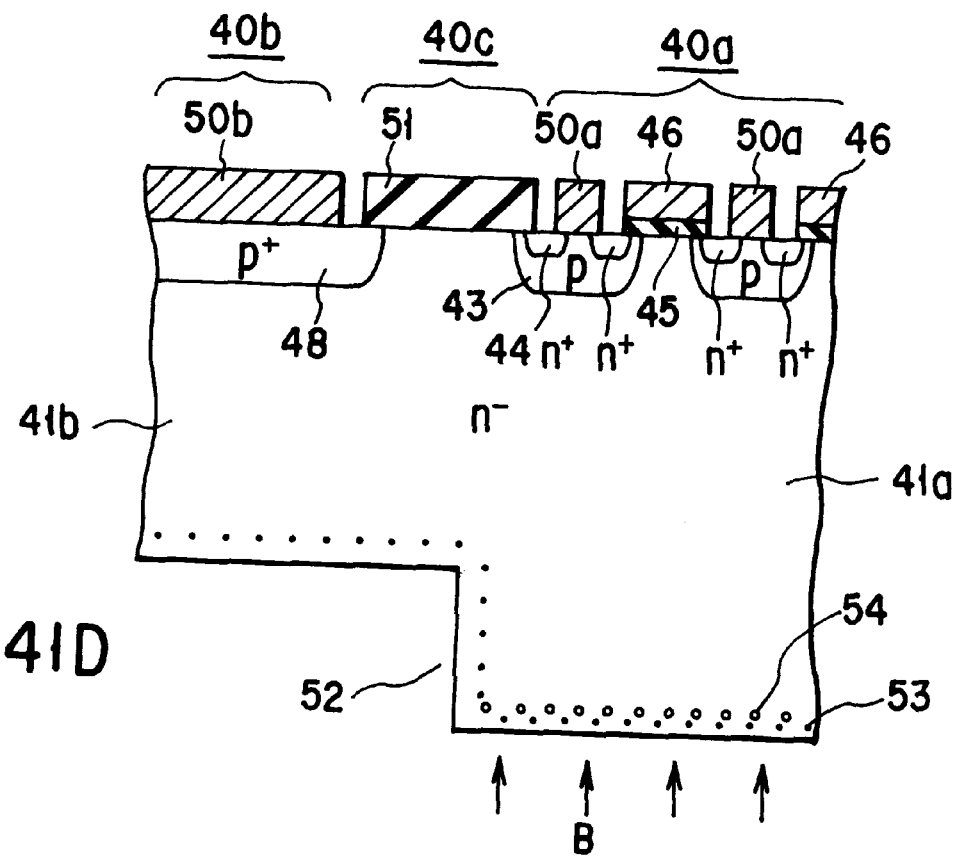

As shown in FIG. 41D, p-type impurity ions 54, e.g., boron (B) ions are implanted in a region (IGBT region) of the back surface of the n-type base substrate 41 where no recess is formed. At this time, the dose of the p-type impurity ions 54 is set higher than that of the n-type impurity ions 53. For example, the n-type impurity of phosphorus is implanted at a dose of $2 \times 10^{15}$ cm$^{-2}$, the p-type impurity of boron at a dose of $5 \times 10^{15}$ cm$^{-2}$.

Figure 41E:
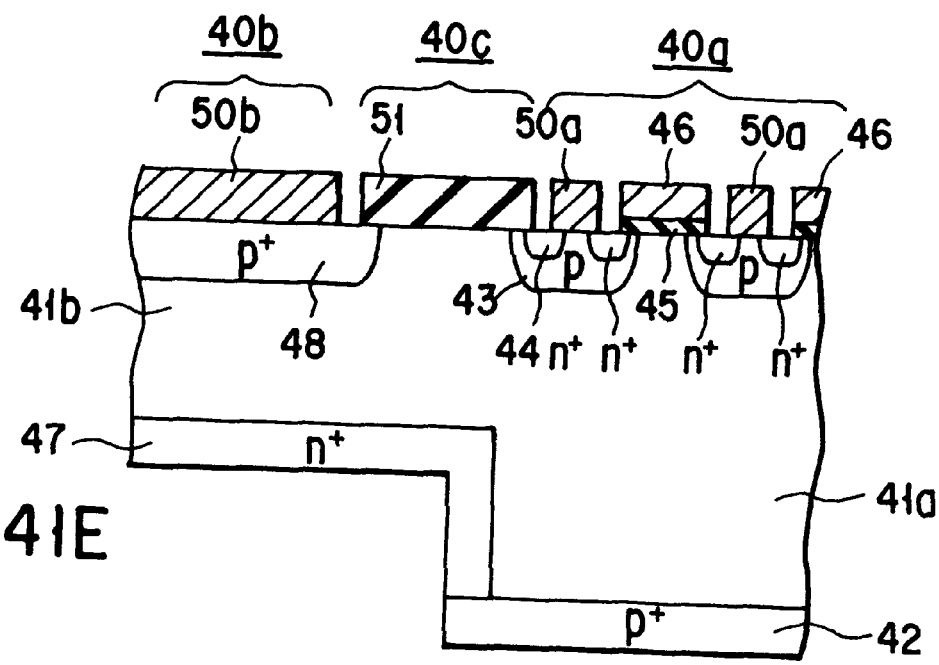

Annealing is then performed to form the p-type layer 42 on the back surface of the IGBT region 40a and the n-type layer 47 on the back surface of the diode region 40b, as shown in FIG. 41E.

Incidentally, a heavy metal such as Au, Pt, Fe, or the like is deposited and diffused as a lifetime killer for shortening the lifetime of carriers, in regions corresponding to the diode region 40b and the isolation region 40c. To a region corresponding to the IGBT region 40a, an electron beam or a particle beam such as a proton beam is irradiated.

Figure 42A:
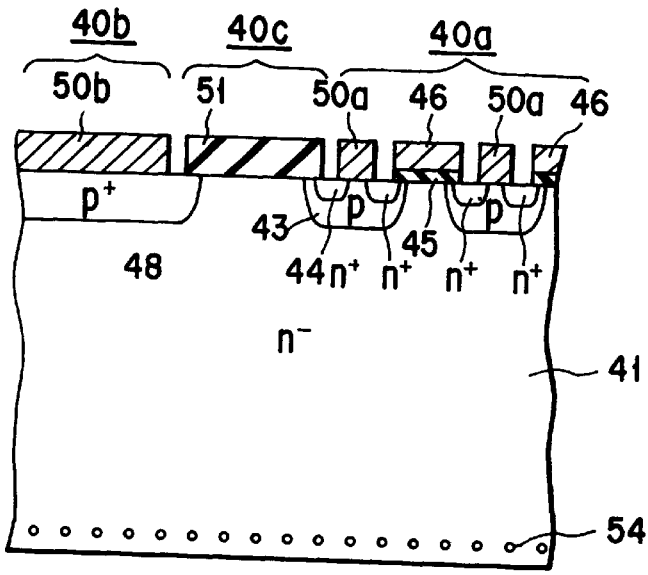
FIGS. 42A to 42C are sectional views sequentially showing another manufacturing method corresponding to FIGS. 41C to 41E.
Figure 42B:
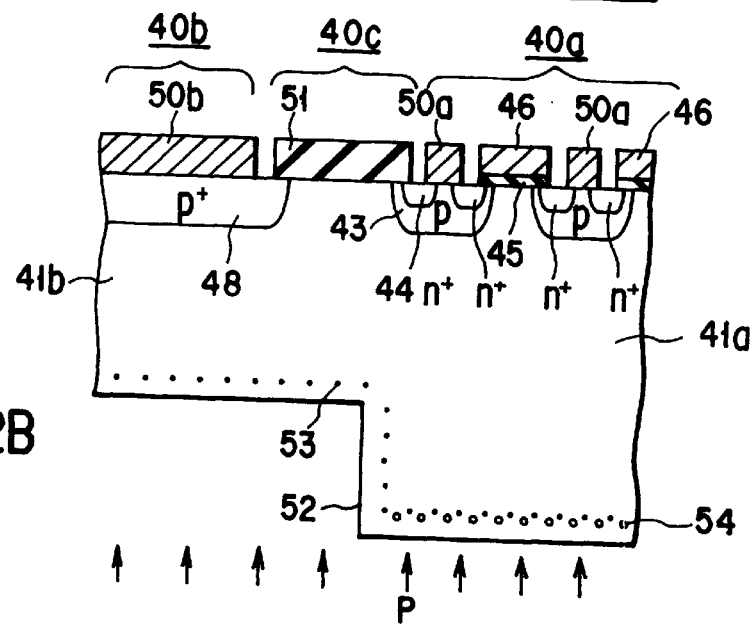
Figure 42C:
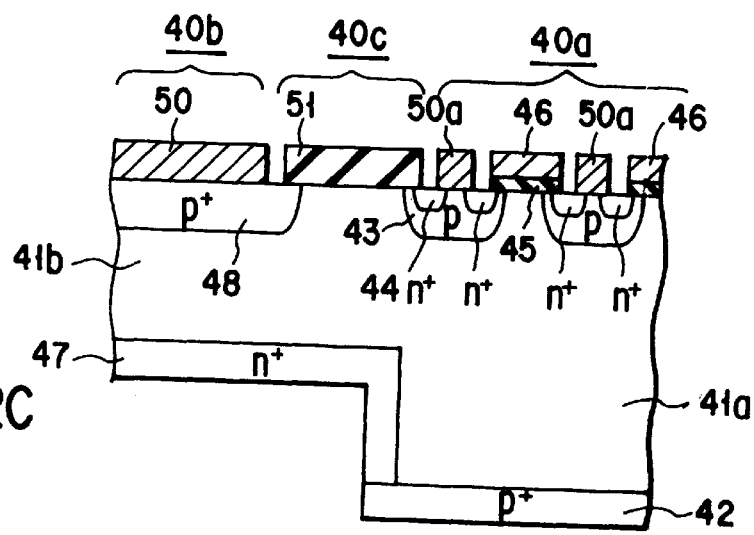

The steps in FIGS. 41C to 41E may be changed into the steps in FIGS. 42A to 42C. More specifically, the p-type ions 54 are implanted in the back surface of the n-type base substrate 41 in advance, and then the recess 52 is formed, as shown in FIG. 42B. The n-type ions 53 are implanted in the entire back surface of the n-type base substrate 41. Annealing is performed to form the p-type layer 42 and the n-type layer 47, as shown in FIG. 42C.

With the above steps, a high power semiconductor device which incorporates the function of an anti-parallel free-wheeling diode and has a switching function in the forward direction and conductive characteristics in the backward direction is completed.

Figure 43A:
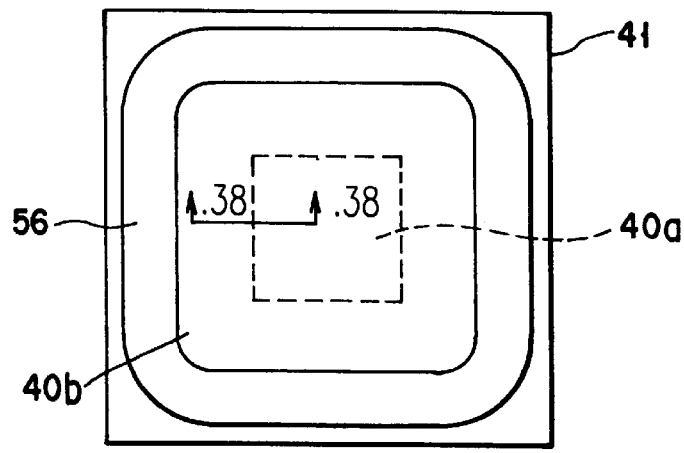
FIGS. 43A to 43C are views showing examples of the planar shape of the semiconductor power device in FIG. 38, in which FIG. 38 corresponds to a section taken along the line A—A in each of FIGS. 43A to 43C.
Figure 43B:
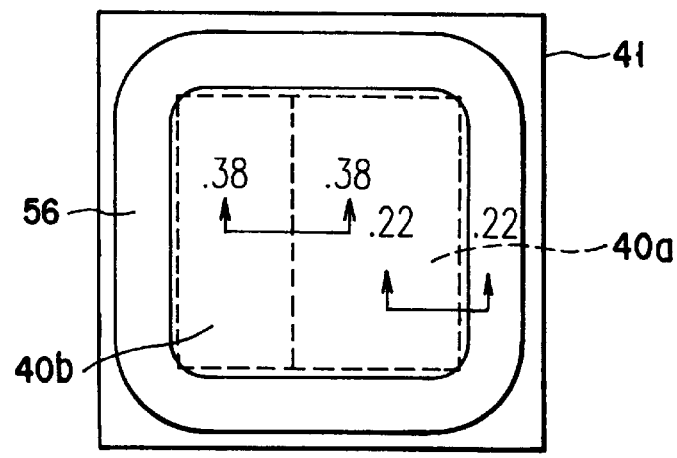
Figure 43C:
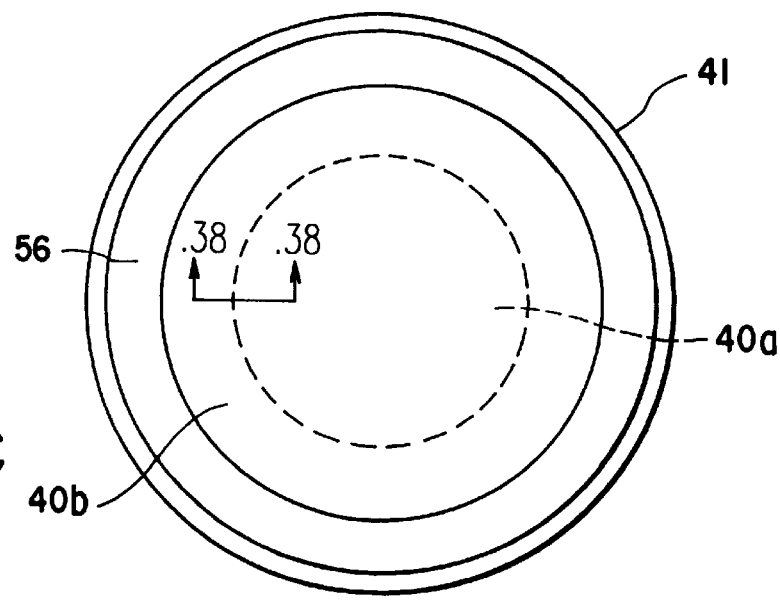

Although only part of the semiconductor device according to the present invention is shown in a sectional view of FIG. 38, the whole semiconductor device can have an arrangement like the one shown in plan views of FIGS. 43A to 43C. In FIGS. 43A to 43C, reference numeral 56 denotes a junction termination region where a resurf, a guard ring, and the like are formed. FIG. 43A shows a rectangular chip, in which the IGBT region 40a is surrounded by the diode region 40b. FIG. 43B also shows a rectangular chip, in which the IGBT region 40a and the diode region 40b are formed parallel to each other. FIG. 43C shows a circular chip having the arrangement in FIG. 43A.

In FIG. 43B, a section taken along the line B—B over the IGBT region 40a and the junction termination region 56 has a junction termination structure at the outermost portion of the IGBT region, as shown in, e.g., FIG. 22 of the first aspect. Also, various structures described in the first aspect can be applied to the connecting structure between the diode region 40b and the junction termination region 56.

The semiconductor device thus formed is turned on in the backward direction upon generation of a counterelectromotive force by an inductive load. Then, the diode is rendered conductive at a low ON voltage. No external anti-parallel freewheeling diode is therefore required, and the current density and the speed increase to realize a small-size, high-performance semiconductor device.

(17th Embodiment)

Figure 44:
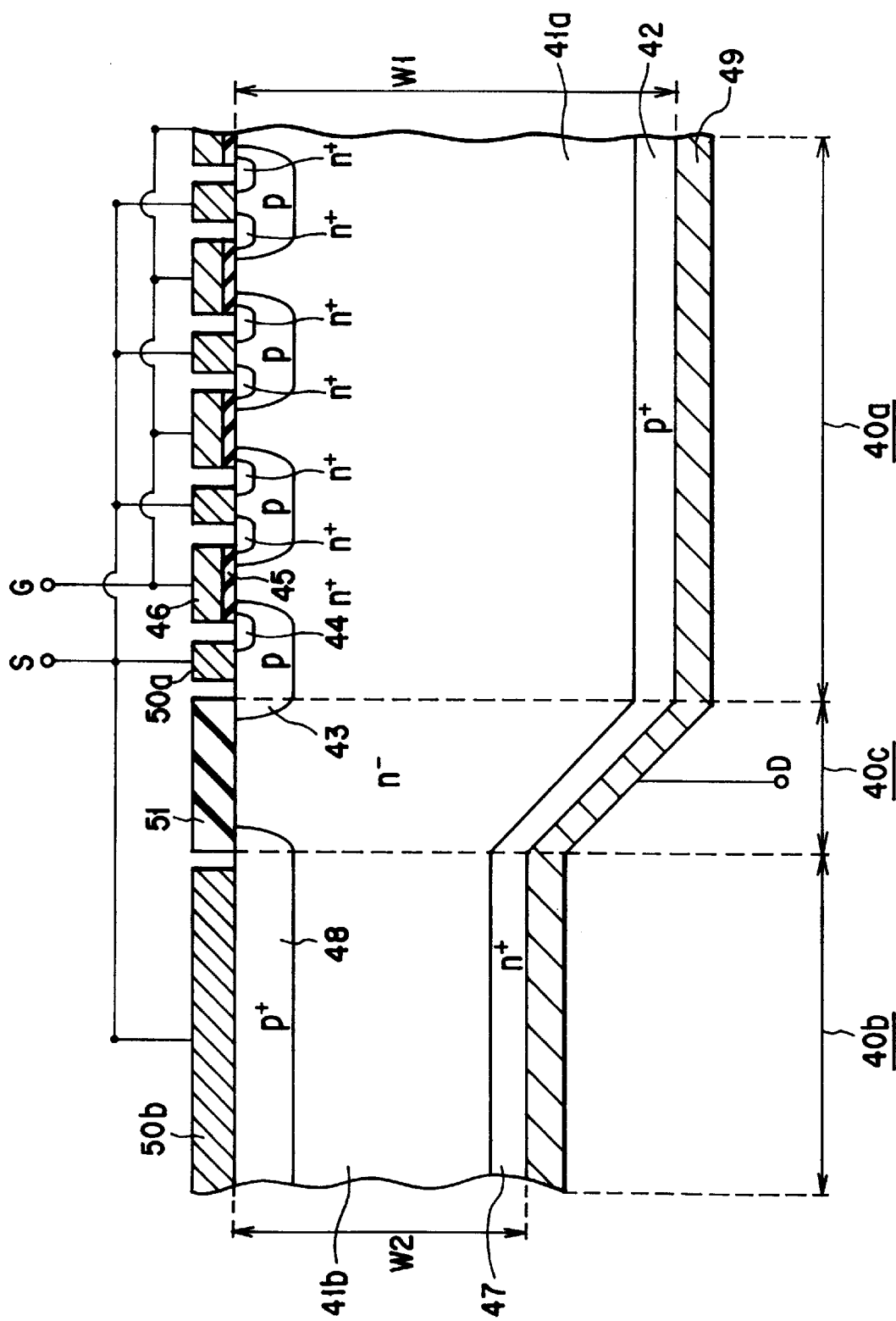
FIG. 44 is a sectional view showing the main part of a semiconductor power device according to the 17th embodiment of the present invention.

FIG. 44 is a sectional view showing the main part of a semiconductor power device according to the 17th embodiment of the present invention.

The 17th embodiment is different from the 16th embodiment in that a recess to be formed in the back surface of a diode region 40b is formed by mechanical engraving or wet etching, and the side wall of the recess is formed obliquely. These methods enable forming the recess deep. The mechanical engraving may be accompanied with a wet etching using fluoric-nitric acid or the like, and the wet etching may be performed using potassium hydroxide or the like.

(18th Embodiment)

Figure 45:
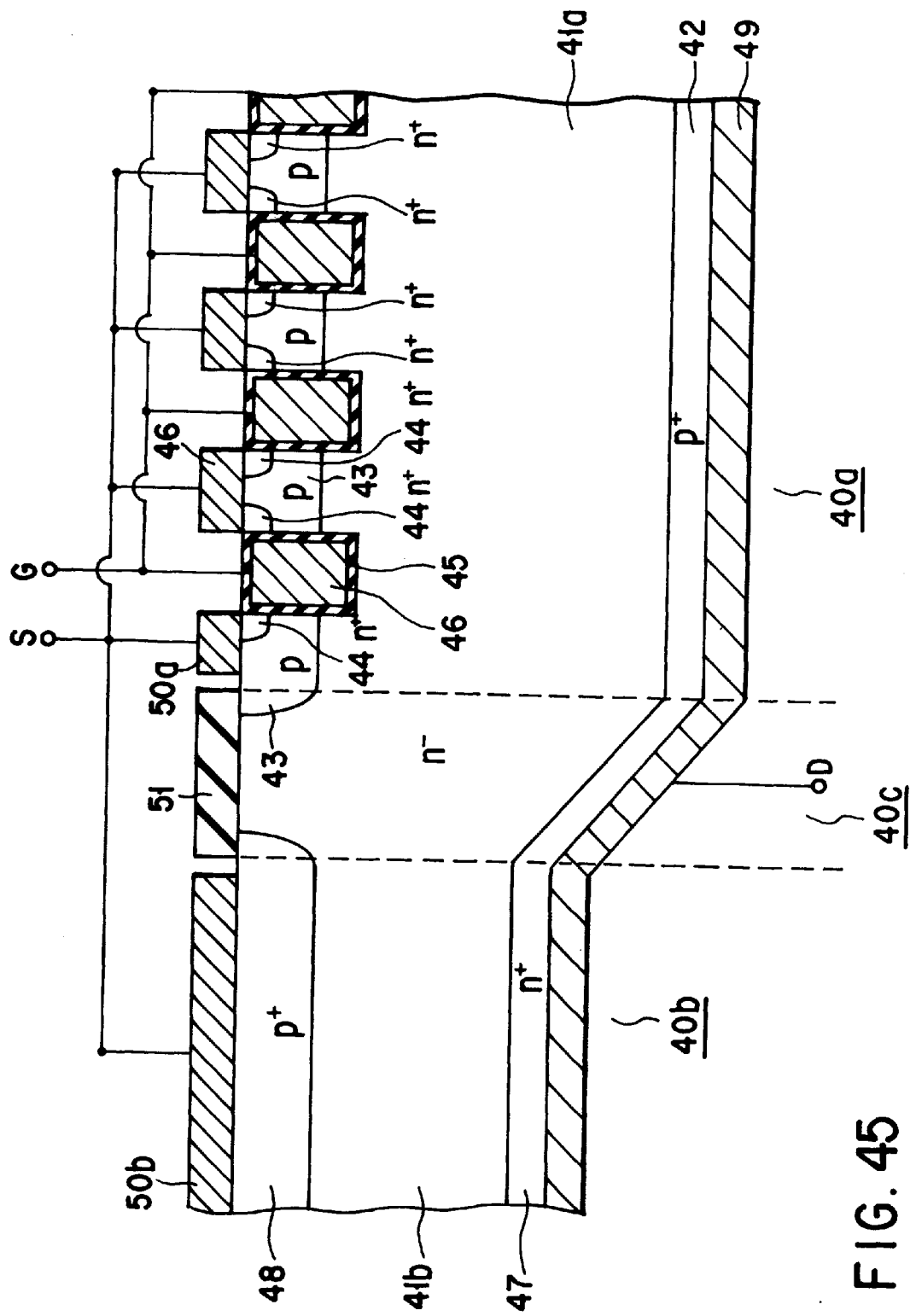
FIG. 45 is a sectional view showing the main part of a semiconductor power device according to the 18th embodiment of the present invention.

FIG. 45 is a sectional view showing the main part of a semiconductor power device according to the 18th embodiment of the present invention.

The 18th embodiment is different from the 17th embodiment in that a gate electrode 50a for an IGBT is formed in a trench. The trench gate is formed by RIE and the like, which is known well, and a description thereof will be omitted.

Even with this arrangement, the same effects as those in the 16th embodiment can be obtained, and the ON voltage of IGBT is further decreased.

(19th Embodiment)

Figure 46:
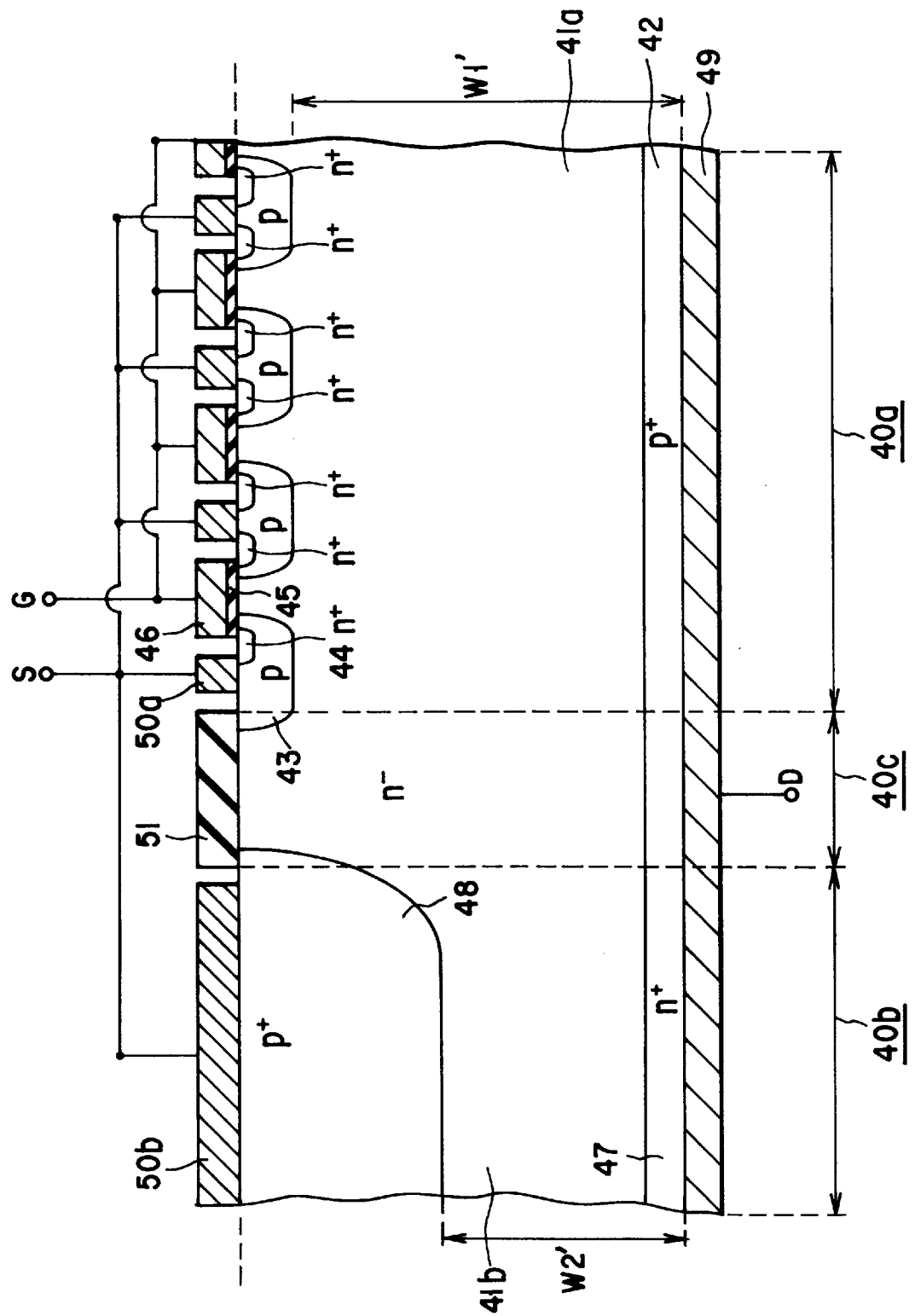
FIG. 46 is a sectional view showing the main part of a semiconductor power device according to the 19th embodiment of the present invention.

FIG. 46 is a sectional view showing the main part of a semiconductor power device according to the 19th embodiment of the present invention.

The 19th embodiment is different from the 16th embodiment in that an IGBT region 40a and a diode region 40b are formed in a substrate having the same thickness. Instead of making a recess, a p-type anode layer 48 in the diode region 40b is formed deep in the substrate.

For this reason, the thickness W2' of an n-type base layer 41b that substantially determines the withstanding voltage of the diode region 40b has the relation of W2'<W1' with the thickness W1' of an n-type base layer 41a that substantially determines the withstanding voltage of the IGBT region 40a.

Even with this arrangement, the same effects as those in the 16th embodiment can be obtained.

(20th Embodiment)

Figure 47:
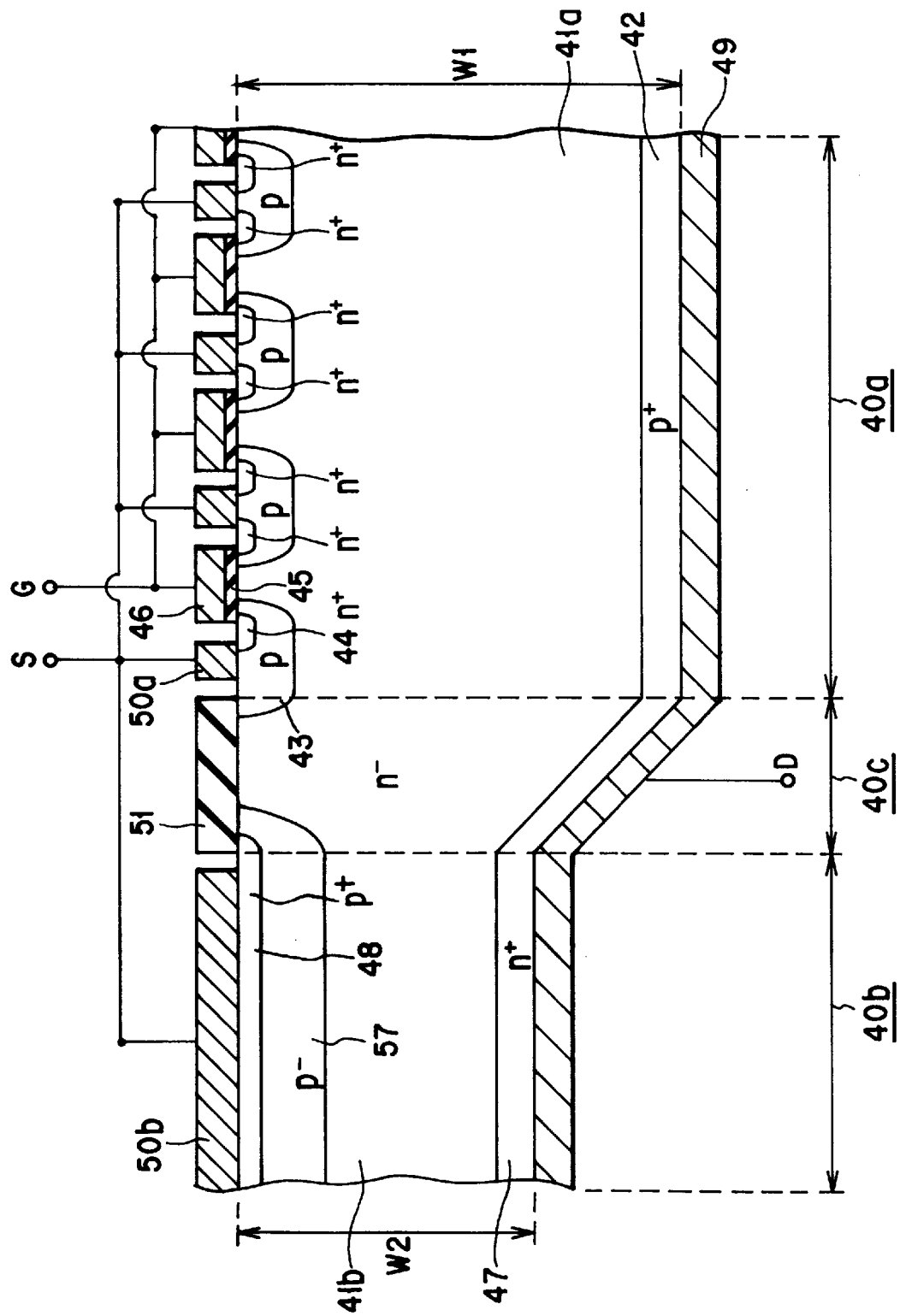
FIG. 47 is a sectional view showing the main part of a semiconductor power device according to the 20th embodiment of the present invention.

FIG. 47 is a sectional view showing the main part of a semiconductor power device according to the 20th embodiment of the present invention.

The 20th embodiment is different from the 16th embodiment in the presence of a p-type layer 57 which surrounds a p-type anode layer 48 in a diode region 40b and is formed deeper than the p-type anode layer 48. The p-type layer 57 functions to substantially reduce the injection of holes from the anode layer 48.

Figure 48:
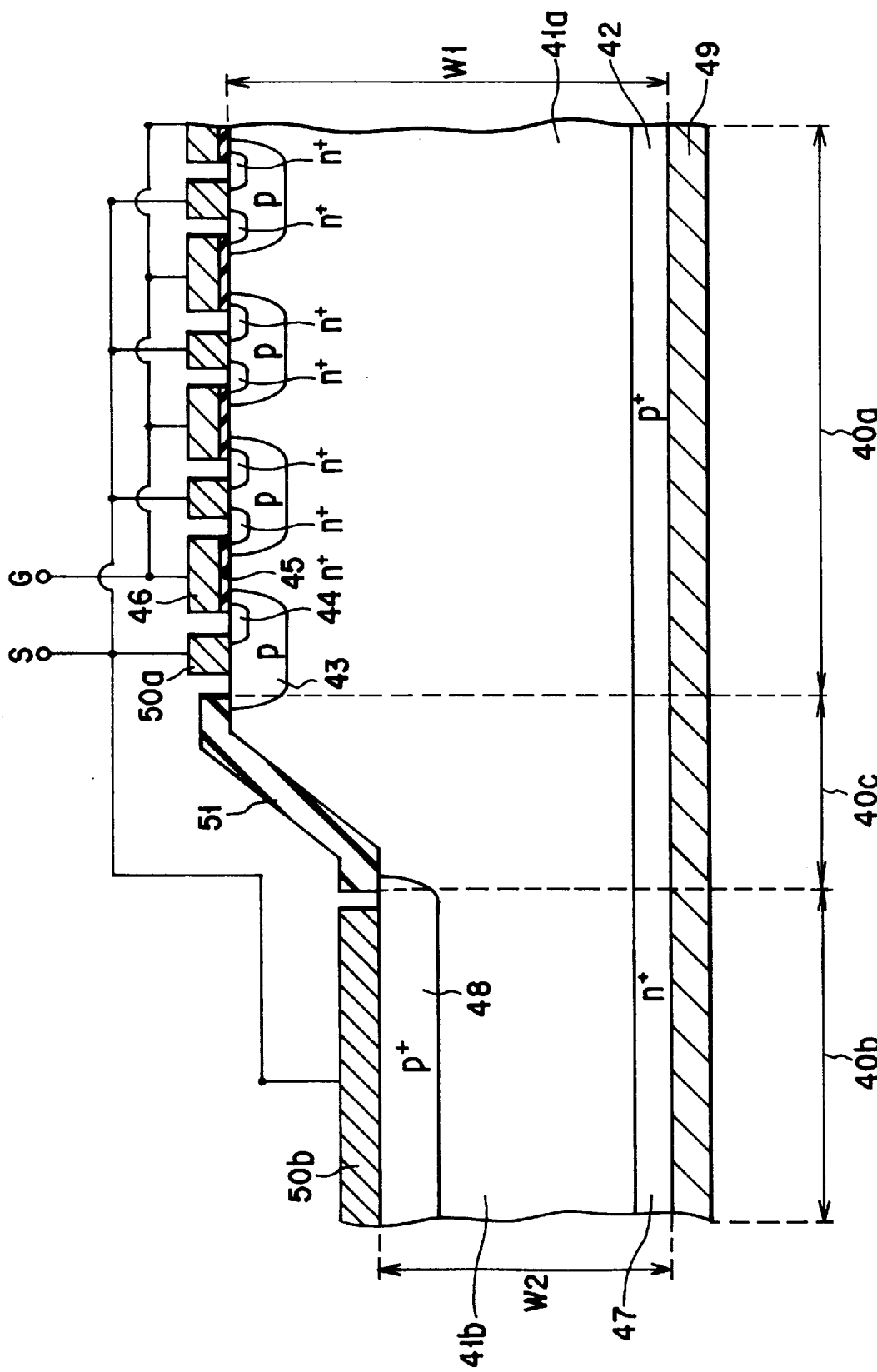
FIG. 48 is a sectional view showing the main part of a semiconductor power device according to the 21st embodiment of the present invention.

(21st Embodiment) FIG. 48 is a sectional view showing the main part of a semiconductor power device according to the 21st embodiment of the present invention.

The 21st embodiment is different from the 16th embodiment in that a diode region 40b is set in a recess formed in the surface of an n-type base substrate 41. The back surface of the n-type base substrate 41 is flat. The thickness W1 of the n-type base substrate in an IGBT region 40a and the thickness W2 of the n-type base substrate in the diode region have the relation of W1>W2.

Even with this arrangement, the same effects as those in the 16th embodiment can be obtained.

As described above, according to the second aspect of the present invention, the semiconductor power device incorporates the function of an anti-parallel freewheeling diode and has a switching function in the forward direction and conductive characteristics in the backward direction. That is, upon generation of a counterelectromotive force by an inductive load, the semiconductor device is turned on in the backward direction. Then, the diode is rendered conductive at a low ON voltage because the diode is made up of the high-resistance base layer thinner than the IGBT. No external anti-parallel freewheeling diode is required, so that the current density and the speed increase to realize a small-size, high-performance semiconductor device.

Embodiments (22nd to 26th embodiments) of a semiconductor power device according to the third aspect of the present invention will be described below. Although the first conductivity type is the n type, and the second conductivity type is the p type in these embodiments, they may be reversed. The same reference numerals denote the same parts, and a repetitive description thereof will be omitted.

(22nd Embodiment)

Figure 49:
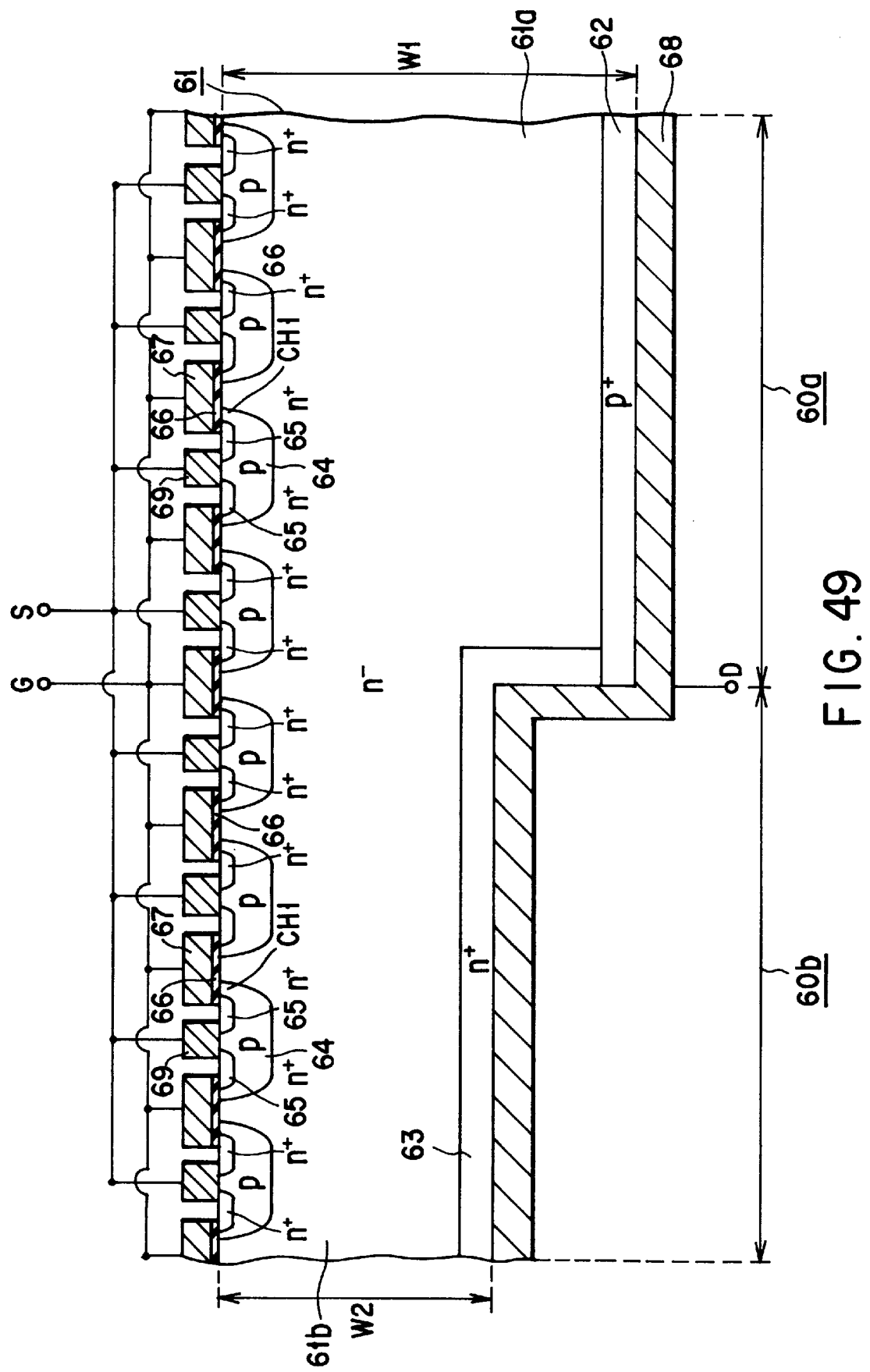
FIG. 49 is a sectional view showing the main part of a semiconductor power device according to the 22nd embodiment of the present invention.

FIG. 49 is a sectional view showing a semiconductor power device according to the 22nd embodiment of the present invention. In FIG. 49, reference numeral 61 denotes a high-resistance n-type base layer (semiconductor substrate). A recess is formed in one surface (back surface) of the n-type base layer 61. A p-type drain layer 62 is formed on the back surface of the n-type base layer 61 in the region where no recess is formed, whereas a p-type base layer 63 is formed in the region where the recess is formed.

A plurality of p-type base layers 64 are selectively formed in the other surface (front surface) of the n-type base layer 61, and an n-type source layer 65 is formed in each p-type base layer 64. A gate electrode 67 is formed via a gate insulating film 66 on the p-type base layer 64 between the n-type base layer 61 and the n-type source layer 65. The gate electrode 67, the gate insulating film 66, the p-type base layer 64, the n-type base layer 61, and the n-type source layer 65 constitute an electron injection MOSFET having a channel region CH1.

A drain electrode (second main electrode) 68 is formed on the p-type drain layer 62 and the n-type drain layer 63 in contact with both the layers 62 and 63. A source electrode (first main electrode) 69 is formed on the n-type source layer 65 and the p-type base layer 64 in contact with both the layers 65 and 64. The gate electrode 67 serves as a sub-electrode. A plurality of source electrodes and a plurality of gate electrodes are connected to each other, and this connection is schematically shown in FIG. 49.

In the above arrangement, an IGBT is formed in a region 60a where the p-type drain layer 62 is formed, whereas a power MOSFET is formed in a region 60b wherein the n-type drain layer 63 is formed.

The semiconductor power device of the present invention is characterized in that the IGBT and the MOSFET are connected parallel to each other, and the thickness W2 of a high-resistance n-type base layer (substrate) 61b constituting the MOSFET is smaller than the thickness W1 of a high-resistance n-type base layer (substrate) 61a constituting the IGBT.

The operation of this semiconductor device will be explained. While positive and negative voltages are respectively applied to the drain electrode 68 and the source electrode 69, if a positive voltage with respect to the source is applied to the gate electrode 67, the surface of the p-type base layer 64 that contacts the gate electrode 67 is inverted, and electrons e are injected from the n-type source layer 65 into the n-type base layer 61 via the inverted layer.

When the drain current is small, and the drain voltage is also low, the electrons e injected into the n-type base layer 61 cannot travel beyond a built-in potential at the p-n junction made by the p-type drain layer 62 and the n-type base layer 61. Consequently, the electrons e flow into not the p-type drain layer 62 but the n-type drain layer 63. In the small-current region, the path connecting the source electrode 69, the n-type source layer 65, the inverted layer (channel) CH1, the n-type base layer 61b, the n-type drain layer 63, and the drain electrode 68 constitutes the flow path of majority carriers, so no voltage drop is caused by the p-n junction, and the current flows at 0V.

As the current increases to raise the drain voltage, the p-n junction is forward-biased to allow the electrons e to travel beyond the built-in potential and flow into the p-type drain layer 62. Along with this, holes h are injected from the p-type drain layer 62 into the n-type base layer 61. As a result, both the electrons e and the holes h are injected into the n-type base layer 61 to cause conductivity modulation. This renders the semiconductor device conductive at a low ON voltage.

Figure 50:
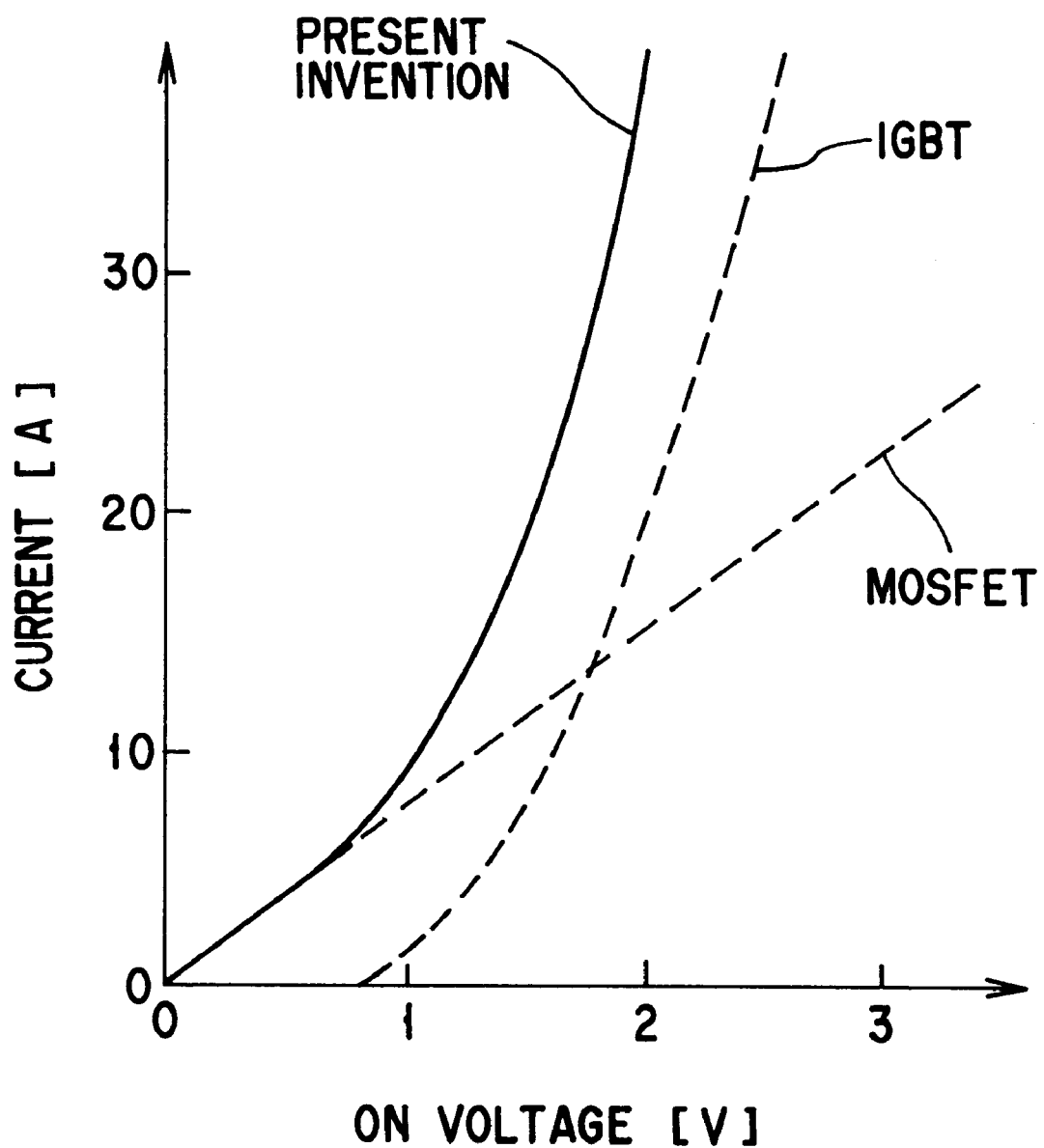
FIG. 50 is a graph for explaining the current-voltage characteristics of the semiconductor power device in FIG. 49.

Particularly in the semiconductor device of the present invention, the ON resistance in the small-current region can be greatly decreased because the thickness W2 of the high-resistance base layer (substrate) 61b constituting the MOSFET is smaller than the thickness W1 of the high-resistance base layer (substrate) 61a constituting the IGBT. With the above mechanism, in the semiconductor device of the present invention, the ON resistance can be reduced over the small-current region to the large-current region. FIG. 50 is a graph for explaining the ON characteristics of the semiconductor device of the present invention.

Since the MOSFET has a punch-through structure, the semiconductor device of the present invention also has the features described with reference to FIGS. 39A and 39B.

In a turn-off operation, a negative voltage with respect to the source is applied to the insulated gate 67. Then, the inverted layer formed immediately below the gate electrode 67 disappears to stop the injection of electrons. Some of the holes h in the n-type base layer 61 are discharged to the source electrode 69 via the p-type base layer 64, and the remaining holes h recombine with the electrons e and disappear. Accordingly, the semiconductor device is turned off.

A method of manufacturing the semiconductor power device of the present invention will be explained with reference to FIGS. 51A to 51E.

Figure 51A:
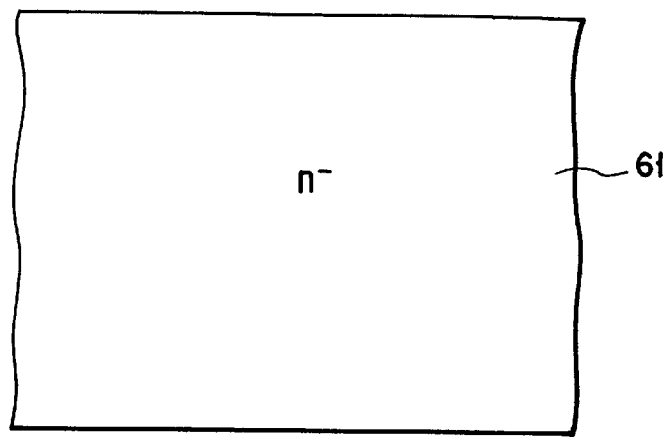
FIGS. 51A to 51E are sectional views sequentially showing a method of manufacturing the basic structure of the semiconductor power device in FIG. 49.
Figure 51B:
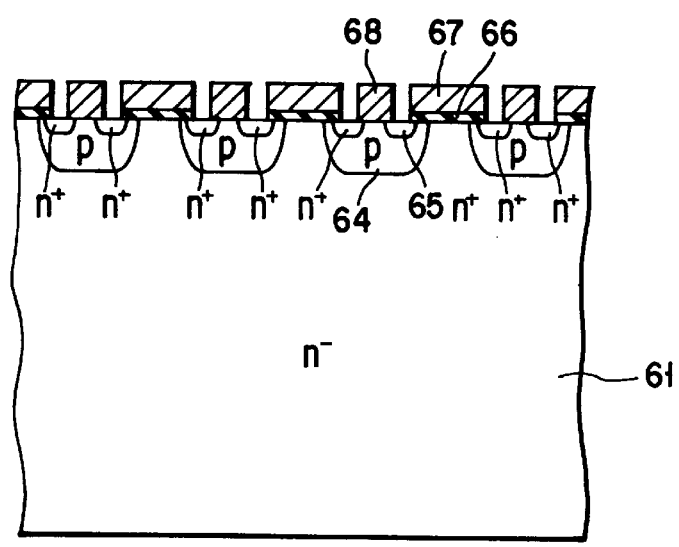

As shown in FIG. 51A, the semiconductor substrate 61 serving as an n-type base layer is prepared. As shown in FIG. 51B, a plurality of p-wells 63 serving as the p-type base layers of the MOSFET and the IGBT are formed in the front surface of the n-type base substrate. The n-type source layer 65 is formed in each p-well 63. The gate electrode 67 is formed via the gate insulating film 66 on the surface of the n-type base substrate exposed between adjacent p-wells so as to stand on the p-well 63 and the n-type source layer 65. At the same time, the source electrode 68 is formed.

Figure 51C:
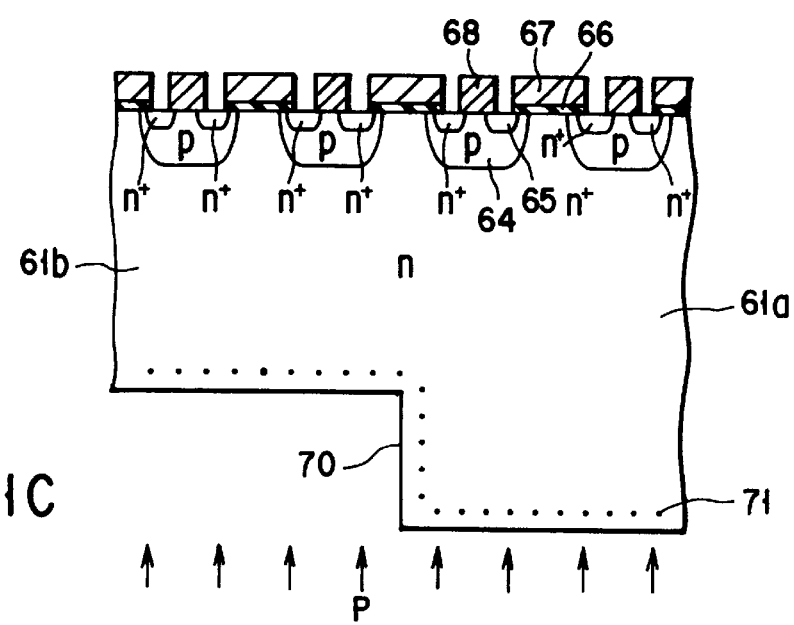

As shown in FIG. 51C, a portion of the back surface of the n-type base substrate 61 that corresponds to the MOSFET region 60b is dry-etched using RIE to form a recess 70. Subsequently, in the a region corresponding to the IGBT formation region 60a, an electron beam or a particle beam such as a proton beam is irradiated. An n-type impurity 71, e.g., phosphorus (P) is ion-implanted in the entire back surface of the n-type base substrate 61 including this recess. For example, the n-type impurity of phosphorus is implanted at a dose of $2 \times 10^{15}$ cm$^{-2}$, the p-type impurity of boron at a dose of $5 \times 10^{15}$ cm$^{-2}$.

Figure 51D:
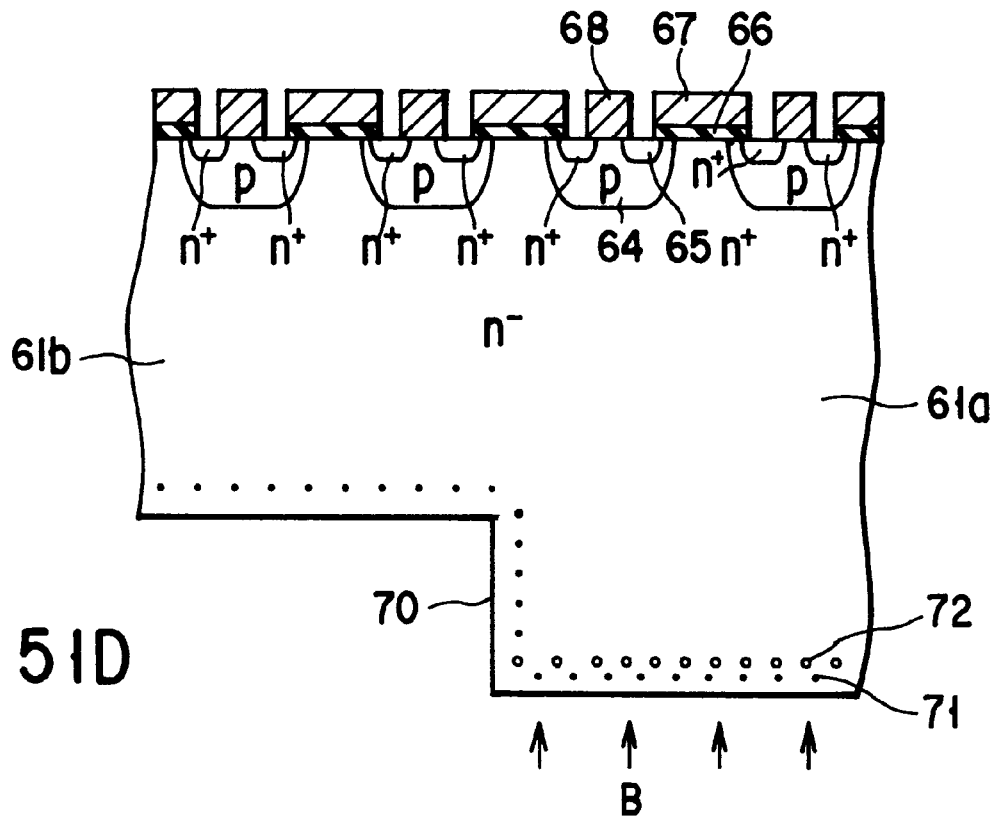

As shown in FIG. 51D, p-type impurity ions 72, e.g., boron (B) ions are implanted in the region (IGBT region) 61a of the back surface of the n-type base substrate 61 where no recess is formed. At this time, the dose of the p-type impurity ions 72 is set higher than that of the n-type impurity ions 71.

Figure 51E:
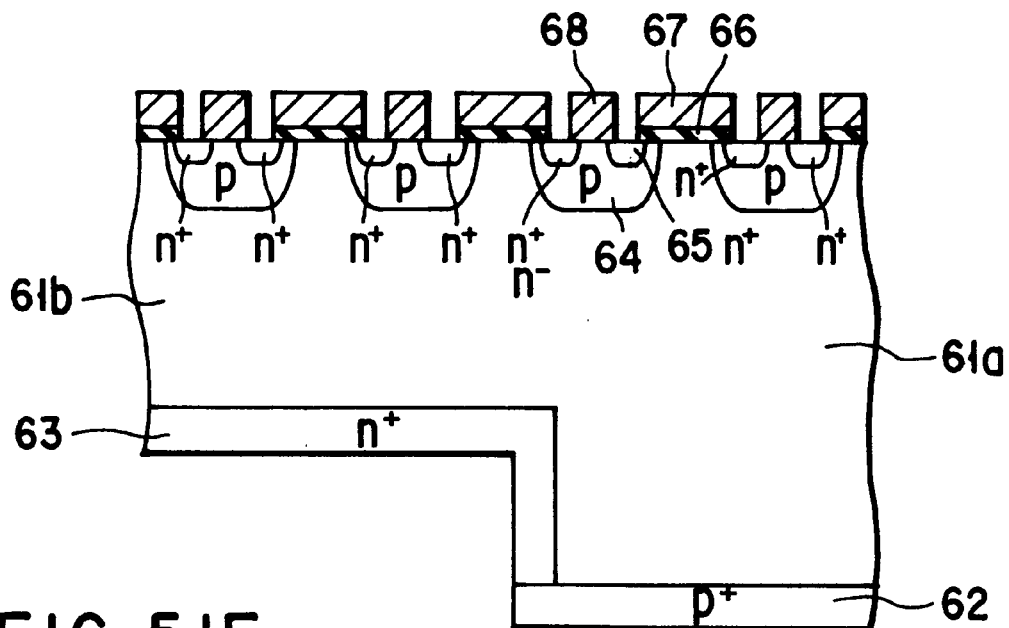

Annealing is then performed to form the p-type drain layer 62 on the back surface of the IGBT region 60a and the n-type drain layer 67 on the back surface of the MOSFET region 60b, as shown in FIG. 51E.

Figure 52A:
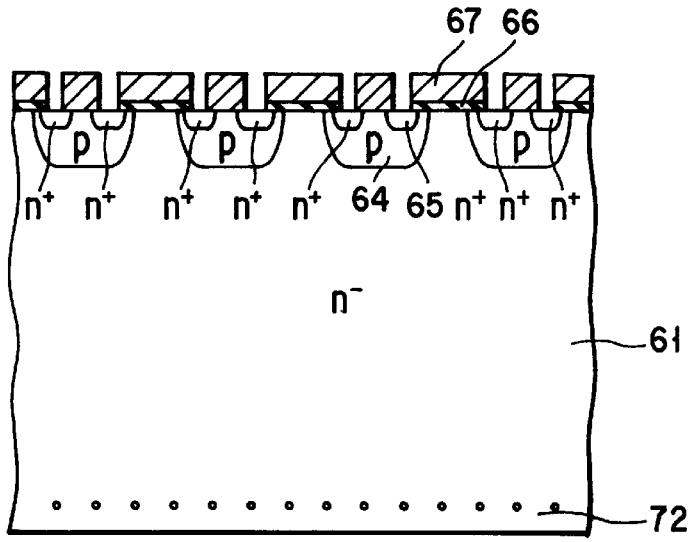
FIGS. 52A to 52C are sectional views sequentially showing another manufacturing method corresponding to FIGS. 51C to 51E.
Figure 52B:
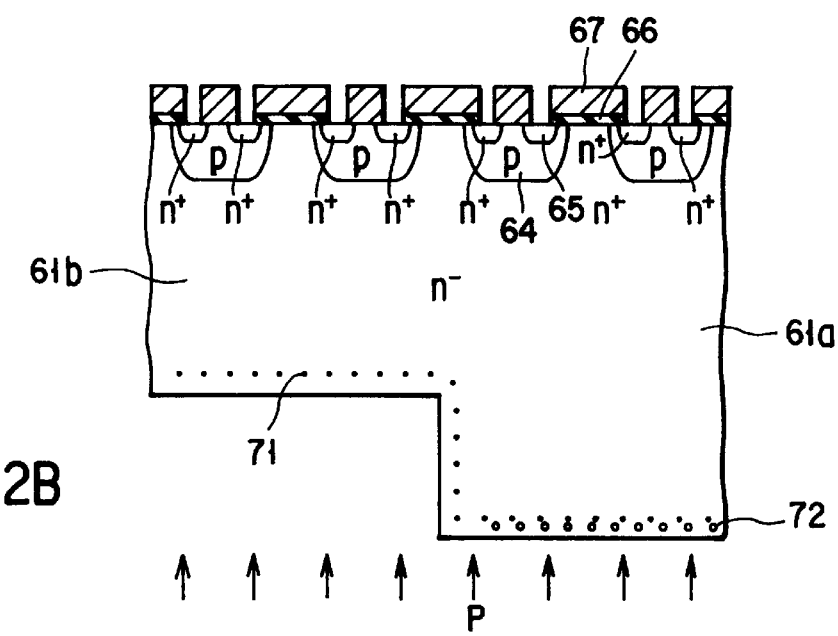
Figure 52C:
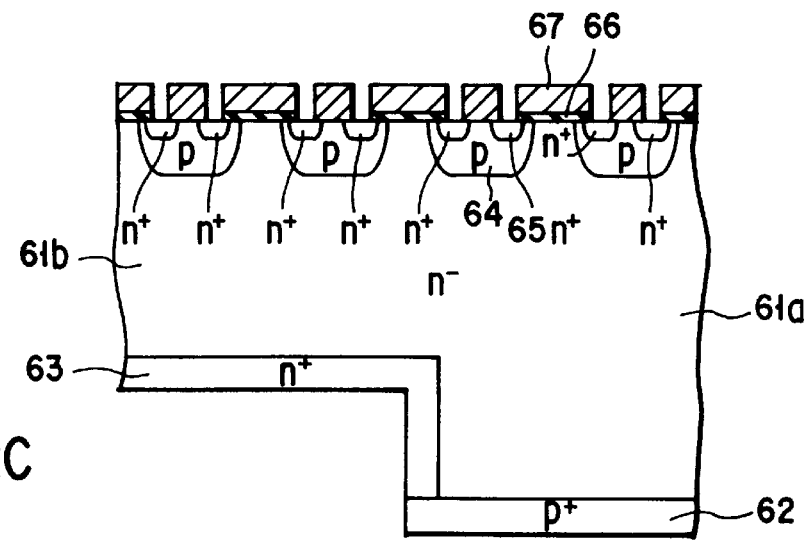

The steps in FIGS. 51C to 51E may be changed into the steps in FIGS. 52A to 52C. More specifically, the p-type ions 72 are implanted in the back surface of the n-type base substrate 61 in advance, and then the recess 70 is formed, as shown in FIG. 52B. The n-type ions 71 are implanted in the entire back surface of the n-type base substrate 61. Annealing is performed to form the p-type drain layer 62 and the n-type drain layer 63, as shown in FIG. 52C.

With the above steps, a semiconductor power device in which the MOSFET and the IGBT are connected parallel to each other is completed.

Although only part of the semiconductor device according to the present invention is shown in a sectional view of FIG. 49, the whole semiconductor device can have an arrangement like the one shown in plan views of FIGS. 43A to 43C, similarly to the 16th embodiment. The arrangement in FIGS. 43A to 43C can be directly applied to the 22nd embodiment if the diode region 40b is changed into the MOSFET region.

As described above, according to the present invention, in the small-current region, since the path connecting the source electrode 69, the n-type source layer 65, the inverted layer (channel) CH1, the n-type base layer 61b, the n-type drain layer 63, and the drain electrode 68 mainly constitutes the flow path of majority carriers, no voltage drop is caused by the p-n junction, and the current flows at 0V. On the other hand, in the large-current region, since minority carriers are injected from the p-type drain layer 62 to the n-type base layer 61a, conduction modulation occurs. Therefore, the ON resistance can be reduced over the small-current region to the large-current region.

(23rd Embodiment)

Figure 53:
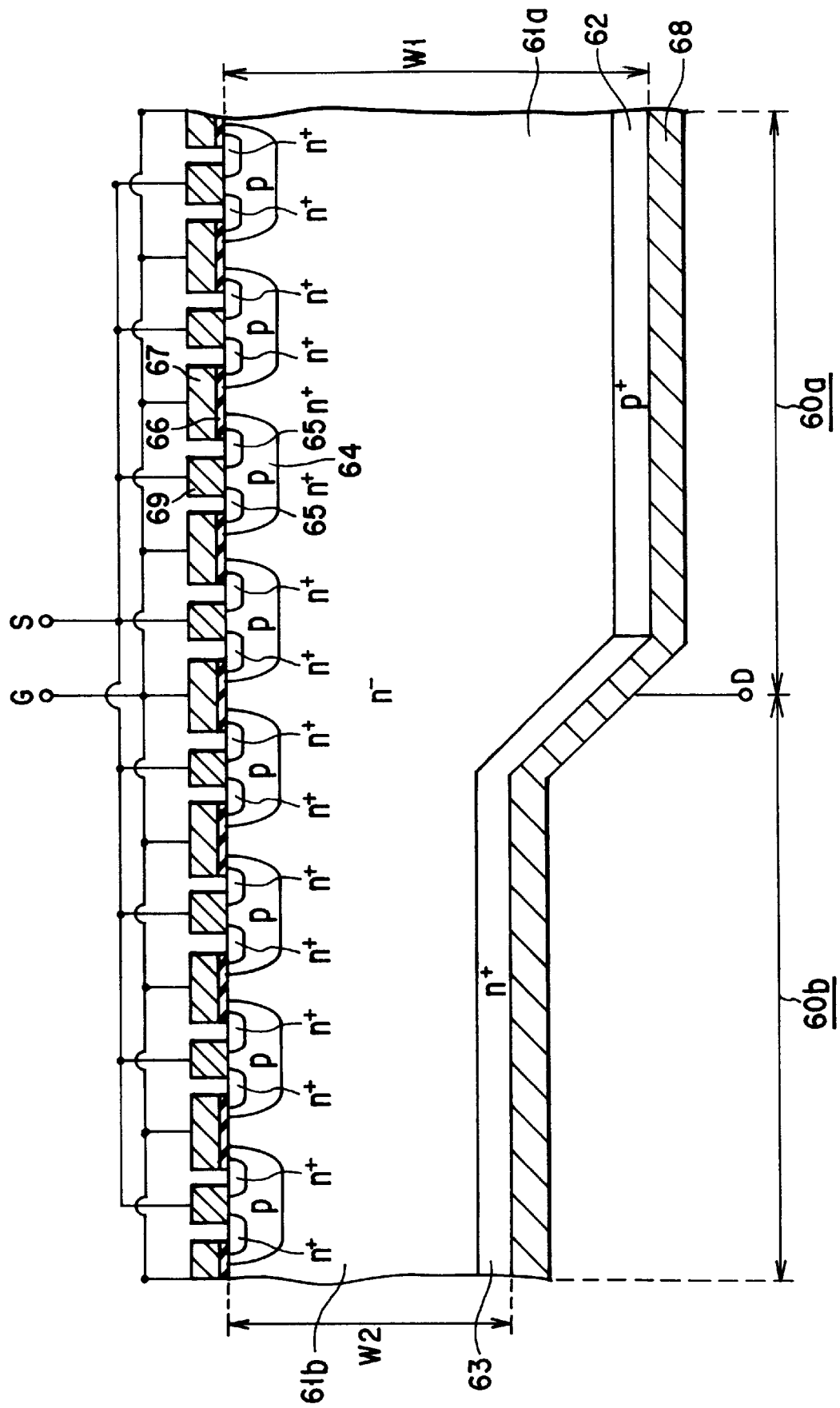
FIG. 53 is a sectional view showing the main part of a semiconductor power device according to the 23rd embodiment of the present invention.

FIG. 53 is a sectional view showing the main part of a semiconductor power device according to the 23rd embodiment of the present invention.

The 23rd embodiment is different from the 22nd embodiment in that a recess to be formed in the back surface of an MOSFET region 60b is formed by mechanical engraving or wet etching, and the side wall of the recess is formed obliquely. These methods enable forming the recess deep. The mechanical engraving may be accompanied with a wet etching using fluoric-nitric acid or the like, and the wet etching may be performed using potassium hydroxide or the like.

(24th Embodiment)

Figure 54:
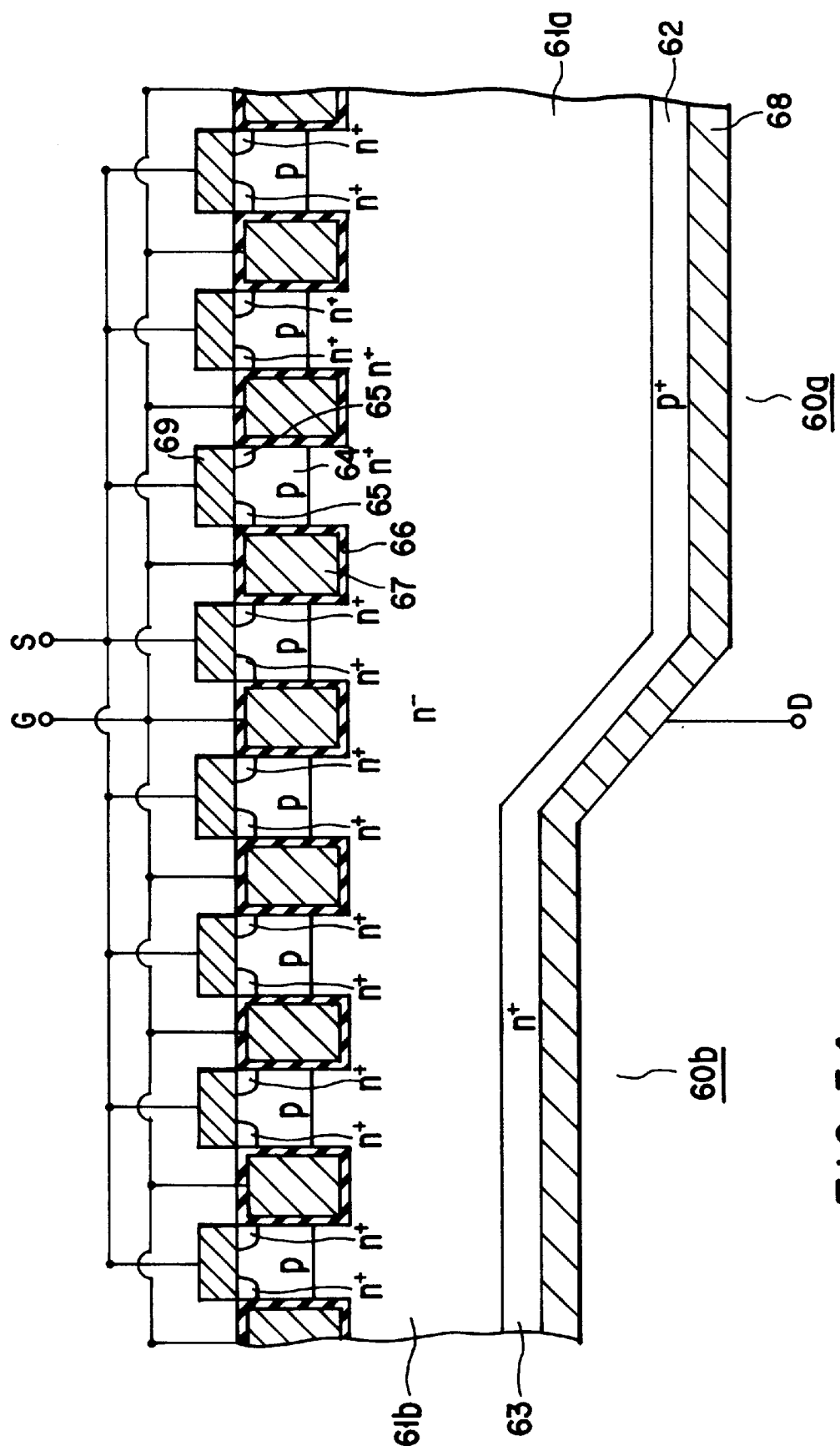
FIG. 54 is a sectional view showing the main part of a semiconductor power device according to the 24th embodiment of the present invention.

FIG. 54 is a sectional view showing the main part of a semiconductor power device according to the 24th embodiment of the present invention.

The 24th embodiment is different from the 23rd embodiment in that a gate electrode 67 for an IGBT or an MOSFET is formed in a trench. The trench gate is formed by RIE and the like, which is known well, and a description thereof will be omitted.

Even with this arrangement, the same effects as those in the 23rd embodiment can be obtained and the ON voltages of IGBT and MOSFET are further decreased.

(25th Embodiment)

Figure 55:
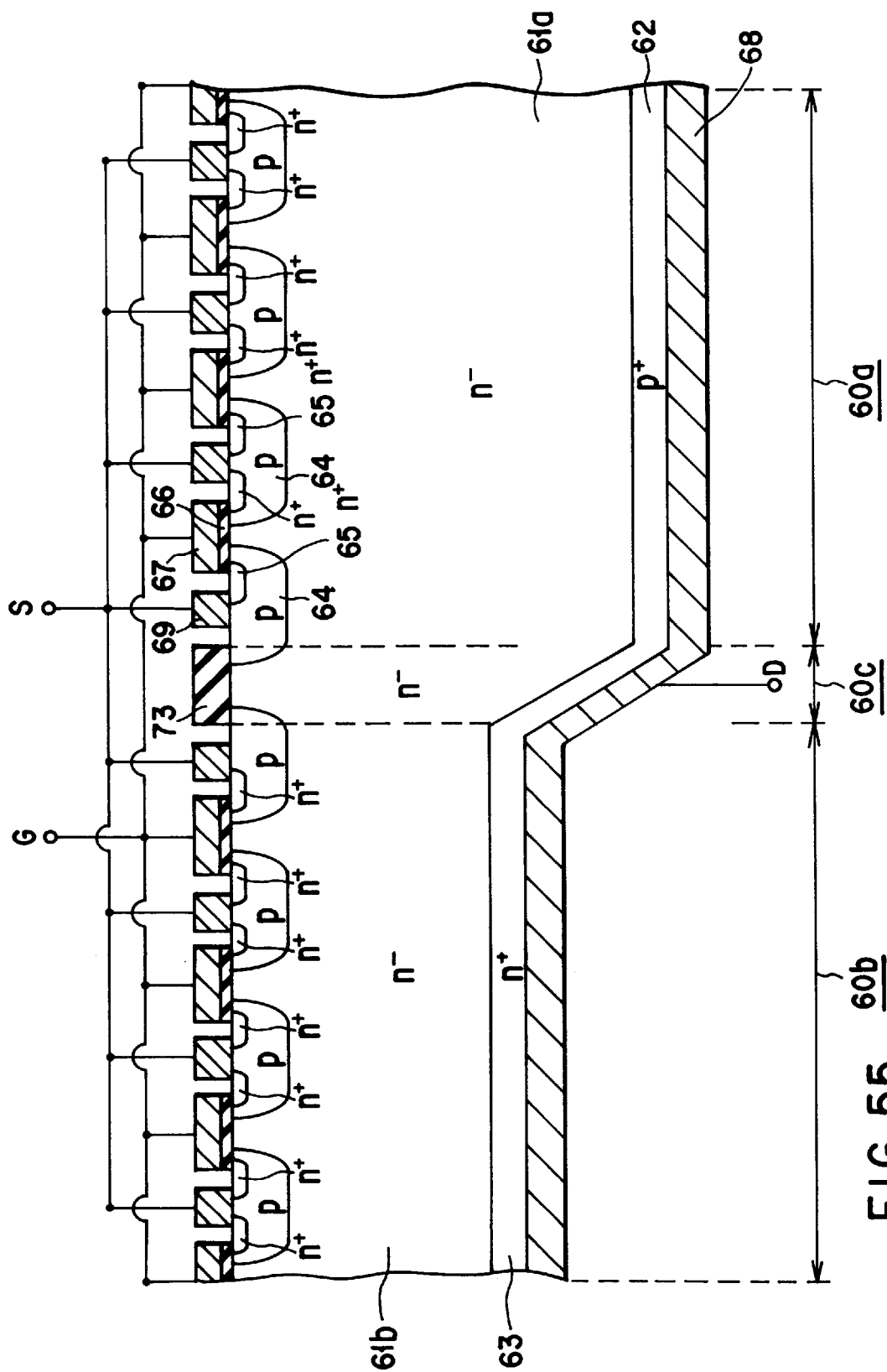
FIG. 55 is a sectional view showing the main part of a semiconductor power device according to the 25th embodiment of the present invention.

FIG. 55 is a sectional view showing the main part of a semiconductor power device according to the 25th embodiment of the present invention.

The 25th embodiment is different from the 23rd embodiment in the presence of an isolation region 60c between an IGBT region 60a and an MOSFET region 60b. The isolation region 60c suppresses an unbalanced operation of the MOSFET region caused by holes diffused in the MOSFET region upon turning off the device of the present invention. When the width of the isolation region 60c is smaller than the carrier diffusion length, a lifetime killer is desirably incorporated into the isolation region 60c as in the IGBT. Reference numeral 73 denotes an insulating film.

(26th Embodiment)

Figure 56:
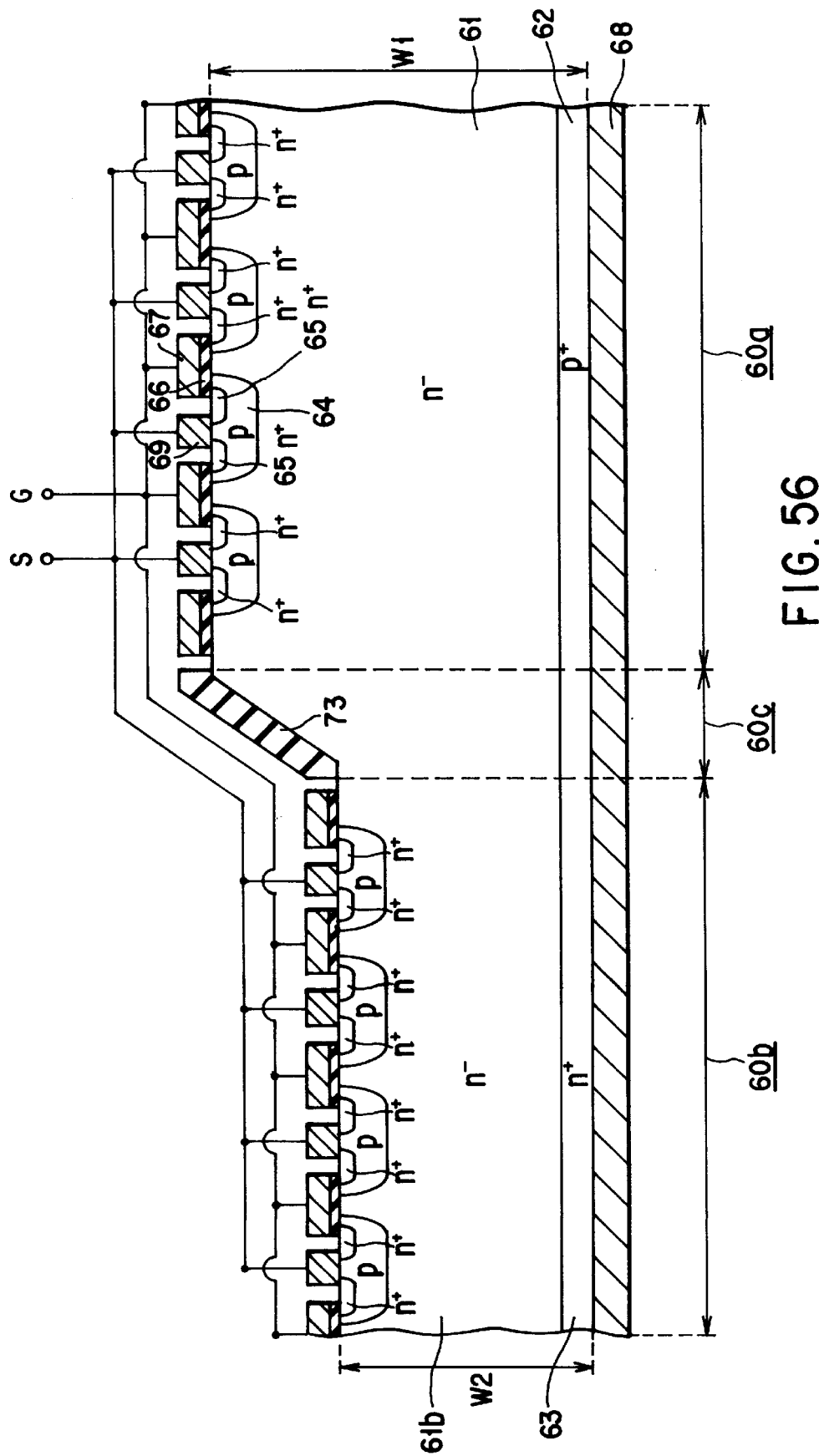
FIG. 56 is a sectional view showing the main part of a semiconductor power device according to the 26th embodiment of the present invention.

FIG. 56 is a sectional view showing the main part of a semiconductor power device according to the 26th embodiment of the present invention.

The 26th embodiment is different from the 23rd embodiment in that an MOSFET region 60b is set in a recess formed in the surface of an n-type base substrate 61. The back surface of the n-type base substrate 61 is flat. The thickness W1 of the n-type base substrate in an IGBT region 60a and the thickness W2 of the n-type base substrate in the MOSFET region have the relation of W1>W2.

Even with this arrangement, the same effects as those in the 23rd embodiment can be obtained.

As described above, according to the third aspect of the present invention, carriers mainly flow through the MOSFET region having the thin high-resistance base layer in the small-current region, while they mainly flow through the IGBT region in the large-current region. Accordingly, in the small-current region, the current starts from 0V because no voltage drop is caused by the p-n junction. In the large-current region, conductivity modulation occurs because minority carriers are injected from the p-type drain layer. The ON resistance can therefore be reduced over the small-current region to the large-current region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor power device comprising:

a high-resistance semiconductor substrate of a first conductivity type having a first and a second major surface and a recess having at least one step in either one of the first and the second major surface; and a semiconductor power element with a field relaxation structure, at least part of which is formed in a region of said semiconductor substrate where the recess is formed, wherein said semiconductor power element is a diode, and a second-conductivity-type anode layer of said diode has a plurality of steps at an interface between said anode layer and said semiconductor substrate of the first conductivity type.

2. A device according to claim 1, wherein said semiconductor power element comprises a main element with an active region and the field relaxation structure of a second conductivity type, and a thickness of at least one high-resistance portion of said semiconductor substrate at which said main element of said semiconductor element is formed is smaller than a thickness of a high-resistance portion of said semiconductor substrate below the field relaxation structure.

3. A device according to claim 1, wherein the field relaxation structure is formed in a region extending from a part of a bottom surface and a side wall surface of the recess formed in the first major surface to the first major surface surrounding the recess, and has a plurality of steps at an interface between the field relaxation structure and said semiconductor substrate of the first conductivity type.

4. A device according to claim 1, wherein the field relaxation structure comprises either one of a resurf layer and a guard ring.

5. A device according to claim 1, wherein the field of relaxation structure includes a resurf layer formed on the first major surface of said semiconductor substrate, surrounding the recess to contact the second-conductivity-type anode layer of said diode.

* * * * *